United States Patent
Hwang et al.

(10) Patent No.: US 7,995,552 B2
(45) Date of Patent: Aug. 9, 2011

(54) APPARATUS AND METHOD FOR TRANSMITTING TFCI BITS FOR A HARD SPLIT MODE IN A CDMA MOBILE COMMUNICATION SYSTEM

(75) Inventors: Sung-Oh Hwang, Yongin-shi (KR); Young-Soo Park, Yongin-shi (KR); Kook-Heui Lee, Songnam-shi (KR); Jae-Yoel Kim, Kunpo-shi (KR); Yong-Jen Kwak, Yongin-shi (KR); Sung-Ho Choi, Songnam-shi (KR); Ju-Ho Lee, Suwon-shi (KR); Kyeong-Chul Yang, Seoul (KR); Hyeon-Woo Lee, Suwon-shi (KR)

(73) Assignee: Samsung Electronics Co., Ltd (KR)

( * ) Notice: Subject to any disclaimer, the term of this patent is extended or adjusted under 35 U.S.C. 154(b) by 808 days.

(21) Appl. No.: 12/025,555

(22) Filed: Feb. 4, 2008

(65) Prior Publication Data
US 2008/0146177 A1 Jun. 19, 2008

(51) Int. Cl.
*H03M 13/00* (2006.01)

(52) U.S. Cl. ............ 370/342; 380/277; 380/44; 380/46; 714/779; 714/790

(58) Field of Classification Search .................. 370/310, 370/342; 714/779, 790; 380/277, 44, 46
See application file for complete search history.

(56) References Cited

U.S. PATENT DOCUMENTS

| 5,414,796 | A | 5/1995 | Jacobs et al. | |
|---|---|---|---|---|
| 5,983,174 | A * | 11/1999 | Wong et al. | 704/228 |
| 6,081,778 | A | 6/2000 | Wong et al. | |
| 6,622,281 | B1 | 9/2003 | Yun et al. | |

(Continued)

FOREIGN PATENT DOCUMENTS

EP 1 009 174 6/2000

(Continued)

OTHER PUBLICATIONS

3rd Generation Partnership Project (3GPP); Technical Specification Group Radio Access Network; Enhancement on the DSCH Hard Split Mode, (Release 5), 3G TR 25.870 V1.0.0, Sep. 2001.

(Continued)

*Primary Examiner* — Hassan Kizou
*Assistant Examiner* — Charles C Jiang
(74) *Attorney, Agent, or Firm* — The Farrell Law Firm, P.C.

(57) ABSTRACT

An encoding method and apparatus for a DCH (Dedicated Channel) encoder and a DSCH (Downlink Shared Channel) encoder in a transmitter for a mobile communication system including the DCH encoder for encoding k bits among 10 input TFCI (Transport Format Combination Indicator) bits and the DSCH encoder for encoding remaining (10−k) bits among the input TFCI bits. The method comprises generating, by the DCH encoder, a first coded bit stream by encoding the k input bits into 32 bits, and outputting a (3k+1)-bit stream by puncturing the first coded bit stream according to a specific mask pattern corresponding to the k value; and generating, by the DSCH encoder, a second coded bit stream by encoding the (10−k) input bits into 32 bits, and outputting a {3*(10−k)+1}-bit stream by puncturing the second coded bit stream according to a specific mask pattern corresponding to the (10−k) value.

72 Claims, 12 Drawing Sheets

U.S. PATENT DOCUMENTS

| | | | |
|---|---|---|---|
| 6,658,005 B2 * | 12/2003 | Seidel et al. | 370/394 |
| 7,426,680 B2 | 9/2008 | Hwang et al. | |
| 7,436,806 B2 | 10/2008 | Hwang et al. | |
| 7,532,723 B2 * | 5/2009 | Chitrapu et al. | 380/44 |
| 2002/0075811 A1 | 6/2002 | Lee et al. | |
| 2002/0075838 A1 | 6/2002 | Choi et al. | |
| 2002/0162073 A1 | 10/2002 | Choi et al. | |
| 2003/0072290 A1 | 4/2003 | Hwang et al. | |

FOREIGN PATENT DOCUMENTS

| | | |
|---|---|---|
| EP | 1 102 440 | 5/2001 |
| EP | 1 104 130 | 5/2001 |
| EP | 1 191 750 | 3/2002 |
| EP | 1 195 934 | 4/2002 |
| EP | 1 237 292 | 9/2002 |
| JP | 2002-344360 | 11/2002 |
| JP | 2003-051760 | 2/2003 |
| JP | 2004-135358 | 4/2004 |
| JP | 2004-173302 | 6/2004 |
| RU | 2 107 951 | 3/1998 |
| WO | WO 01/03366 | 1/2001 |
| WO | WO 01/17283 | 3/2001 |
| WO | WO 02/32016 | 4/2002 |

OTHER PUBLICATIONS

TSG-RAN Working Group 1, Meeting #15, TFCI Coding Scheme for 8PSK in low chip rate TDD Option, Aug. 25, 2000, Samsung Electronics Co. Ltd., TSGR1#15 (00) 0870, p. 1-17.

Samsung Electronics Co. Ltd., TFCI Coding Scheme for the Variable Hard Split Mode (Revision of RI-01-731), Jun. 26-28, 2001.

3$^{rd}$ Generation Partnership Project, Technical Specification Group Radio Access Network; Enchancement on the DSCH Hard Split Mode, Release 5, Mar. 2002.

Samsung Electronics Co. LTD., "Dynamic Split Mode for TFCI" TSG-RAN Working Group 1, Meeting #17, Stockholm, Sweden, Nov. 21-24, 2000.

Samsung Electronics Co. LTD., "TFCI Coding Scheme for the Flexible Hard Split Mode", TSG-RAN Working Group 1 Ad Hoc, Espoo, Finland, Jun. 26-28, 2001, rl-01-0731.

Samsung Electronics Co. LTD., "TFCI Coding Scheme for the Flexible Hard Split Mode", TSG-RAN Working Group 1 Ad Hoc, Espoo, Finland, Jun. 26-28, 2001, R1-01-0683.

"The Theory of Error-Correcting Codes", (10th impression), F. J. MacWilliams, N.J.A. Sloane, North-Holland, Ch. 1. paragraphs 2-3, pp. 6-15, 1998.

* cited by examiner

Frame structure of downlink DPCH

APPARATUS AND METHOD FOR TRANSMITTING TFCI BITS FOR A HARD SPLIT MODE IN A CDMA MOBILE COMMUNICATION SYSTEM

PRIORITY

This application claims priority to an application entitled "Apparatus and Method for Transmitting TFCI Bits for Hard Split Mode in a CDMA Mobile Communication System" filed in the Korean Industrial Property Office on Jun. 28, 2001 and assigned Serial No. 2001-42669, and an application entitled "Apparatus and Method for Transmitting TFCI Bits for Hard Split Mode in a CDMA Mobile Communication System" filed in the Korean Industrial Property Office on Jul. 9, 2001 and assigned Serial No. 2001-40714, the contents of both of which are hereby incorporated by reference.

BACKGROUND OF THE INVENTION

1. Field of the Invention

The present invention relates generally to an asynchronous CDMA mobile communication system, and in particular, to an apparatus and method for transmitting TFCI (Transport Format Combination Indicator) bits used during data transmission over a downlink shared channel in an asynchronous CDMA mobile communication system.

2. Description of the Related Art

In general, a downlink shared channel (DSCH) is shared by a plurality of users oil a time-division basis. The DSCH is established in association with a dedicated channel (DCH) for every user. The DCH is transmitted over a dedicated physical channel (DPCH), and the DPCH is constructed by combining a dedicated physical control channel (DPCCH) and a dedicated physical data channel (DPDCH) on a time-division basis.

The DSCH is transmitted over a physical downlink shared channel (PDSCH), and channel control information for the PDSCH is transmitted over DPCCH in the DPCH. The control information transmitted over the DPCCH includes information on (i) TPC (Transmitted Power Control command) for controlling uplink transmission power from a UE (User Equipment), (ii) Pilot field used for channel variation estimation, transmission power measurement, and slot synchronization acquisition from a Node B to a UE, and (iii) TFCI (Transport Format Combination Indicator). Of this information, the TPC and the Pilot are used as physical control information for the PDSCH and the DPCH, and the TFCI is used to indicate information characteristics (e.g., information transfer rate, and combination of different information, i.e., combination of voice information and packet information) of the data transmitted over the DSCH and the DPDCH.

As stated above, the TFCI, the control information indicating information characteristics of the data transmitted over the physical channels DSCH and DPDCH, has a 10-bit length and is encoded into 32 bits. That is, information on an amount of data is expressed with 10 bits, and the 10-bit information is encoded into 32 bits to be transmitted over the physical channel.

The TFCI is transmitted over the physical channel in the following method specified in the 3GPP ($3^{rd}$ Generation Partnership Project) Technical Specification 25.212 for UMTS (Universal Mobile Telecommunication System).

$a_k = k^{th}$ information bit of transport combination information ($0 \leq k \leq 9$)

$b_l = l^{th}$ coded bit of transport combination information ($0 \leq l \leq 31$)

$d_m = m^{th}$ transmitted coded bit of transport combination information

The $a_k$ is 10-bit information indicating rate, type and combination of the data transmitted over the DPDCH, the $b_l$ is comprised of 32 coded bits obtained by encoding the $a_k$, and the $d_m$ is a transmitted coded bit where the $b_l$ is transmitted over the DPCCH. Here, the value m is variable according to conditions.

Conditions for determining the number of $d_m$ bits are determined based on a transmission mode of the DPCCH and a data rate of the DPCH. The transmission mode of the DPCCH includes a normal transmission mode and a compressed transmission mode. The compressed transmission mode is used when a UE having one RF transceiver intends to measure at another frequency band. An operation in the compressed transmission mode temporarily suspends transmission at the current frequency band enabling the UE to measure at another frequency band. Data to be transmitted in the transmission suspended period is compressed immediately before and after the transmission suspended period.

The "data rate of the DPCH", one of the conditions for determining the number of $d_m$ bits, refers to a physical data rate of the DPCH and is determined according to a spreading factor (SF) of data. In the 3GPP of the current mobile communication standard, the SF ranges from 512 to 4 and the data rate ranges from 15 Kbps to 1920 Kbps. As the SF becomes higher, the data rate becomes lower. The reason that the number of $d_m$ bits is determined according to the data rate of the DPCH is because the size (or length) of the TFCI field transmitting TFCI bits of the DPCCH is variable according to the data rate of the DPCH.

The number of $d_m$ bits transmitted for each of the conditions for determining $d_m$ is calculated as follows.

A1. Normal Transmission Mode, Data Rate of DPCH being Lower than 60 Kbps

In the case of a condition A1 for determining the number of $d_m$ bits, the number of $d_m$ bits becomes 30. In the 3GPP standard, a basic transmission unit of the physical channel is a radio frame. The radio frame has a length of 10 ms and is comprised of 15 time slots. Each time slot has fields for transmitting TFCI. In the case of A1, each time slot has 2 TFCI transmission fields, so the number of TFCI transmission code bits $d_m$ that can be transmitted for one radio frame becomes 30. Therefore, although the number of the coded bits $b_l$ based on the information bit $a_k$ becomes 32, the last two transport combination information bits $b_{30}$ and $d_{31}$ are not transmitted due to a limitation in the number of the TFCI fields actually transmitted.

A2. Normal Transmission Mode, Data Rate of DPCH being Higher than 60 Kbps

In the case of a condition A2 for determining the number of $d_m$ bits, a length of the TFCI field in the time slot becomes 8 bits, and the total number of $d_m$ that can be transmitted over the DPCCH for one radio frame becomes 120. When the total number of $d_m$ is 120, $b_l$ is repeatedly transmitted, as follows.

$d_0(b_0), \ldots, d_{31}(b_{31}), d_{32}(b_0), \ldots, d_{63}(b_{31}), \ldots, d_{96}(b_0), \ldots, d_{119}(b_{23})$ In the case of A2, $0^{th}$ to $23^{rd}$ $b_l$ bits are repeated 4 times, and $24^{th}$ to $31^{st}$ $b_l$ bits are repeated 3 times for transmission.

A3. Compressed Transmission Mode, Data Rate of DPCH being Lower than 60 Kbps or Equal to 120 Kbps In the case of a condition A3 for determining the number of $d_m$ bits, a length of the TFCI field in the time slot becomes 4 bits, and the number of TFCIs that can be transmitted for one radio frame is variable according to the number of time slots used in the compressed transmission mode. In the compressed transmission mode, the number of transmission-suspended time slots ranges from a minimum of 1 to a maximum of 7, and the number of $d_m$ bits is between 32 and 56. The number of the transmitted coded bits $d_m$ is limited to a maximum of 32, thereby to transmit all of $0^{th}$ to $31^{st}$ $b_l$ bits at the changed $d_m$ and not transmit the $b_l$ bits at the other $d_m$.

A4. Compressed Transmission Mode, Data Rate of DPCH being Higher than 120 Kbps or Equal to 60 Kbps In the case of a condition A4 for determining the number of $d_m$ bits, a length of the TFCI field in the time slot becomes 16 bits, and the number of TFCIs that can be transmitted for one radio frame is variable according to the number of time slots used in the compressed transmission mode. In the compressed transmission mode, the number of transmission-suspended time slots is a minimum of 1 to a maximum of 7, and the number of $d_m$ bits ranges from 128 to 244. The number of the transmitted coded bits $d_m$ is limited to a maximum of 128, thereby to repeatedly transmit $0^{th}$ to $31^{st}$ $b_l$ bits 4 times at the changed $d_m$, and not transmit the $b_l$ bits at the other $d_m$.

In the compressed transmission mode of A3 and A4, the $d_m$ bits are arranged in a period as far away from the transmission suspended period as possible to maximize reliability of transmitting the $d_m$ bits.

The A1, A2, A3 and A4 conditions are used when the TFCI indicates the transport combination and type of the DPCH. A method of dividing the TFCI into TFCI for DSCH and TFCI for DPCH during transmission can be divided into two separate methods.

A first method is a method for a hard split mode (HSM), and a second method is a method for a logical split mode (LSM).

The TFCI for DCH will be referred to as TFCI(field 1) or a first TFCI, and the TFCI for DSCH will be referred to as TFCI(field 2) or a second TFCI.

In the LSM method, the TFCI(field 1) and the TFCI(field 2), as one TFCI, are encoded with a (32,10) sub-code of the second order Reed-Muller code. The TFCI(field 1) and the TFCI(field 2) express 10-bit TFCI information in various ratios, and the 10 information bits are encoded with one block code, i.e., (32,10) sub-code of the second order Reed-Muller code according to the A1, A2, A3 and A4 conditions, before being transmitted. The ratios of the TFCI(field 1) to the TFCI (field 2) include 1:9, 2:8 3:7, 4:6, 5:5, 6:4, 7:3, 8:2, and 9:1.

In the HSM method, the TFCI(field 1) and the TFCI(field 2) are fixedly expressed with 5 bits, respectively, and each information is output using a (16,5) bi-orthogonal code, and then the 16 bits for the TFCI(field 1) and the TFCI(field 2) are alternately transmitted in accordance with the A1, A2, A3 and A4 conditions.

FIG. 1 illustrates a structure of a transmitter based on the conventional HSM method. Referring to FIG. 1, a (16,5) bi-orthogonal encoder 100 encodes a 5-bit TFCI(field 1) for the DCH into 16 coded symbols, and provides the 16 coded symbols to a multiplexer 110. At the same time, a (16,5) bi-orthogonal encoder 105 encodes a 5-bit TFCI(field 2) for the DSCH into 16 coded symbols, and provides the 16 coded symbols to the multiplexer 110. The multiplexer 110 then time-multiplexes the 16 coded symbols from the encoder 100 and the 16 coded symbols from the encoder 105, and outputs 32 symbols after arrangement. A multiplexer 120 time-multiplexes the 32 symbols output from the multiplexer 110 and other signals, and provides its output to a spreader 130. The spreader 130 spreads the output signal of the multiplexer 120 with a spreading code provided from a spreading code generator 135. A scrambler 140 scrambles the spread signal with a scrambling code provided from a scrambling code generator 145.

FIG. 2 illustrates a general procedure for exchanging signaling messages and data between a Node B and RNCs (Radio Network Controllers) for the HSM method defined in the 3GPP (3rd Generation Partnership Project). A 3GPP RAN (Radio Access Network) is comprised of a RNC (Radio Network Controller), a Node B controlled by the RNC, and a UE (User Equipment). The RNC controls the Node B, the Node B serves as a base station, and the UE seraes as a terminal. The RNC can be divided into an SRNC (Serving Radio Network Controller) and a CRNC (Control Radio Network Controller) according to the relationships with the UE. The SRNC, an RNC where the UE is registered, processes data to be transmitted to and received from the UE, and controls the UE. The CRNC, an RNC where the UE is currently connected, connects the UE to the SRNC.

Referring to FIG. 2, if transmission data of the DSCH is generated, a radio link controller (RLC) 11 of an SRNC (Serving RNC) 10 transmits the DSCH data to a MAC-D (Medium Access Control-Dedicated channel) 13 of the SRNC 10 in step 101. A primitive transmitted at this moment is MAC-D-Data-REQ. In step 102, the MAC-D 13 of the SRNC 10 transmits the DSCH data received from the RLC 11 to a MAC-C/SH (MAC-Common/Shared channel) 21 of a CRNC (Control RNC) 20. A primitive transmitted at this moment is MAC-C/SH-Data-REQ. In step 103, the MAC-C/SH 21 of the CRNC 20 determines (schedules) a transmission time for the DSCH data received in the step 102 from the MAC-D 13 of the SRNC 10, and then, transmits the DSCH data along with its associated TFI (Transport Format Indicator) to an L1 (Layer 1) 30 of a Node B (hereinafter, the term "Node B" refers to a base station). A primitive transmitted at this moment is MPHY-Data-REQ. In step 104, the MAC-D 13 of the SRNC 10 transmits transmission data of the DCH and its associated TFI to the L1 30 of the Node B. A primitive transmitted at this moment is MPHY-Data-REQ. The data transmitted in the step 103 is independent of the data transmitted in the step 104, and the L1 30 of the Node B generates a TFCI that is divided into a TFCI for the DCH and a TFCI for the DSCH. In the steps 103 and 104, the data and the TFIs are transmitted using a data frame protocol. After receiving the data and the TFIs in steps 103 and 104, the L1 30 of the Node B transmits the DSCH data over a physical DSCH (PDSCH) to an L1 41 of a UE (User Equipment; hereinafter, the term "UE" refers to a mobile station) 40 in step 105. Thereafter, in step 106, the L1 30 of the Node B transmits the TFCI to the L1 41 of the UE 40 using the DPCH. The L1 30 of the Node B transmits the TFCIs created with the TFIs received in the steps 103 and 104, using the fields for the DCH and the DSCH.

FIG. 3 illustrates a general procedure for exchanging signaling messages and data between a Node B and RNCs for the LSM method. Referring to FIG. 3, if DSCH data to be transmitted is generated, an RLC 301 of an RNC 300 transmits the DSCH data to a MAC-D 303 of the RNC 300 in step 201. A primitive transmitted at this moment is MAC-D-Data-REQ. Upon receipt of the DSCH data from the RLC 301, the MAC-D 303 transmits the DSCH data to a MAC-C/SH (MAC-Common/Shared channel) 305 in step 202. A primitive transmitted at this moment is MAC-C/SH-Data-REQ. Upon receipt of the DSCH data, the MAC-C/SH 305 determines (schedules) a transmission time of the DSCH data and then transmits a TFCI associated with the DSCH data to MAC-D 303 in step 203. After transmitting the TFCI to the MAC-D 303 in the step 203, the MAC-C/SH 305 transmits the DSCH data to an L1 307 of the Node B in step 204. The DSCH data is transmitted at the time determined (scheduled) in the step 203. Upon receipt of the TFCI for the DSCH data transmitted from the MAC-C/SH 305 in the step 203, the MAC-D 303 determines a TFCI for the DSCH and transmits the TFCI to the L1 307 of the Node B in step 205. A primitive transmitted at this moment is MPHY-Data-REQ. After transmitting the TFCI for the DSCH, the MAC-D 303 determines a TFCI for the DCH and transmits the DCH data along with the TFCI for the DCH to the L1 307 of the Node B in step 206. A primitive transmitted at this moment is MPHY-Data-REQ. The DSCH data transmitted in the step 204 and the TFCI transmitted in the step 205 are related to the time determined in the step 203. That is, the TFCI in the step 205 is transmitted to a UE 310 over the DPCCH at a frame immediately before the DSCH data in the step 204 is transmitted over the PDSCH. In the steps 204, 205, and 206, the data and the TFCIs are transmitted using a frame protocol. Particularly, in the step 206, the TFCI is transmitted through a control frame. In step 207, the L1 307 of the Node B transmits the DSCH data over the PDSCH to an L1 311 of the UE 310. In step 208, the L1 307 of the Node B creates a TFCI using the respective TFCIs or TFIs received in the steps 205 and 206, and transmits the created TFCI to the L1 311 using the DPCCH.

Summarizing the LSM method, the MAC-C/SH 305 transmits DSCH scheduling information and TFCI information of the DSCH to the MAC-D 303 in the step 203. This is because in order to encode the TFCI for the DSCH and the TFCI for the DCH in the same coding method, the MAC-D 303 must simultaneously transmit the DSCH scheduling information and the TFCI information to the L1 307 of the Node B. Therefore, when the MAC-D 303 has data to transmit, a delay occurs until the MAC-D 303 receives the scheduling information and the TFCI information from the MAC-C/SH 305 after transmitting the data to the MAC-C/SH 305. In addition, when the MAC-C/SH 305 is separated from the MAC-D 303 on the Iur, i.e., when the MAC-C/SH 305 exists in the DRNC (Drift RNC) and the MAC-D 303 exists in the SRNC, the scheduling information and the TFCI information are exchanged on the Iur, causing an increase in the delay.

Compared with the LSM method, the HSM method can reduce the delay because information transmission to the MAC-D is not required after scheduling in the MAC-C/SH. This is possible because the Node B can independently encode the TFCI for the DCH and the TFCI for the DSCH in the HSM method. In addition, when the MAC-C/SH is separated from the MAC-D on the Iur, i.e., when the MAC-C/SH exists in the DRNC and the MAC-D exists in the SRNC, the scheduling information is not exchanged oil the Iur. Therefore, in some cases, it is not possible to use the LSM that must recognize the scheduling information. However, in the current 3GPP HSM, the information amounts (bits) of the TFCIs for the DCH and the DSCH are fixedly divided in a ratio of 5 bits to 5 bits, so that it is possible to express a maximum of 32 TFCIs for the DCH and the DSCH. Therefore, when there are 32 TFCIs for the DSCH, the HSM method cannot be used. In addition, when the LSM is used, i.e., when the MAC-C/SH is separated from the MAC-D on the Iur, the TFCI for the DCH and the TFCI for the DSCH may not be correctly transmitted.

SUMMARY OF THE INVENTION

It is, therefore, an object of the present invention to provide an apparatus and method for transmitting TFCI information in a wireless communication system.

It is another object of the present invention to provide an apparatus and method for receiving TFCI information using an inverse fast Hadamard transformer for a Walsh encoder having a variable length.

It is further another object of the present invention to provide an apparatus and method for varying a length of TFCI information used in a hard split mode.

It is yet another object of the present invention to provide an apparatus and method for changing an arrangement of actually transmitted coded bits by varying a length of TFCI information used in a hard split mode.

It is still another object of the present invention to provide a method for transmitting a signaling message so as to separately use a hard split mode and a logical split mode.

In accordance with a first aspect of the present invention, there is provided an encoding method for a DCH (Dedicated Channel) encoder and a DSCH (Downlink Shared Channel) encoder in a transmitter for a mobile communication system including the DCH encoder for encoding k bits among 10 input TFCI (Transport Format Combination Indicator) bits and the DSCH encoder for encoding remaining (10−k) bits among the input TFCI bits. The method comprises generating, by the DCH encoder, a first coded bit stream by encoding the k input bits into 32 bits, and outputting a (3k+1)-bit stream by puncturing the first coded bit stream according to a specific mask pattern corresponding to the k value; and generating, by the DSCH encoder, a second coded bit stream by encoding the (10−k) input bits into 32 bits, and outputting a {3*(10−k)+1}-bit stream by puncturing the second coded bit stream according to a specific mask pattern corresponding to the (10−k) value.

In accordance with a second aspect of the present invention, there is provided an apparatus for encoding two TFCI (Transport Format Combination Indicator) bit streams separated into k bits and (10−k) bits according to a bit ratio of two input TFCI in a mobile communication system. The apparatus comprises a DCH (Dedicated Channel) encoder for generating a first coded bit stream by encoding the k input bits into 32 bits, and outputting a (3k+1)-bit stream by puncturing the first coded bit stream according to a specific mask pattern corresponding to the k value; and a DSCH (Downlink Shared Channel) encoder for generating a second coded bit stream by encoding the (10−k) input bits into 32 bits, and outputting a {3*(10−k)+1}-bit stream by puncturing the second coded bit stream according to a specific mask pattern corresponding to the (10−k) value.

In accordance with a third aspect of the present invention, there is provided a method for decoding k first TFCI bits and (10−k) second TFCI bits in a reception apparatus for a mobile communication system for receiving a stream of (3k+1) first TFCI bits for a DCH (Dedicated Channel) and a stream of {3*(10−k)+1} second TFCI bits for a DSCH (Downlink Shared Channel), transmitted over a DPCH (Dedicated Physical Channel) from a transmission apparatus in an information bit ratio of (3k+1) bits to {3*(10−k)+1} bits after being multiplexed. The method comprises outputting a 32-bit stream by inserting 0's in the stream of the (3k+1) first TFCI bits according to a specific mask pattern corresponding to the k value, and decoding the k first TFCI bits from the 32-bit stream; and outputting a 32-bit stream by inserting 0's in the stream of the {3*(10−k)+1} second TFCI bits according to a specific mask pattern corresponding to the (10−k) value, and decoding the (10−k) second TFCI bits from the 32-bit stream.

In accordance with a fourth aspect of the present invention, there is provided an apparatus for decoding k first TFCI bits and (10−k) second TFCI bits in a reception apparatus for a mobile communication system for receiving a stream of (3k+1) first TFCI bits for a DCH (Dedicated Channel) and a stream of {3*(10−k)+1} second TFCI bits for a DSCH (Downlink Shared Channel), transmitted over a DPCH (Dedicated Physical Channel) from a transmission apparatus in an information bit ratio of (3k+1) bits to {3*(10−k)+1} bits after being multiplexed. The apparatus comprises a DCH decoder for outputting a 32-bit stream by inserting 0's in the stream of the (3k+1) first TFCI bits according to a specific mask pattern corresponding to the k value, and decoding the k first TFCI bits from the 32-bit stream; and a DSCH decoder for outputting a 32-bit stream by inserting 0's in the stream of the {3*(10−k)+1} second TFCI bits according to a specific mask pattern corresponding to the (10−k) value, and decoding the (10−k) second TFCI bits from the 32-bit stream.

In accordance with a fifth aspect of the present invention, there is provided an encoding method for a first encoder and a second encoder in a transmission apparatus for a mobile communication system including the first encoder for encoding k bits among 10 input TFCI bits and the second encoder for encoding remaining (10−k) bits among the input TFCI bits. The method comprises generating, by the first encoder, a first coded bit stream by encoding the k input bits into 32 bits, and outputting a 3k-bit stream by puncturing the first coded bit stream according to a specific mask pattern corresponding to the k value; and generating, by the second encoder, a second coded bit stream by encoding the (10−k) input bits into 32 bits, and outputting a {3*(10−k)+2}-bit stream by puncturing the second coded bit stream according to a specific mask pattern corresponding to the (10−k) value.

In accordance with a sixth aspect of the present invention, there is provided an apparatus for encoding two TFCI (Transport Format Combination Indicator) bit streams separated into k bits and (10−k) bits according to an information bit ratio of 10 input TFCI bits in a mobile communication system. The apparatus comprises a first encoder for generating a first coded bit stream by encoding the k input bits into 32 bits, and outputting a 3k-bit stream by puncturing the first coded bit stream according to a specific mask pattern corresponding to the k value; and a second encoder for generating a second coded bit stream by encoding the (10−k) input bits into 32 bits, and outputting a {3*(10−k)+2}-bit stream by puncturing the second coded bit stream according to a specific mask pattern corresponding to the (10−k) value.

In accordance with a seventh aspect of the present invention, there is provided a method for decoding k first TFCI bits and (10−k) second TFCI bits in a reception apparatus for a mobile communication system for receiving a stream of 3k first TFCI bits for a DCH (Dedicated Channel) and a stream of {3*(10−k)+2} second TFCI bits for a DSCH (Downlink Shared Channel), transmitted over a DPCH (Dedicated Physical Channel) from a transmission apparatus in an information bit ratio of 3k bits to {3*(10−k)+2} bits after being multiplexed. The method comprises outputting a 32-bit stream by inserting 0's in the stream of the 3k first TFCI bits according to a specific mask pattern corresponding to the k value, and decoding the k first TFCI bits from the 32-bit stream; and outputting a 32-bit stream by inserting 0's in the stream of the {3*(10−k)+2} second TFCI bits according to a specific mask pattern corresponding to the (10−k) value, and decoding the (10−k) second TFCI bits from the 32-bit stream.

In accordance with an eighth aspect of the present invention, there is provided an apparatus for decoding k first TFCI bits and (10−k) second TFCI bits in a reception apparatus for a mobile communication system for receiving a stream of 3k first TFCI bits for a DCH (Dedicated Channel) and a stream of {3*(10−k)+2} second TFCI bits for a DSCH (Downlink Shared Channel), transmitted over a DPCH (Dedicated Physical Channel) from a transmission apparatus in an information bit ratio of 3k bits to {3*(10−k)+2} bits after being multiplexed. The apparatus comprises a first decoder for outputting a 32-bit stream by inserting 0's in the stream of the 3k first TFCI bits according to a specific mask pattern corresponding to the k value, and decoding the k first TFCI bits from the 32-bit stream; and a second decoder for outputting a 32-bit stream by inserting 0's in the stream of the {3*(10−k)+2} second TFCI bits according to a specific mask pattern corresponding to the (10−k) value, and decoding the (10−k) second TFCI bits from the 32-bit stream.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
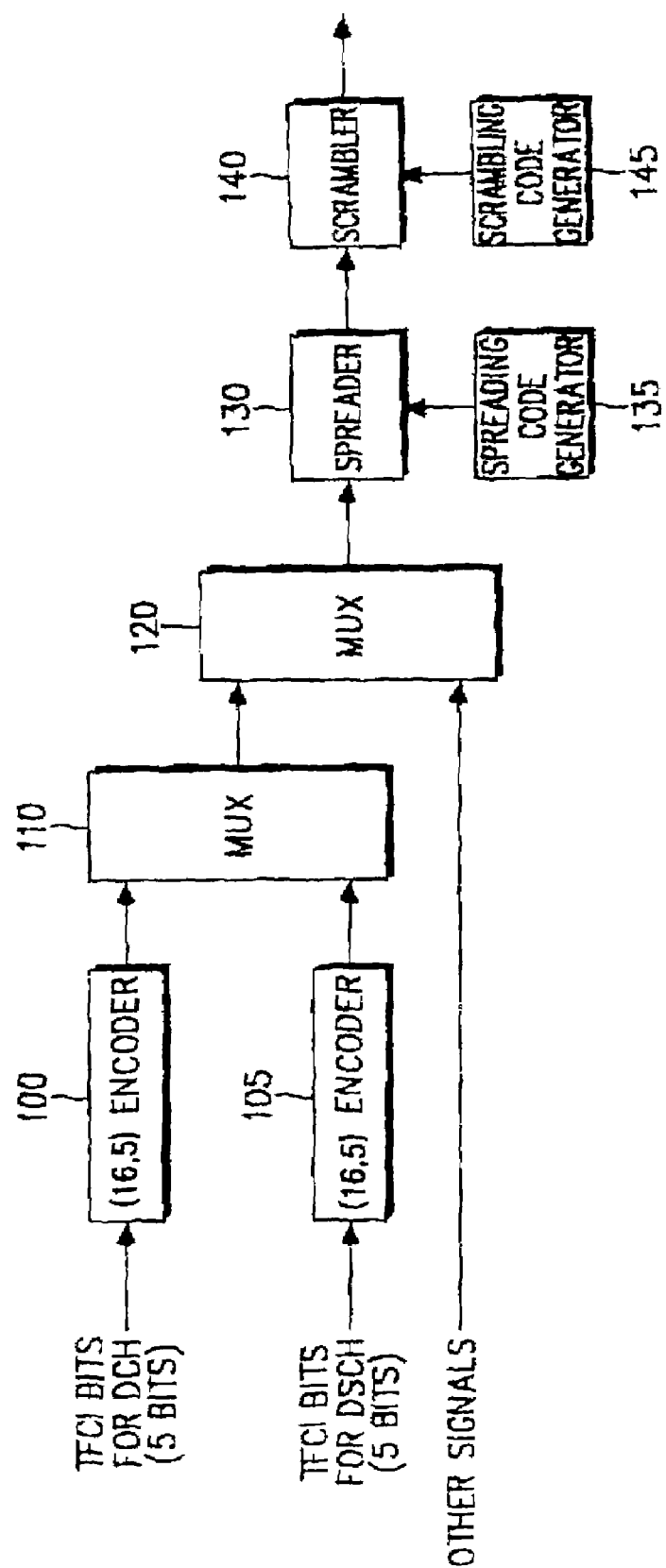
FIG. 1 illustrates a structure of a conventional transmitter based on a hard split mode (HSM)
Figure 2:
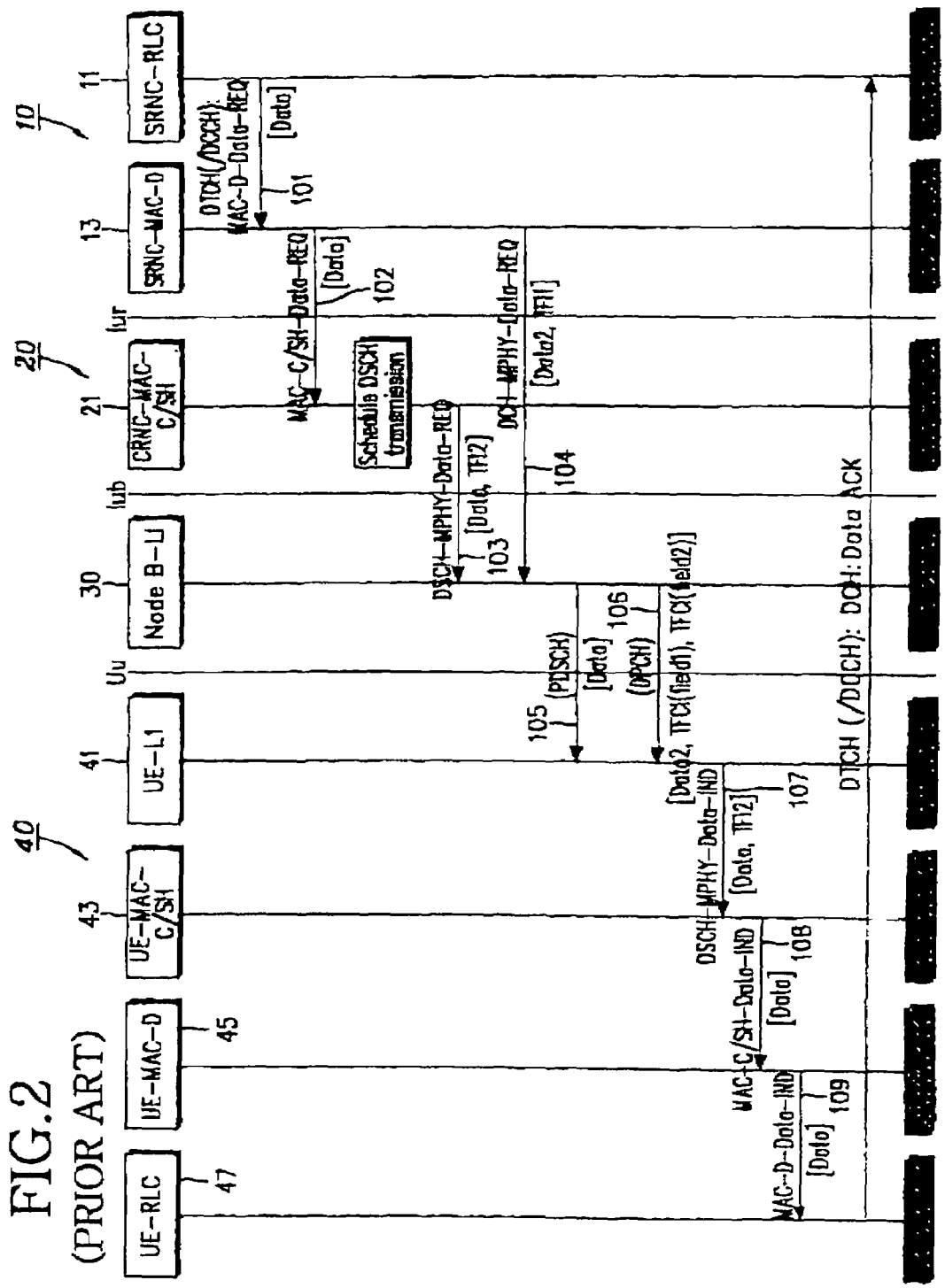
FIG. 2 illustrates a general procedure for exchanging signaling messages and data between a Node B and radio network controllers (RNCs) in the hard split mode.
Figure 3:
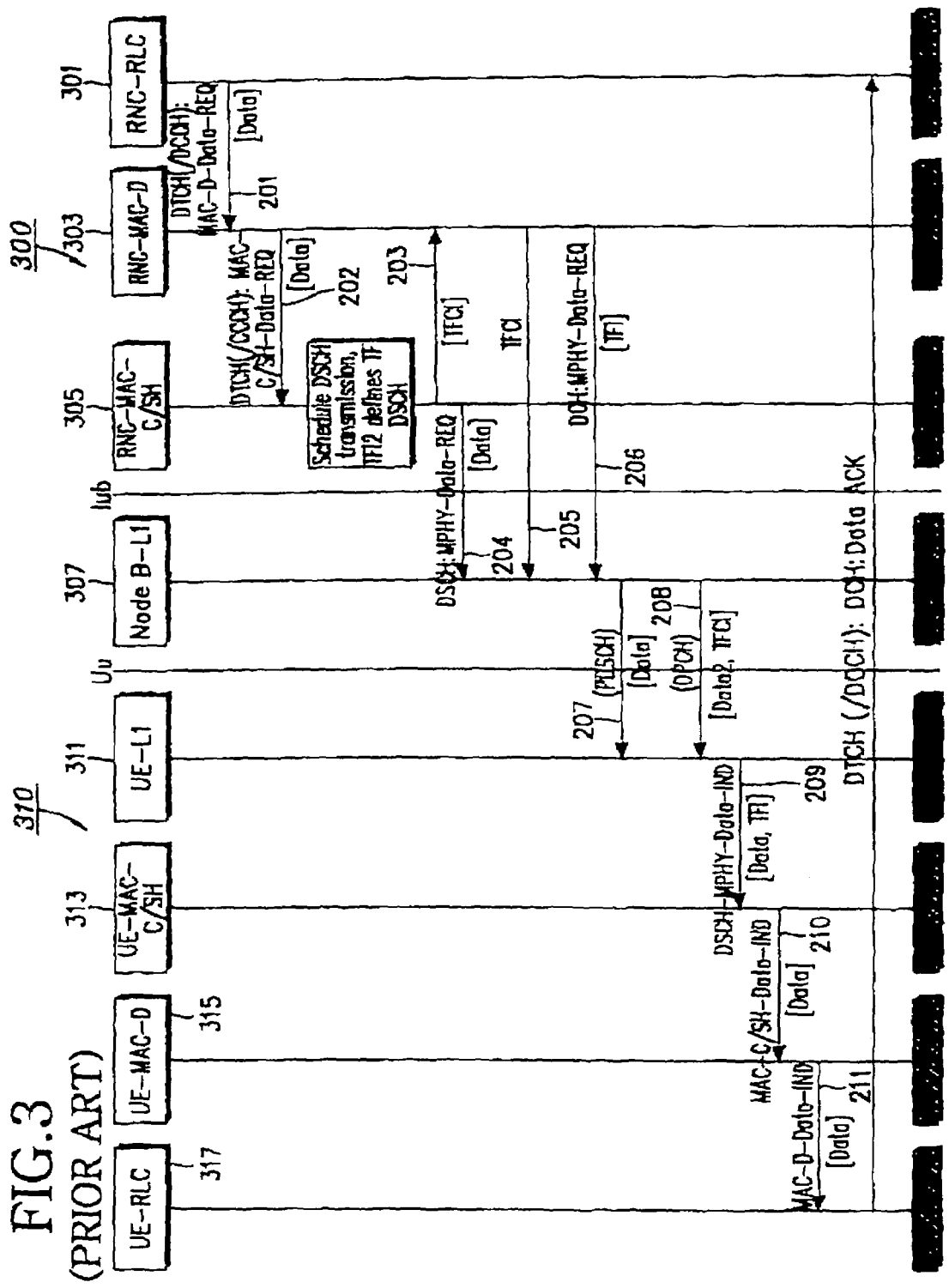
FIG. 3 illustrates a general procedure for exchanging signaling messages and data between a Node B and RNCs in a logical split mode (LSM)

A preferred embodiment of the present invention will be described herein below with reference to the accompanying drawings. In the following description, well-known functions or constructions are not described in detail since they would obscure the invention in unnecessary detail.

In the HSM method, the number of information bits for the DSCH and the DCH is 10 in total, and the 10 information bits are divided in a ratio of 1:9, 2:8, 3:7, 4:6 5:5, 6:4, 7:3, 8:2 or 9:1 for the DSCH and the DCH, and then subjected to coding. One radio frame transmits 30, 120, 32 and 128 TFCI coded symbols according to the conditions A1, A2, A3, and A4, respectively. In each case excluding repeated transmission, a basic coding rate is $^{10}/_{32}$, and in condition A1, a coding rate becomes $^{10}/_{30}$ due to the limited transmission of the physical channel. Therefore, when the TFCI information bits for the DSCH and the TFCI information bits for the DCH are divided in a specific ratio of 1:9, 2:8, 3:7, 4:6 5:5, 6:4, 7:3, 8:2 or 9:1, it is natural to maintain the coding rate by dividing the coded symbols in the above ratios. Maintaining the coding rate means maintaining a basic coding rate of (32,10). In the HSM, the reason for maintaining a code gain of the differently encoded TFCI for the DSCH and TFCI for the DCH is to maintain a code gain by similarly maintaining the coding rate of (32,10), although the TFCI for the DSCH and the TFCI for the DCH are separately encoded. An example of dividing the coded bits according to the ratio of the input bits will be described on the assumption of the condition A1.

In condition A1, if 10 input information bits are divided in a 1:9 ratio, then 30 coded output symbols are divided in a 3:27 ratio, and if the 10 input information bits are divided in 2:8, then the 30 coded output symbols are divided in 6:24. Further, if the 10 input information bits are divided in 3:7, then the 30 coded output symbols are divided in 9:21, and if the 10 input information bits are divided in 4:6, then the 30 coded output symbols are divided in 12:18. However, in conditions A2, A3, and A4, the 32 coded symbols are all transmitted or the 32 coded symbols are repeatedly transmitted, so the coded symbols cannot be correctly divided as in the condition A1.

Therefore, in the embodiment of the present invention, the coding rates of the coded symbols defined in association with the input bits can be expressed as shown in Table 1.

TABLE 1

| | | Coding Rate Used | |
|---|---|---|---|
| Ratio of Input Bits | Ratio of Coded Symbols | Coding Rate of $1^{st}$ TFCI | Coding Rate of $2^{nd}$ TFCI |
| 1:9 | 3:29 | (3:1) | (29:9) |
| | 4:28 | (4:1) | (28:9) |
| | 5:27 | (5:1) | (27:9) |
| 2:8 | 6:26 | (6:2) | (26:8) |
| | 7:25 | (7:2) | (25:8) |
| | 8:24 | (8:2) | (24:8) |
| 3:7 | 9:23 | (9:3) | (23:7) |
| | 10:22 | (10:3) | (22:7) |
| | 11:21 | (11:3) | (21:7) |
| 4:6 | 12:20 | (12:4) | (20:6) |
| | 13:19 | (13:4) | (19:6) |
| | 14:18 | (14:4) | (18:6) |
| 6:4 | 18:14 | (18:6) | (14:4) |
| | 19:13 | (19:6) | (13:4) |
| | 20:12 | (20:6) | (12:4) |
| 7:3 | 21:11 | (21:7) | (11:3) |
| | 22:10 | (22:7) | (10:3) |
| | 23:9 | (23:7) | (9:3) |
| 8:2 | 24:8 | (24:8) | (8:2) |
| | 25:7 | (25:8) | (7:2) |
| | 26:6 | (26:8) | (6:2) |
| 9:1 | 27:5 | (27:9) | (5:1) |
| | 28:4 | (28:9) | (4:1) |
| | 29:3 | (29:9) | (3:1) |

A criterion for determining the coding rates in Table 1 according to the ratio of the input bits will be described herein below. The embodiment of the present invention sets the sum of the coded symbols to 30 by applying the minimum required value to the substantial coding rate (30,10) for the most frequently used case A1 among the conditions A1, A2, A3, and A4, and setting the coding rate of the first TFCI and the coding rate of the second TFCI to a minimum of ⅓, and then allocates the remaining 2 coded symbols to the coded symbol of the first TFCI and coded symbol of the second TFCI, respectively. Therefore, the embodiment of the present invention increases both the coding rate of the first TFCI and the coding rate of the second TFCI, or increases either the coding rate of the first TFCI or the coding rate of the second TFCI, using the remaining 2 coded symbols as coded symbols of the first TFCI or coded symbols of the second TFCI. The embodiment increases the coding rate of either the first TFCI or the second TFCI among the criteria for determining the coding rates, when it is necessary to increase performance by increasing only the coding rate of the first TFCI or the coding rate of the second TFCI on a condition that the sum of the number of the coded symbols for the first TFCI and the number of the coded symbols for the second TFCI should become 32.

Once a ratio of the input bits in Table 1 is determined, one of 3 coding methods is used according to the ratio of the coded symbols.

Of the 3 coding methods, a first coding method is a method of increasing both the coding rate of the first TFCI and the coding rate of the second TFCI, a second coding method is a method of increasing only the coding rate of the first TFCI, and a third coding method is a method of increasing only the coding rate of the second TFCI.

First, the method of increasing both the coding rate of the first TFCI and the coding rate of the second TFCI will be described with reference to Table 1. If a ratio of the input bits (or a ratio of information amounts, i.e., a ratio of the first TFCI bits and the second TFCI bits) is 1:9, a ratio of the coded symbols becomes 4:28. If the ratio of the input bits is 2:8, the ratio of the coded symbols becomes 7:25, and if the ratio of the input bits is 3:7, the ratio of the coded symbols becomes 10:22. If the ratio of the input bits is 4:6, the ratio of the coded symbols becomes 13:19, and if the ratio of the input bits is 5:5, the ratio of the coded symbols becomes 16:16. If the ratio of the input bits is 6:4, the ratio of the coded symbols becomes 19:13, and if the ratio of the input bits is 7:3, the ratio of the coded symbols becomes 22:10. If the ratio of the input bits is 8:2, the ratio of the coded symbols becomes 25:7, and if the ratio of the input bits is 9:1, the ratio of the coded symbols becomes 28:4. Therefore, as illustrated in Table 1, the coding rate of the first TFCI and the coding rate of the second TFCI should be defined in association with the ratio of the input bits and the ratio of the coded symbols. Further, in order to secure excellent performance while decreasing hardware complexity, it is necessary to satisfy 10 different coding rates using one encoder. The 10 different coding rates include the 8 coding rates of (4,1), (7,2), (10,3), (13,4), (19,6), (22,7), (25,8) and (28,9) shown in Table 1 plus a coding rate (16,5), required when the ratio of the input bits is 5:5 and a coding rate (32,10) required when only the first TFCI bits or the second TFCI bits are received.

Next, the method of increasing the coding rate of either the first TFCI or the second TFCI will be described with reference to Table 1. If a ratio of the input bits (or a ratio of information amounts, i.e., a ratio of the first TFCI bits and the second TFCI bits) is 1:9, a ratio of the coded symbols becomes 3:29 or 5:27. If the ratio of the input bits is 2:8, the ratio of the coded symbols becomes 6:26 or 8:24, and if the ratio of the input bits is 3:7, the ratio of the coded symbols becomes 9:23 or 11:21. If the ratio of the input bits is 4:6, the ratio of the coded symbols becomes 12:20 or 14:18, and if the ratio of the input bits is 5:5, the ratio of the coded symbols becomes 15:17 or 17:15. If the ratio of the input bits is 6:4, the ratio of the coded symbols becomes 18:14 or 20:12, and if the ratio of the input bits is 7:3, the ratio of the coded symbols becomes 21:11 or 23:9. If the ratio of the input bits is 8:2, the ratio of the coded symbols becomes 24:8 or 26:6, and if the ratio of the input bits is 9:1, the ratio of the coded symbols becomes 27:5 or 29:3. Therefore, if the ratio of input bits is 1:9, then {(3,1) encoder and (29,9) encoder} or {(5,1) encoder and (27,9) encoder} are required. If the ratio of input bits is 2:8, then {(6,2) encoder and (26,8) encoder} or {(8,2) encoder and (24,8) encoder} are required. If the ratio of input bits is 3:7, then {(9,3) encoder and (23,7) encoder} or {(11,3)

encoder and (21,7) encoder} are required. If the ratio of input bits is 4:6, then {(12,4) encoder and (20,6) encoder} or {(14, 4) encoder and (18,6) encoder} are required. Therefore, considering the 16 encoders and the currently used (16,5) encoder and (32,10) encoder, there is a need for an encoder capable of serving as the 18 encoders with a single structure in order to increase performance and reduce the hardware complexity.

In general, Hamming distance distribution for codewords of the error correcting codes can serve as a measure indicating the performance of linear error correcting codes. The "Hamming distance" means the number of non-zero symbols in a codeword. That is, for a certain codeword '0111', the number of 1's included in the codeword is 3, so the Hamming distance is 3. The least value among the Hamming distance values is called a "minimum distance $d_{min}$", and an increase in the minimum distance of the codeword improves the error correcting performance of the error correcting codes. In other words, the "optimal code" means a code having the optimal error correcting performance. This is disclosed in detail in a paper, *The Theory of Error-Correcting Codes*, F. J. Macwilliams, N. J. A. Sloane, North-Holland.

In addition, in order to use a single encoder structure for the encoders having different lengths for a reduction in the hardware complexity, it is preferable to shorten the code with longest length, i.e., the (32,10) code. For the shortening, it is necessary to puncture the coded symbols. However, during the puncturing, the minimum distance of the code varied according to the puncturing positions. Therefore, it is preferable to calculate the puncturing positions such that the punctured code has the minimum distance.

Now, an operation of an encoder and its associated decoder will be described in detail in connection with each of the 3 coding methods. Among the 3 coding methods, the encoding/decoding method of increasing the coding rate of either the first TFCI or the second TFCI before transmission will be described on the assumption that the coding rate of only the first TFCI is increased, for simplicity.

A. Method of Increasing Coding Rates of Both First TFCI and Second TFCI

In terms of the minimum distance, it is preferable to repeat a (3,2) simplex code 3 times and then puncture the last two coded symbols in order to obtain a (7,2) code, an optimal code having one of the coding rates needed to increase the coding rates of both the first TFCI and the second TFCI. Table 2 illustrates the relationship between input information bits of the (3,2) simplex code and (3,2) simplex codewords output based on the input information bits.

TABLE 2

| Input Information Bits | (3,2) Simplex Codewords |
|---|---|
| 00 | 000 |
| 01 | 101 |
| 10 | 011 |
| 11 | 110 |

Table 3 illustrates the relationship between the input information bits and (7,2) simplex codewords obtained by repeating the (3,2) simplex codeword 3 times and then puncturing the last two coded symbols.

TABLE 3

| Input Information Bits | (7,2) Simplex Codewords |
|---|---|
| 00 | 000 000 0 |
| 01 | 101 101 1 |
| 10 | 011 011 0 |
| 11 | 110 110 1 |

However, the (8,2) simplex codewords obtained by repeating the (3,2) simplex codeword 3 times and then puncturing the last two coded symbols can be implemented by shortening the existing (16,4) Reed-Muller code.

Describing an example of the shortening method, the (16, 4) Reed-Muller code is a linear combination of 4 basis codewords of length 16, where '4' is the number of input information bits. Receiving only 2 bits among the 16 input information bits is equivalent to using a linear combination of only 2 basis codewords among the 4 basis codewords of length 16 and not using the remaining codewords. In addition, by restricting the use of the basis codewords and then puncturing 9 symbols among 16 symbols, it is possible to realize a (7,2) encoder using the (16,4) encoder. Table 4 illustrates the shortening method.

TABLE 4

| Input Info Bits | Codewords | | | | | | | | | | | | | | | |
|---|---|---|---|---|---|---|---|---|---|---|---|---|---|---|---|---|
| 0000 | 0(*) | 0 | 0 | 0 | 0(*) | 0 | 0 | 0 | 0(*) | 0 | 0(*) | 0(*) | 0(*) | 0(*) | 0(*) | 0(*) |
| 0001 | **0(*)** | 1 | 0 | 1 | **0(*)** | 1 | 0 | 1 | **0(*)** | 1 | **0(*)** | **1(*)** | **0(*)** | **1(*)** | **0(*)** | **1(*)** |
| 0010 | **0(*)** | 0 | 1 | 1 | **0(*)** | 0 | 1 | 1 | **0(*)** | 0 | **1(*)** | **1(*)** | **0(*)** | **0(*)** | **1(*)** | **1(*)** |
| 0011 | 0(*) | 1 | 1 | 0 | 0(*) | 1 | 1 | 0 | 0(*) | 1 | 1(*) | 0(*) | 0(*) | 1(*) | 1(*) | 0(*) |
| 0100 | 0 | 0 | 0 | 0 | 1 | 1 | 1 | 1 | 0 | 0 | 0 | 0 | 1 | 1 | 1 | 1 |
| 0101 | 0 | 1 | 0 | 1 | 1 | 0 | 1 | 0 | 0 | 1 | 0 | 1 | 1 | 0 | 1 | 0 |
| 0110 | 0 | 0 | 1 | 1 | 1 | 1 | 0 | 0 | 0 | 0 | 1 | 1 | 1 | 1 | 0 | 0 |
| 0111 | 0 | 1 | 1 | 0 | 1 | 0 | 0 | 1 | 0 | 1 | 1 | 0 | 1 | 0 | 0 | 1 |
| 1000 | 0 | 0 | 0 | 0 | 0 | 0 | 0 | 0 | 1 | 1 | 1 | 1 | 1 | 1 | 1 | 1 |
| 1001 | 0 | 1 | 0 | 1 | 0 | 1 | 0 | 1 | 1 | 0 | 1 | 0 | 1 | 0 | 1 | 0 |
| 1010 | 0 | 0 | 1 | 1 | 0 | 0 | 1 | 1 | 1 | 1 | 0 | 0 | 1 | 1 | 0 | 0 |
| 1011 | 0 | 1 | 1 | 0 | 0 | 1 | 1 | 0 | 1 | 0 | 0 | 1 | 1 | 0 | 0 | 1 |
| 1100 | 0 | 0 | 0 | 0 | 1 | 1 | 1 | 1 | 1 | 1 | 1 | 1 | 0 | 0 | 0 | 0 |
| 1101 | 0 | 1 | 0 | 1 | 1 | 0 | 1 | 0 | 1 | 0 | 1 | 0 | 0 | 1 | 0 | 1 |
| 1110 | 0 | 0 | 1 | 1 | 1 | 1 | 0 | 0 | 1 | 1 | 0 | 0 | 0 | 0 | 1 | 1 |
| 1111 | 0 | 1 | 1 | 0 | 1 | 0 | 0 | 1 | 1 | 0 | 0 | 1 | 0 | 1 | 1 | 0 |

Referring to Table 4, every (16,4) codeword is a linear combination of the 4 bold basis codewords of length 16. In order to obtain the (7,2) code, only the upper 2 basis codewords among the 4 basis codewords are used. Then, the remaining lower 12 codewords are automatically unused. Therefore, only the upper 4 codewords are used. Besides, in order to generate a basis codeword of length 7 among the 4 codewords of length 16, it is necessary to puncture 9 symbols. It is possible to obtain the (7,2) simplex codewords of Table 3 by puncturing the symbols indicated by (*) in Table 4 and then collecting the remaining 7 coded symbols.

Herein, a description will be made of a structure of an encoder for creating {(4,1) optimal code and (28,9) optimal code} used for the information bit ratio of 1:9, a structure of an encoder for creating {(7,2) optimal code and (25,8) optimal code} used for the information bit ratio of 2:8, a structure of an encoder for creating {(10,3) optimal code and (22,7) optimal code} used for the information bit ratio of 3:7, a structure of an encoder for creating {(13,4) optimal code and (19,6) optimal code} used for the information bit ratio of 4:6, and a structure of an encoder for creating a (16,5) optimal code and a (32,10) optimal code used for the information bit ratio of 5:5, by shortening a (32,10) sub-code of the second order Reed-Muller code. In addition, a structure of a decoder corresponding to the encoder will also be described herein below.

A 1. Structure and Operation of Transmitter

An embodiment of the present invention provides an apparatus and method for dividing 10 information bits in a ratio of 1:9, 2:8, 3:7, 4:6, 5:5, 6:4, 7:3, 8:2 or 9:1 before coding in the hard split mode, as done in the logical split mode where the ratio of the input information bits is 5:5. In addition, it will be assumed herein that the coding rate of the first TFCI transmitting the TFCI for the DSCH and the coding rate of the second TFCI transmitting the TFCI for the DCH are both increased before being transmitted. That is, if the ratio of the DCH information bits to the DSCH information bits is 1:9, a (4,1) code and a (28,9) code are used. If the ratio of the DCH information bits to the DSCH information bits is 2:8, a (7,2) code and a (25,8) code are used. If the ratio of the DCH information bits to the DSCH information bits is 3:7, a (10,3) code and a (22,7) code are used. If the ratio of the DCH information bits to the DSCH information bits is 4:6, a (13,4) code and a (19,6) code are used. If the ratio of the DCH information bits to the DSCH information bits is 6:4, a (19,6) code and a (13,4) code are used. If the ratio of the DCH information bits to the DSCH information bits is 7:3, a (22,7) code and a (10,3) code are used. If the ratio of the DCH information bits to the DSCH information bits is 8:2, a (25,8) code and a (7,2) code are used. If the ratio of the DCH information bits to the DSCH information bits is 9:1, a (28,9) code and a (4,1) code are used.

Figure 4:
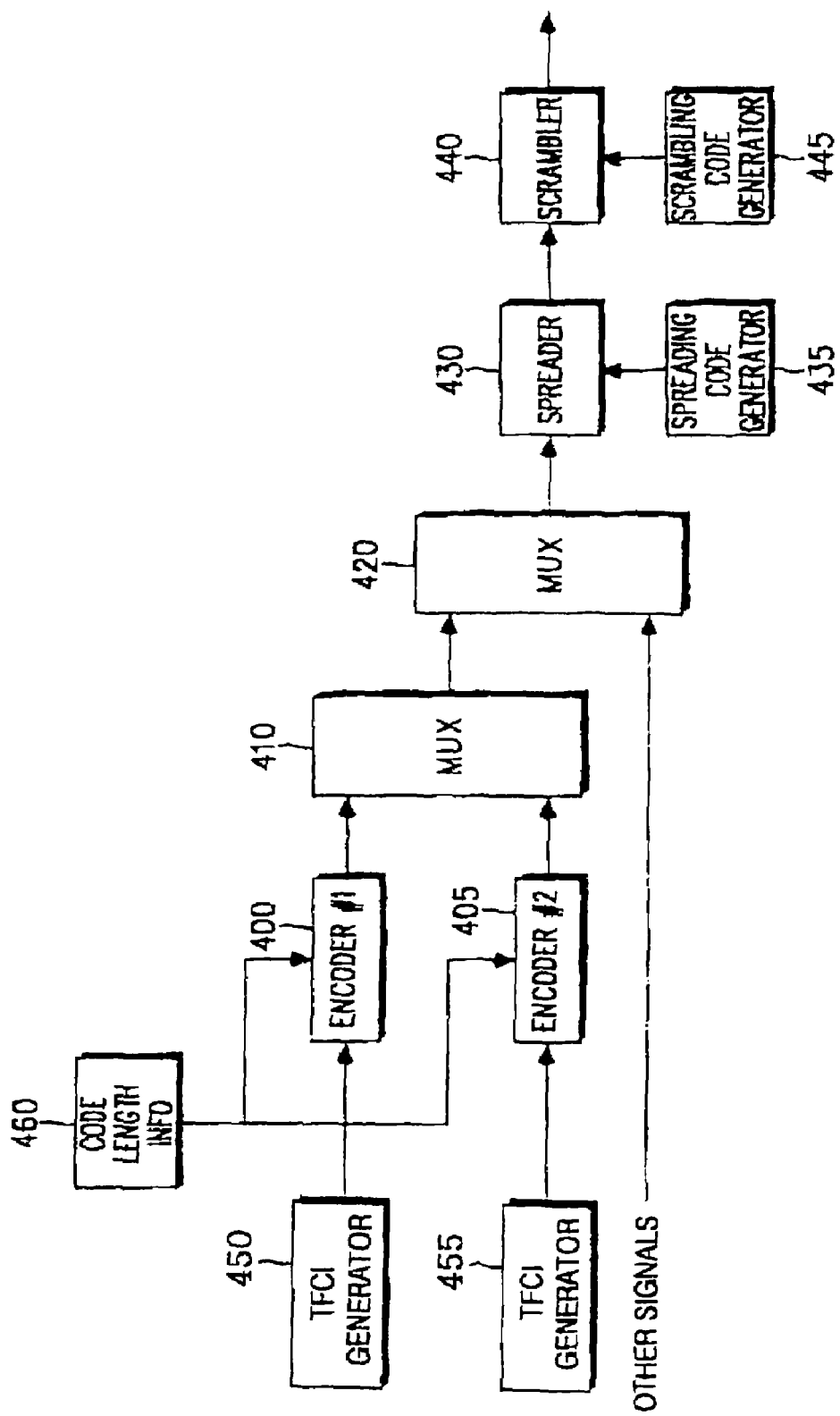
FIG. 4 illustrates a structure of a transmitter in a mobile communication system according to an embodiment of the present invention.

FIG. 4 illustrates a structure of a transmitter according to an embodiment of the present invention. Referring to FIG. 4, TFCI bits for the DSCH and TFCI bits for the DCH, divided according to the information bit ratio, are provided to first and second encoders 400 and 405, respectively. Here, the TFCI bits for the DSCH are referred to as TFCI(field 1) or first TFCI bits, while the TFCI bits for the DCH are referred to as TFCI(field 2) or second TFCI bits. The TFCI bits for the DSCH are generated from a first TFCI bit generator 450, and the TFCI bits for the DCH are generated from a second TFCI bit generator 455. The first and second TFCI bits have the different ratios stated above, according to their information bit ratio. In addition, a control signal indicating code length information, i.e., information on a length value of the codeword set according to the information bit ratio, is provided to the first and second encoders 400 and 405. The code length information is generated from a code length information generator 460, and has a value variable according to lengths of the first TFCI bits and the second TFCI bits.

When the information bit ratio is 6:4, the encoder 400 receives the 6-bit TFCI for the DSCH and outputs 19 coded symbols in response to a control signal for allowing the encoder 400 to operate as an (19,6) encoder, while the encoder 405 receives the 4-bit TFCI for the DCH and outputs 13 coded symbols in response to a control signal for allowing the encoder 405 to operate as a (13,4) encoder. When the information bit ratio is 7:3, the encoder 400 receives the 7-bit TFCI for the DSCH and outputs 22 coded symbols in response to a control signal for allowing the encoder 400 to operate as a (22,7) encoder, while the encoder 405 receives the 3-bit TFCI for the DCH and outputs 10 coded symbols in response to a control signal for allowing the encoder 405 to operate as a (10,3) encoder. When the information bit ratio is 8:2, the encoder 400 receives the 8-bit TFCI for the DSCH and outputs 25 coded symbols in response to a control signal for allowing the encoder 400 to operate as a (25,8) encoder, while the encoder 405 receives the 2-bit TFCI for the DCH and outputs 5 coded symbols in response to a control signal for allowing the encoder 405 to operate as a (7,2) encoder. When the information bit ratio is 9:1, the encoder 400 receives the 9-bit TFCI for the DSCH and outputs 28 coded symbols in response to a control signal for allowing the encoder 400 to operate as a (28,9) encoder, while the encoder 405 receives the 1-bit TFCI for the DCH and outputs 4 coded symbols in response to a control signal for allowing the encoder 405 to operate as a (4,1) encoder.

Figure 5:
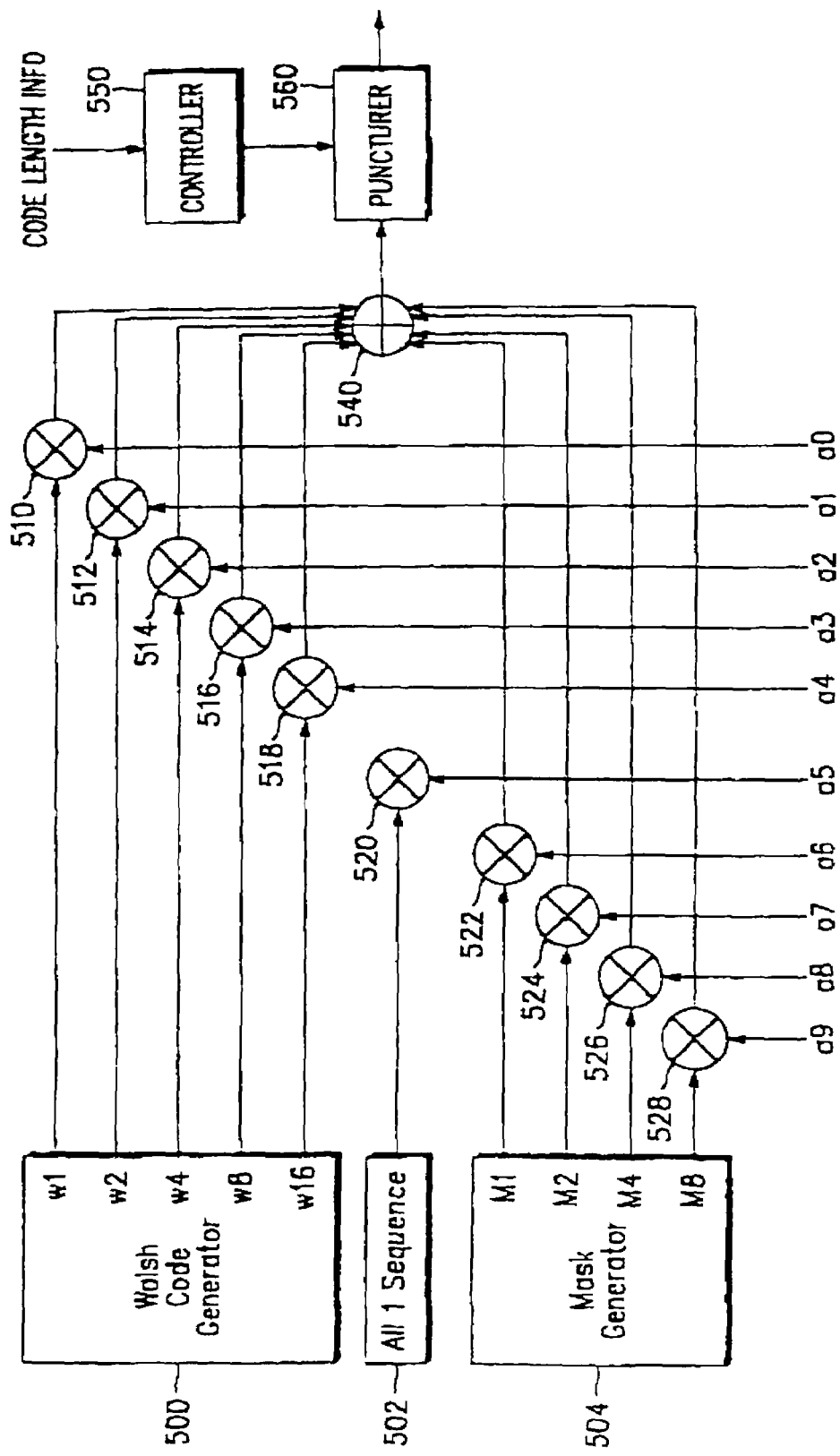
FIG. 5 illustrates a detailed structure of the encoder illustrated in FIG. 4.

FIG. 5 illustrates a detailed structure of the encoders 400 and 405. In FIG. 4, there are provided separate encoders for the first TFCI and the second TFCI. However, when the first TFCI codewords and the second TFCI codewords are generated with a time delay, generating the first and second TFCI codewords can be realized with a single encoder. An operation of the encoders according to an embodiment of the present invention will be described in detail with reference to FIG. 5.

1) Information Bit Ratio of $1^{st}$ TFCI to $2^{nd}$ TFCI is 1:9

For the information bit ratio of 1:9, the encoder 400 serves as a (4,1) encoder, while the encoder 405 serves as a (28,9) encoder. Operations of the (4,1) encoder and the (28,9) encoder will be separately described below with reference to FIG. 5.

First, an operation of the (4,1) encoder will be described with reference to FIG. 5. Referring to FIG. 5, one input bit a0 is normally provided to the encoder, and the remaining input bits a1, a2, a3, a4, a5, a6, a7, a8 and a9 are all filled with '0'. The input bit a0 is applied to a multiplier 510, the input bit a1 to a multiplier 512, the input bit a2 to a multiplier 514, the input bit a3 to a multiplier 516, the input bit a4 to a multiplier 518, the input bit a5 to a multiplier 520, the input bit a6 to a multiplier 522, the input bit a7 to a multiplier 524, the input bit a8 to a multiplier 526, and the input bit a9 to a multiplier 528. At the same time, a Walsh code generator 500 generates a basis codeword W1=10101010101010110101010101010100, and provides the generated basis codeword W1 to the multiplier 510. The multiplier 510 then multiplies the input bit a0 by the basis codeword W1 in a symbol unit, and provides its output to an exclusive OR (XOR) operator 540. Further, the Walsh code generator 500 generates other basis codewords W2, W4, W8 and W16, and provides them to the multiplier 512, 514, 516 and 518, respectively. An all-1's code generator 502 generates an all-1's basis codeword (or all-1's sequence) and provides the generated all-1's basis codeword to the multiplier 520. A mask generator 504 generates basis codewords M1, M2, M4 and M8, and provides the generated basis codewords M1, M2, M4 and M8 to the multipliers 522, 524, 526 and 528, respectively. However, since the input bits a1, a2, a3, a4, a5, a6, a7, a8 and a9 applied to the multipliers 512, 514, 516, 518, 520, 522, 524, 526 and 528 are all 0's, the multipliers 512, 514, 516, 518, 520, 522, 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to the output value of the multiplier 510. The 32 symbols output from the exclusive OR operator 540 are provided to a puncturer 560. At this moment, a controller 550 receives code length information and provides the puncturer 560 with a control signal indicating puncturing positions based on the code length information. The puncturer 560 then punctures $1^{st}$, $3^{rd}$, $5^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 28 symbols among the 32 coded symbols, and thus outputs 4 non-punctured coded symbols.

Next, an operation of the (28,9) encoder will be described with reference to FIG. 5. Referring to FIG. 5, nine input bits a0, a1, a2, a3, a4, a5, a6, a7 and a8 are normally provided to the encoder, and the remaining input bit a9 is filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. The mask generator 504 provides the multiplier 522 with the basis codeword M1=0101 0000 1100 0111 1100 0001 1101 1101, the multiplier 524 with the basis codeword M2=0000 0011 1001 1011 1011 0111 0001 1100, and the multiplier 526 with the basis codeword M4=0001 0101 1111 00100110 1100 1010 1100. Then, the multiplier 522 multiplies the basis codeword M1 by the input bit a6 in the symbol unit and provides its output to the exclusive OR operator 540, the multiplier 524 multiplies the basis codeword M2 by the input bit a7 in the symbol unit and provides its output to the exclusive OR operator 540, and the multiplier 526 multiplies the basis codeword M4 by the input bit a8 in the symbol unit and provides its output to the exclusive OR operator 540. Further, the mask generator 504 generates the basis codeword M8, and provides the generated basis codeword M8 to the multiplier 528. However, since the input bit a9 applied to the multiplier 528 is 0, the multiplier 528 outputs 0 to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512, 514, 516, 518, 520, 522, 524 and 526. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $6^{th}$, $10^{th}$, $11^{th}$ and $30^{th}$ coded symbols among a total of 32 coded symbols of $0^{th}$ to $31^{st}$ symbols according to the control signal output from the controller 550. In other words, the puncturer 560 punctures 4 symbols among the 32 coded symbols, and thus outputs 28 non-punctured coded symbols.

2) Information Bit Ratio of $1^{st}$ TFCI to $2^{nd}$ TFCI is 2:8

For the information bit ratio of 2:8, the encoder 400 serves as a (7,2) encoder, while the encoder 405 serves as a (25,8) encoder. Operations of the encoder (7,2) and the encoder (25,8) will be separately described herein below with reference to FIG. 5.

First, an operation of the encoder (7,2) will be described with reference to FIG. 5. Referring to FIG. 5, two input bits a0 and a1 are normally provided to the encoder 400, and the remaining input bits a2, a3, a4, a5, a6, a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, and the multiplier 512 with the basis codeword W2=01100110011001101100110011001100. The multiplier 510 multiplies the basis codeword W1 by the input bit in the symbol unit and provides its output to the exclusive OR operator 540, and the multiplier 512 multiplies the basis codeword W2 by the input bit a1 in the symbol unit and provides its output to the exclusive OR operator 540. Further, the Walsh code generator 500 generates other basis codewords W4, W8 and W16, and provides them to the multipliers 514, 516 and 518, respectively. The all-1's code generator 502 generates an all-1's basis codeword and provides the generated all-1's basis codeword to the multiplier 520. The mask generator 504 generates the basis codewords M1, M2, M4 and M8, and provides the generated basis codewords M1, M2, M4 and M8 to the multipliers 522, 524, 526 and 528, respectively. However, since the input bits a2, a3, a4, a5, a6, a7, a8 and a9 applied to the multipliers 514, 516, 518, 520, 522, 524, 526 and 528 are all 0's, the multipliers 514, 516, 518, 520, 522, 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510 and 512. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $3^{rd}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$ and $31^{st}$ coded symbols among a total of 32 coded symbols of $0^{th}$ to $31^{st}$ symbols according to the control signal output from the controller 550. In other words, the puncturer 560 punctures 25 symbols among the 32 coded symbols, and thus outputs 7 non-punctured coded symbols.

Next, an operation of the (25,8) encoder will be described with reference to FIG. 5. Referring to FIG. 5, eight input a0, a1, a2, a3, a4, a5, a6 and a7 bits are normally provided to the encoder, and the remaining input bits a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100001111000011110 0, the multiplier 516 with the basis codeword W8=00000001111111100000001111111100, and the multiplier 518 with the basis codeword W16=00000000000000001111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540.

Further, the mask generator 504 provides the multiplier 522 with the basis codeword M1=0101 0000 1100 0111 1100 0001 1101 1101, and the multiplier 524 with the basis codeword M2=0000 0011 1001 1011 1011 0111 0001 1100. The multiplier 522 then multiplies the basis codeword M1 by the input bit a6 in the symbol unit and provides its output to the exclusive OR operator 540, and the multiplier 524 multiplies the basis codeword M2 by the input bit a7 in the symbol unit and provides its output to the exclusive OR operator 540. Further, the mask generator 504 generates the basis codewords M4 and M8, and provides the generated basis codewords M4 and M8 to the multipliers 526 and 528, respectively. However, since the input bits a8 and a9 applied to the multipliers 526 and 528 are all 0's, the multipliers 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512, 514, 516, 518, 520, 522 and 524. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $4^{th}$, $11^{th}$, $14^{th}$, $15^{th}$, $20^{th}$, $21^{st}$, and $22^{nd}$ coded symbols among a total of 32 coded symbols of $0^{th}$ to $31^{st}$ symbols according to the control signal output from the controller 550. In other words, the puncturer 560 punctures 7 symbols among the 32 coded symbols, and thus outputs 25 non-punctured coded symbols.

3) Information Bit Ratio of $1^{st}$ TFCI to $2^{nd}$ TFCI is 3:7

For the information bit ratio of 3:7, the encoder 400 serves as a (10,3) encoder, while the encoder 405 serves as a (22,7) encoder. Operations of the (10,3) encoder and the (22,7) encoder will be separately described below with reference to FIG. 5.

First, an operation of the (10,3) encoder will be described with reference to FIG. 5. Referring to FIG. 5, three input bits a0, a1 and a2 are normally provided to the encoder, and the remaining input bits a3, a4, a5, a6, a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis code word W2=01100110011001101100110011001100, and the multiplier 514 with the basis codeword W4=00011110000111100001111000011110 0. The multiplier 510 then multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, and the multiplier 514 multiplies the basis codeword W4 by the input bit a2 in the symbol unit and provides its output to the exclusive OR operator 540. Further, the Walsh code generator 500 generates other basis codewords W8 and W16, and provides them to the multipliers 516 and 518, respectively. The all-1's code generator 502 generates an all-1's basis codeword and provides the generated all-1's basis codeword to the multiplier 520. The mask generator 504 generates the basis codewords M1, M2, M4 and M8, and provides the generated basis codewords M1, M2, M4 and M8 to the multipliers 522, 524, 526 and 528, respectively. However, since the input bits a3, a4, a5, a6, a7, a8 and a9 applied to the multipliers 516, 518, 520, 522, 524, 526 and 528 are all 0's, the multipliers 516, 518, 520, 522, 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512 and 514. The 32 symbols Output from the exclusive OR operator 540 are provided to the puncturer 560. At this moment, the controller 550 receives code length information and provides the puncturer 560 with a control signal indicating puncturing positions based oil the code length information. The puncturer 560 then punctures $7^{th}$, $10^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 22 symbols among the 32 coded symbols, and thus outputs 10 non-punctured coded symbols.

Next, an operation of the (22,7) encoder will be described with reference to FIG. 5. Referring to FIG. 5, seven input bits a0, a1, a2, a3, a4, a5 and a6 are normally provided to the encoder, and the remaining input bits a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its Output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. Further, the mask generator 504 provides the multiplier 522 with the basis codeword M1=0101 0000 1100 0111 1100 0001 1101 1101. The multiplier 522 then multiplies the basis codeword M1 by the input bit a6 in the symbol unit and provides its output to the exclusive OR operator 540. Further, the mask generator 504 generates the other basis codewords M2, M4 and M8, and provides the generated basis codewords M2, M4 and M8 to the multipliers 524, 526 and 528, respectively.

However, since the input bits a7, a8 and a9 applied to the multipliers 524, 526 and 528 are all 0's, the multipliers 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512, 514, 516, 518, 520 and 522. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $8^{th}$, $12^{th}$, $16^{th}$, $18^{th}$, $19^{th}$, $23^{rd}$, $26^{th}$, $27^{th}$, $30^{th}$ and $31^{st}$ coded symbols among a total of 32 coded symbols of $0^{th}$ to $31^{st}$ symbols according to the control signal output from the controller 550. In other words, the puncturer 560 punctures 10 symbols among the 32 coded symbols, and thus outputs 22 non-punctured coded symbols.

4) Information Bit Ratio of $1^{st}$ TFCI to $2^{nd}$ TFCI is 4:6

For the information bit ratio of 4:6, the encoder 400 serves as a (13,4) encoder, while the encoder 405 serves as a (19,6) encoder. Operations of the (13,4) encoder and the (19,6) encoder will be separately described below with reference to FIG. 5.

First, an operation of the (13,4) encoder will be described with reference to FIG. 5. Referring to FIG. 5, four input bits a0, a1, a2 and a3 are normally provided to the encoder, and the remaining input bits a4, a5, a6, a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, and the multiplier 516 with the basis codeword W8=000000011111111000000001111111100. The multiplier 510 then multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, and the multiplier 516 multiplies the basis codeword W8 by the input bit a3 in the symbol unit and provides its output to the exclusive OR operator 540. Further, the Walsh code generator 500 generates the other basis codeword W16, and provides it to the multiplier 518. The all-1's code generator 502 generates an all-1's basis codeword and provides the generated all-1's basis codeword to the multiplier 520. The mask generator 504 generates the other basis codewords M1, M2, M4 and M8, and provides the generated basis codewords M1, M2, M4 and M8 to the multipliers 522, 524, 526 and 528, respectively. However, since the input bits a4, a5, a6, a7, a8 and a9 applied to the multipliers 518, 520, 522, 524, 526 and 528 are all 0's, the multipliers 518, 520, 522, 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512, 514 and 516. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $0^{th}$, $1^{st}$, $2^{nd}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 19 symbols among the 32 coded symbols, and thus outputs 13 non-punctured coded symbols.

Next, an operation of the (19,6) encoder will be described with reference to FIG. 5. Referring to FIG. 5, six input bits a0, a1, a2, a3, a4 and a5 are normally provided to the encoder, and the remaining input bits a6, a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000001111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. Further, the mask generator 504 generates the basis codewords M1, M2, M4 and M8, and provides the generated basis codewords M1, M2, M4 and M8 to the multipliers 522, 524, 526 and 528, respectively. However, since the input bits a6, a7, a8 and a9 applied to the multipliers 522, 524, 526 and 528 are all 0's, the multipliers 522, 524, 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510, 512, 514, 516, 518 and 520. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $6^{th}$, $10^{th}$, $11^{th}$, $13^{th}$, $14^{th}$, $16^{th}$, $17^{th}$, $19^{th}$, $20^{th}$, $22^{nd}$, $24^{th}$, $26^{th}$ and $31^{st}$ coded symbols among a total of 32 coded symbols of $0^{th}$ to $31^{st}$ symbols according to the control signal output from the controller 550. In other words, the puncturer 560 punctures 13 symbols among the 32 coded symbols, and thus outputs 19 non-punctured coded symbols.

Although the operation of the encoders 400 and 405 has been described for the information bit ratios of 9:1, 8:2, 7:3 and 6:4, it would be obvious to those skilled in the art that the operation of the encoders 400 and 405 are similarly performed for the other information bit ratios of 5:5, 4:6, 3:7, 2:8 and 1:9.

After the above operations, the coded symbols output from the encoders 400 and 405 are time-multiplexed by a multiplexer 410, generating a multiplexed 32-symbol signal.

Next, a description will be made of a multiplexing operation of the multiplexer 410. The multiplexer 410 multiplexes the coded symbols output from the encoders 400 and 405 such that the coded symbols are arranged as uniformly as possible in one radio frame. That is, the multiplexer 410 maps the information bits $a_k$ to the coded bits $b_l$ bits, defined in the description of the prior art. The $b_l$ bits are mapped to the $d_m$ bits before being transmitted over the actual radio frame for the respective cases of conditions A1, A2, A3 and A4. In conditions A2, A3, and A4, all of 32 $b_l$ bits are transmitted. However, in condition A1, the bits $d_{30}(b_{30})$ and $d_{31}(b_{31})$ are not transmitted, so the encoder operating in the above various coding rates should map the last coded symbol to the bit $d_{30}(b_{30})$ or $d_{31}(b_{31})$. When using the (32,10) code, the encoder should map the last coded symbols to the bits $d_{30}(b_{30})$ and $d_{31}(b_{31})$.

When the second TFCI encoder is used in condition A1, all of the 10 available encoders have an actual coding rate of ⅓. However, the 10 encoders proposed by the invention, though they have the coding rate ⅓, are designed to have optimal performance at the coding rate ⅓.

Before a description of the method of mapping the information bits $a_k$ to the coded bits $b_l$, it will be assumed that the sum of m TFCI bits for the DCH (i.e., first TFCI bits) and n TFCI bits for the DSCH (i.e., second TFCI bits) becomes m+n=10. In addition, as stated above, the last coded symbols of the respective encoders are mapped to the bits $d_{30}(b_{30})$ and $d_{31}(b_{31})$. The present invention will be described for the m:n ratios of 1:9, 2:8, 3:7, 4:6, 5:5, 6:4, 7:3, 8:2, and 9:1. The (32,10) encoder sequentially arranges the coded symbols.

First, a description will be made of a case where the m value is larger than the n value. Even when the n value is larger than the m value, it is possible to arrange the TFCI coded symbols for the DCH and the TFCI coded symbols for the DSCH in the following manner by exchanging the n value and the m value.

In the coding method described herein above, the numbers of coded bits created by coding the m TFCI bits for the DCH and the n TFCI bits for the DSCH are (m*3+1) and (n*3+1), respectively. Therefore, in order to select the positions for transmitting the created coded symbols, the conditions A1, A2, A3, and A4 use different methods. In the case of A1, the last coded symbols of the second TFCI encoder are mapped to $d_{30}(b_{30})$ and $d_{31}(b_{31})$, 30 $b_l$ bits are divided by 10, and then m coded symbols determined by dividing the m*3 coded symbols for the first TFCI encoder excepting the last coded symbol into 3 equal parts and n coded symbols determined by dividing the n*3 coded symbols for the second TFCI encoder excepting the last coded symbol into 3 equal parts are arranged. In condition A2, the 32 $b_l$ bits arranged in condition A1 are sequentially repeated 3 times, and then repeated once more from $b_0$ to $b_{23}$ thus to map them to a total of 120 $d_m$ bits. In condition A3, the 32 $b_l$ bits arranged in condition A1 are mapped to the $d_m$ bits during transmission. In condition A4, the 32 $b_l$ bits arranged in condition A1 are repeated 4 times and mapped to 128 $d_m$ bit positions during transmission. Therefore, in condition A1, the present invention provides a method of mapping the coded symbols to the $b_l$ bits. In conditions A2, A3, and A4, the invention provides a method of mapping the coded symbols using the $b_l$ bits arranged in condition A1.

A description will be made of a method for arranging the m coded symbols for the DCH and the n coded symbols for the DSCH to 10 coded symbol positions.

Let L indicate an $L^{th}$ coded symbol of the 10 coded symbols.

$$F(k) = \left\lfloor \frac{m}{n} * k \right\rfloor, k = 0, 1, 2, \ldots, n \quad (1)$$

$$G(k) = \left\lceil \frac{F(k) - F(k-1)}{2} \right\rceil, k = 0, 1, 2, \ldots, n \quad (2)$$

In Equations (1) and (2), $\lfloor x \rfloor$ indicates a maximum value among the integers smaller than or equal to a given value x, and $\lceil x \rceil$ indicates a minimum value among the integers larger than or equal to the given value x.

In Equation (2), F(−1) is defined as zero (0). That is, F(−1)=0. A method for arranging the m bits for the DCH and the n bits for the DSCH using the above formulas is defined by Equation (3). The bits for the DSCH are sequentially arranged to n L values among the 10 L values.

$$L = F(l-1) + G(l) + l \quad (3)$$

In Equation (3), l (1≦l≦n) indicates an $l^{th}$ bit among the n bits for the DSCH. Therefore, Equation (3) is used in calculating a value corresponding to the $l^{th}$ position among the 10 bits for the DSCH.

The m bits for the DCH are arranged to L values other than the values given by Equation (3) among the 10 L values. This is defined by Equation (4).

$$F(l-2) + G(l-1) + l \leq L \leq F(l-1) + G(l) + l - 1 \quad (4)$$

Table 5 below illustrates F(k) and G(k) for the respective cases of m:n=9:1, 8:2, 7:3, 6:4 and 5:5. In Table 5, coded symbol positions of the DSCH have a value (l−1) at $b_l$. In condition A1, the present invention maps two $b_l$ bits to two $d_m$ bits before transmission over one time slot. The positions defined in Table 5 are repeated 3 times at the $b_l$ bits divided by 10, and after the repetition, the last coded symbol of the first TFCI encoder and the last coded symbol of the second TFCI encoder are mapped to the last two bits $b_{30}$ and $b_{31}$.

TABLE 5

| | F(k) | | | | |
|---|---|---|---|---|---|
| | F(1) | F(2) | F(3) | F(4) | F(5) |
| | | | G(k) | | |
| | G(1) | G(2) | G(3) | G(4) | G(5) |
| m:n | | | DSCH Position | | |
| 5:5 | 1 | 2 | 3 | 4 | 5 |
| | 1 | 1 | 1 | 1 | 1 |
| | 2 | 4 | 6 | 8 | 10 |

TABLE 5-continued

| | F(k) | | | | |
|---|---|---|---|---|---|
| | F(1) | F(2) | F(3) | F(4) | F(5) |
| | | | G(k) | | |
| | G(1) | G(2) | G(3) | G(4) | G(5) |
| m:n | | | DSCH Position | | |
| 6:4 | 1 | 3 | 4 | 6 | |
| | 1 | 1 | 1 | 1 | |
| | 2 | 4 | 7 | 9 | |
| 7:3 | 2 | 4 | 7 | | |
| | 1 | 1 | 1 | | |
| | 2 | 5 | 8 | | |
| 8:2 | 4 | 8 | | | |
| | 2 | 2 | | | |
| | 3 | 8 | | | |
| 9:1 | 9 | | | | |
| | 4 | | | | |
| | 5 | | | | |

Figure 6:
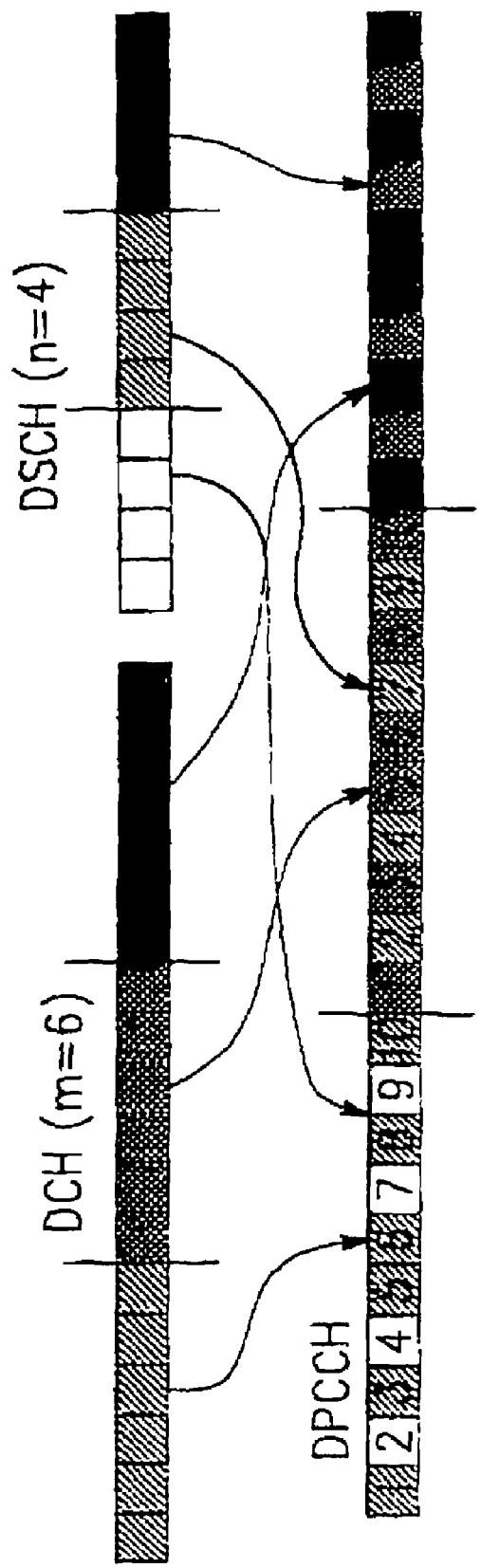
FIG. 6 illustrates a method for multiplexing coded symbols encoded using different coding techniques.

FIG. 6 is a diagram illustrating how to match 18 TFCI coded symbols for the DCH and 12 TFCI coded symbols for the DSCH to a 30-bit TFCI field of the DPCCH, for m:n=6:4, in the case of condition A1. As illustrated in Table 5, for m:n=6:4, the positions of the DSCH correspond to the case where the L values are 2, 4, 7 and 9. That is, $d_1(b_1)$, $d_3(b_3)$, $d_6(b_6)$, $d_8(b_8)$, $d_{11}(b_{11})$, $d_{13}(b_{13})$, $d_{16}(b_{16})$, $d_{18}(b_{18})$, $d_{21}(b_{21})$, $d_{23}(b_{23})$, $d_{26}(b_{26})$ and $d_{28}(b_{28})$ are transmitted.

The multiplexed TFCI coded symbols are then applied to a multiplexer 420 of FIG. 4, where they are time-multiplexed with transport power control (TPC) bits, pilot bits and physical information.

Figure 7:
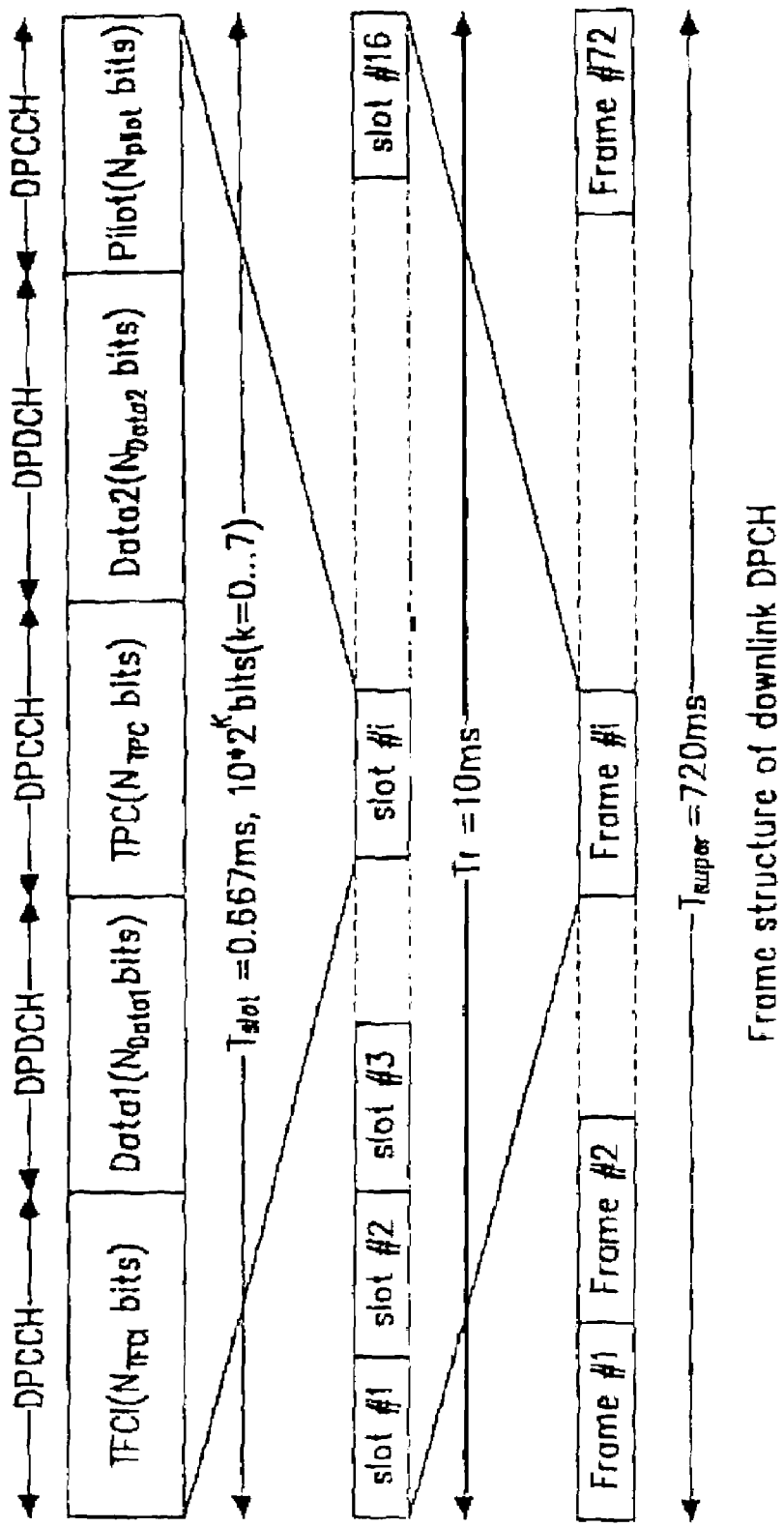
FIG. 7 illustrates a signal transport format of a downlink DCH according to an embodiment of the present invention.

FIG. 7 illustrates a frame structure of the DPCCH transmitted from the Node B to the UE, in which the top part illustrates a structure of a time slot, the intermediate part illustrates a structure of a radio frame, and the bottom part illustrates a structure of the consecutively transmitted radio frames. The multiplexed DPCCH is multiplexed with the DPDCH into DPCH on a time-division basis as illustrated in FIG. 7. A spreader 430 channel-spreads the multiplexed symbols with a spreading code provided from a spreading code generator 435 in a symbol unit for channelization, and outputs the channel-spread signals in a chip unit. A scrambler 440 scrambles the channel-spread signals with a scrambling code provided from a scrambling code generator 445.

A2. Structure and Operation of Receiver

A description will now be made of a receiver corresponding to the transmitter that performs encoding at a variable coding rate in transmitting TFCI bits for the DSCH and TFCI bits for the DCH in a specific ratio. The receiver includes a decoder for decoding received symbols encoded at the variable coding rate.

Figure 8:
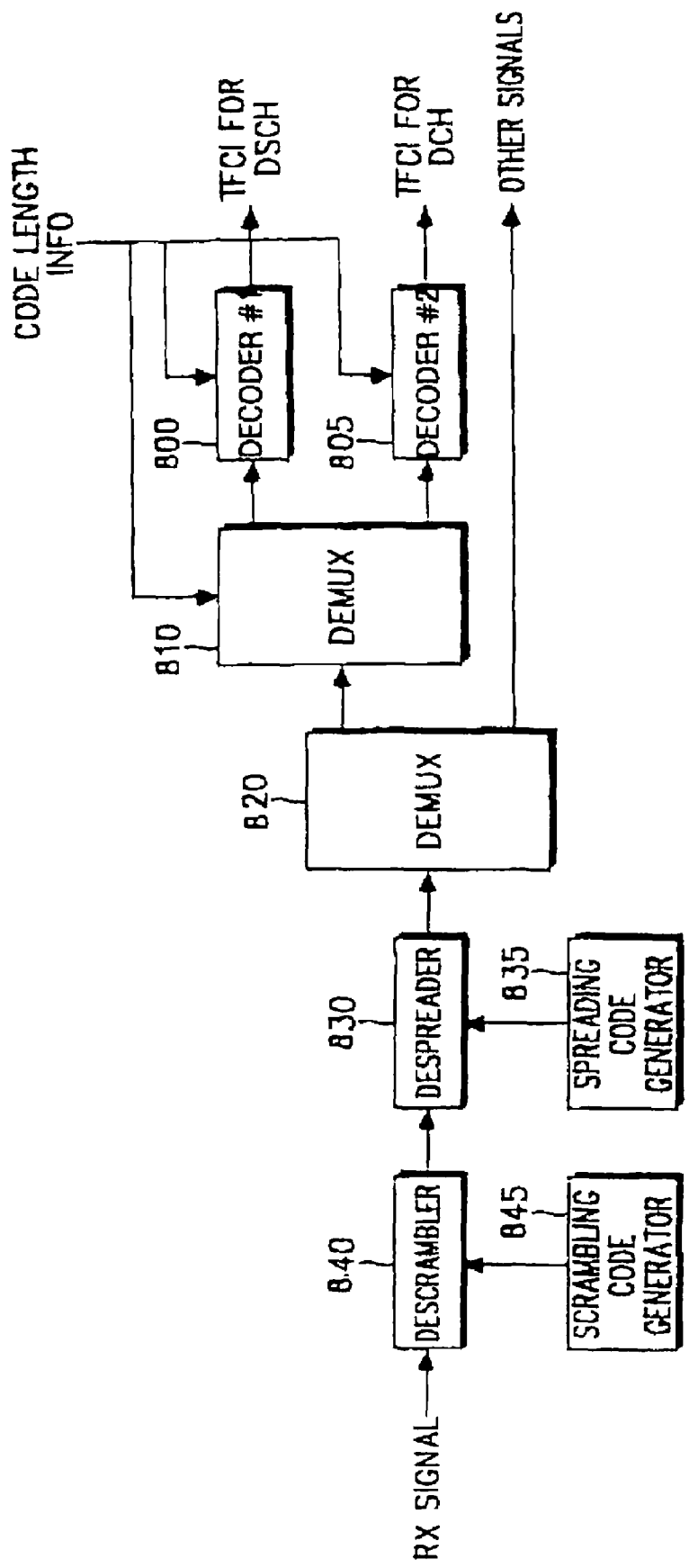
FIG. 8 illustrates a structure of a receiver in a mobile communication system according to an embodiment of the present invention.

FIG. 8 illustrates a structure of a receiver, corresponding to the transmitter illustrated in FIG. 4, according to an embodiment of the present invention. Referring to FIG. 8, a downlink DPCH transmitted from the Node B to the UE is descrambled by a descrambler 840 with a scrambling code provided from a scrambling code generator 845. The descrambled downlink DPCH is despread by a despreader 830 with a spreading code provided from a despreading code generator 835 in a symbol unit. The despread DPCH symbols are demultiplexed by a demultiplexer 820 into DPDCH, TPC bits, pilot bits and TFCI coded symbols. The TFCI coded symbols are demultiplexed again by a demultiplexer 810 into coded TFCI symbols for the DSCH and coded TFCI symbols for the DCH depending on code length control information, based on an information bit ratio of the TFCI bits for the DSCH to the TFCI bits for the DCH, and then, provided to associated decoders 800 and 805, respectively. The decoders 800 and 805 decode the coded TFCI symbols for the DSCH and the coded TFCI symbols for the DCH, respectively, depending on the code length control information based on the information bit ratio of the TFCI bits for the DSCH to the TFCI bits for the DCH, and then, output the TFCI bits for the DSCH and the TFCI bits for the DCH, respectively.

A structure and operation of a decoder according to several embodiments of the present invention will be described herein below. The decoders 800 and 805 illustrated in FIG. 8 should be structured to decode the TFCI coded symbols for the DSCH and the TFCI coded symbols for DCH, encoded at the various coding rates.

First Embodiment

Decoder

Figure 9:
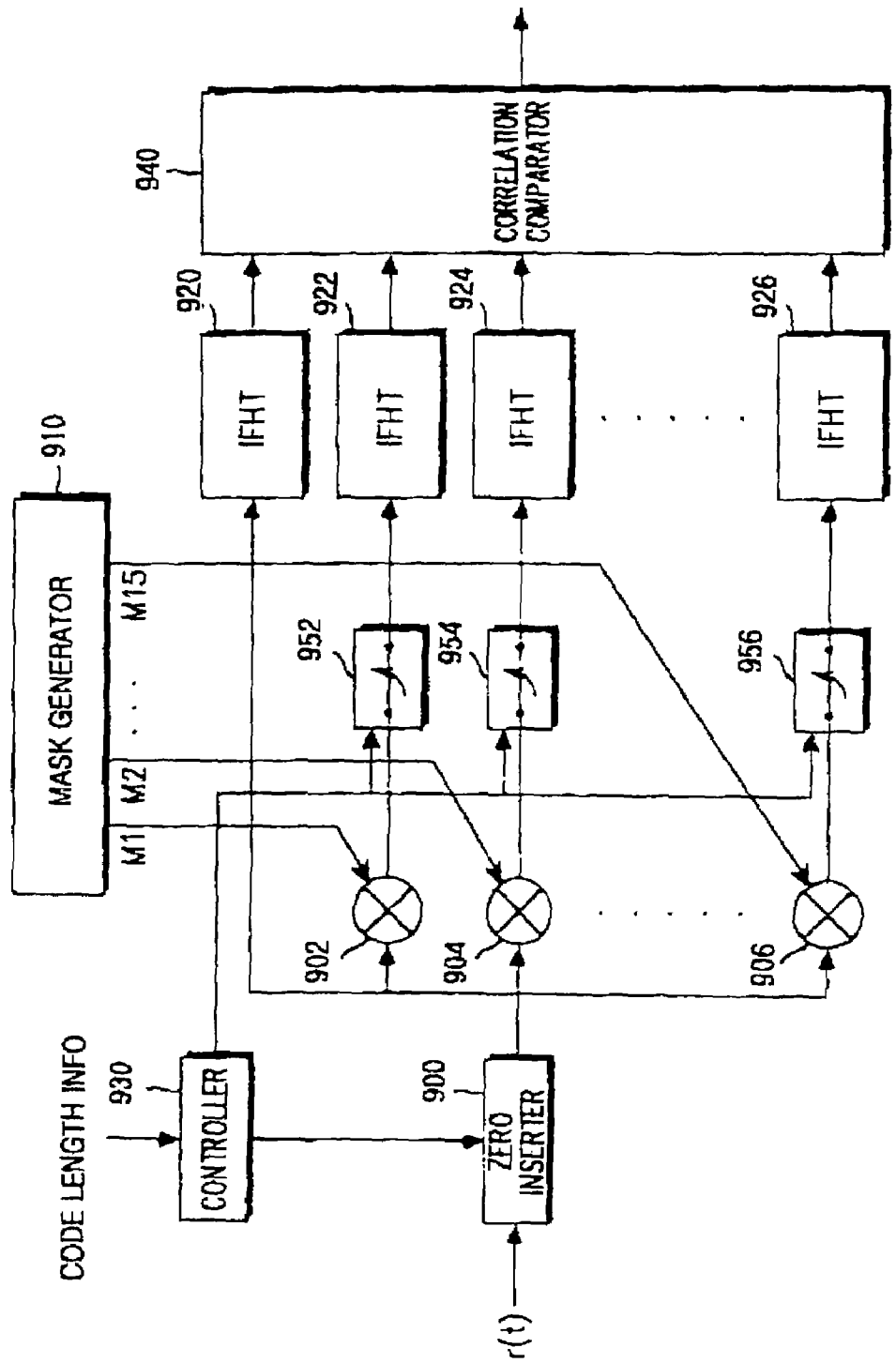
FIG. 9 illustrates a detailed structure of the decoder illustrated in FIG. 8.

FIG. 9 illustrates a detailed structure of the decoders 800 and 805 illustrated in FIG. 8. Referring to FIG. 9, received symbols r(t) are provided to the zero inserter 900, and at the same time, code length information is provided to the controller 930. The controller 930 determines puncturing positions based on the code length information, and provides control information for the determined puncturing positions to the zero inserter 900. The code length information indicates the code length or the coding rate used in the encoder, while the control information indicates the puncturing positions. The puncturing positions represent the positions of the symbols pruned to obtain a desired coded symbol length corresponding to the bits received from the encoder. Table 6 illustrates the puncturing positions stored in association with the code lengths.

TABLE 6

| Code Length Info (Coding Rate) | Puncturing Position |
|---|---|
| (4,1) | F_28 |
| (7,2) | F_25 |
| (10,3) | F_22 |
| (13,4) | F_19 |
| (16,5) | F_16 |
| (19,6) | F_13 |
| (22,7) | F_10 |
| (25,8) | F_7 |
| (28,9) | F_4 |

It is assumed in Table 6 that the code length information indicates the coding rate used in the encoder. As a coding rate (k,n) indicates that n input bits are coded into k symbols, the received symbols have a coding length k. Further, F_n of Table 6 represents n puncturing positions. As can be determined from Table 6, the control information (puncturing position) enables the zero inserter 900 to maintain the number (32) of output symbols regardless of the code length of the received symbols.

Referring to Table 6, the controller 930 outputs information on 28 puncturing positions for a coding rate (4,1), information on 25 puncturing positions for a coding rate (7,2), information on 22 puncturing positions for a coding rate (10,3), information on 19 puncturing positions for a coding rate (13,4), information on 13 puncturing positions for a coding rate (19,6), information on 10 puncturing positions for a coding rate (22,7), information on 7 puncturing positions for a coding rate (25,8), and information on 4 puncturing positions for a coding rate (28,9). For the respective cases, the puncturing positions are the same as given in the description of the encoders.

The zero inserter 900 inserts 0's in the puncturing positions of the received symbols according to the control information, and then, outputs a symbol stream of length 32. The symbol stream is provided to an inverse fast Hadamard transformer (IFHT) 920 and multipliers 902, 904, and 906. The symbol stream provided to the multipliers 902, 904, and 906 are multiplied by mask functions M1, M2, and M15 generated from the mask generator 910, respectively. The output symbols of the multipliers 902, 904, and 906 are provided to switches 952, 954, and 956, respectively. At this moment, the controller 930 provides the switches 952, 954, and 956 with switch control information indicating use/nonuse of the mask functions based on the code length information. For example, as (4,1), (7,2), (10,3), (13,4) and (19,6) encoders do not use the mask functions, the switches 952, 954, and 956 are all disconnected according to the switch control information. However, as (22,7) and (23,7) encoders use one basis mask function, only the switch 952 is connected. In this manner, the controller 930 controls the switches 952, 954, and 956 according to the number of the mask functions used based on the coding rate. Then, the IFHTs 920, 922, 924, and 926 each perform inverse fast Hadamard transform oil 32 symbols received from the zero inserter 900, and calculate correlations between the symbols and all the Walsh codes that can be used in the transmitter. Further, the IFHTs determine a highest correlation among the correlations, and an index of the Walsh code having the highest correlation. Therefore, the IFHTs 920, 922, 924, and 926 each provide the correlation comparator 940 with an index of the mask function multiplied by the received signal, the highest correlation, and an index of the Walsh code having the highest correlation. Since the signal provided to the IFHT 920 is multiplied by none of the mask functions, an identifier of the mask function becomes '0'. The correlation comparator 940 determines the highest correlation by comparing the correlations provided from the IFHTs, and combines an index of a mask function having the highest correlation with an index of the Walsh code.

Second Embodiment

Decoder

A decoder for adaptively performing a decoding operation according to the code with a variable length used in the encoder will be described.

First, a description will be made of an IFHT required when the decoder functions as a decoder corresponding to a Walsh encoder having a variable length. When the decoder operates in association with a (7,2) encoder, an IFHT for a Walsh encoder with a length 4 ($=2^2$) is used. When the decoder operates in association with a (10,3) encoder, an IFHT for a Walsh encoder with a length 8 ($=2^3$) is used. When the decoder operates in association with a (13,4) encoder, an IFHT for a Walsh encoder with a length 16 ($=2^4$) is used. When the decoder operates in association with a (16,5) encoder, an IFHT for a Walsh encoder with a length 32 ($=2^5$) is used. Also, when the decoder operates in association with (19,6), (22,7), (25,8), (28,9) and (32,10) encoders, an IFHT for a Walsh encoder with a length 32 ($=2^5$) is used. In order to operate in the decoder, the IFHT should be able to operate for a variable length. The present invention provides a structure of an IFHT operable for a variable length.

Figure 11:
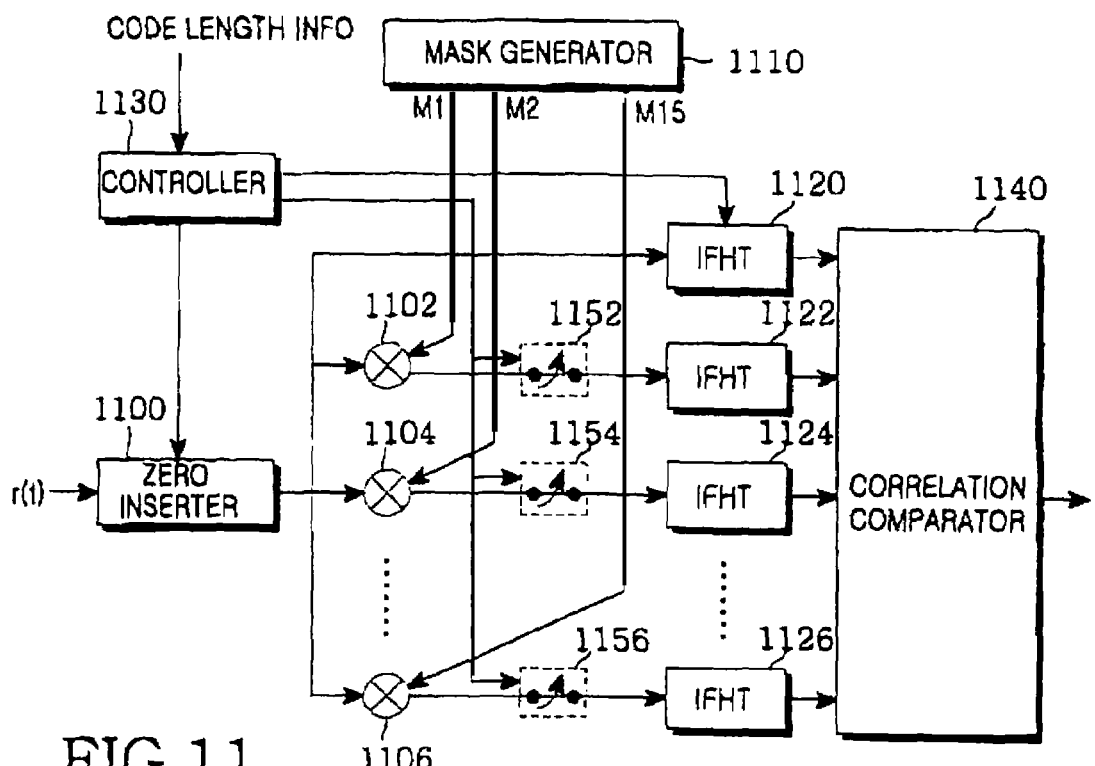
FIG. 11 illustrates a modified structure of the decoder according to an embodiment of the present invention.

FIG. 11 illustrates a structure of the first and second decoders 800 and 805 illustrated in FIG. 8. Referring to FIG. 11, coded symbols r(t) received from the encoder are provided to a zero inserter 1100, and at the same time, information in a code length used by the encoder in encoding the received symbols is provided to a controller 1130. The controller 1130 stores information on puncturing positions in association with the code lengths available for the encoder, and provides control information stored therein in association with the code length information to the zero inserter 1100. The puncturing positions stored in association with the code lengths are illustrated in Table 6 above.

Referring to Table 6, the controller 1130 outputs information on 28 puncturing positions for a coding rate (4,1), information on 25 puncturing positions for a coding rate (7,2), information on 22 puncturing positions for a coding rate (10,3), information on 19 puncturing positions for a coding rate (13,4), information on 13 puncturing positions for a coding rate (19,6), information on 10 puncturing positions for a coding rate (22,7), information on 7 puncturing positions for a coding rate (25,8), and information on 4 puncturing positions for a coding rate (28,9). For the respective cases, the puncturing positions are the same as given in the description of the encoders.

The zero inserter 1100 inserts 0's in the puncturing positions of the received symbols according to the control information from the controller 1130, and then, outputs a symbol stream of length 32. The symbol stream is provided to an inverse fast Hadamard transformer (IFHT) 1120 and multipliers 1102, 1104, and 1106. The signals provided to the multipliers 1102, 1104, and 1106 are multiplied by mask functions M1, M2, and M15 generated from the mask generator 1110, respectively. The mask functions generated by the mask generator 1110 are identical to the mask functions used in the encoders. The output symbols of the multipliers 1102, 1104, and 1106 are provided to switches 1152, 1154, and 1156, respectively. At this moment, the controller 1130 provides the switches 1152, 1154, and 1156 with switch control information indicating use/nonuse of the mask functions based oil the received code length information. As a result, the switches 1152, 1154, and 1156 pass the output symbols of the multipliers 1102, 1104, and 1106, respectively. For example, as the mask functions are not used at the coding rates (4,1), (7,2), (10,3), (13,4), (16,5) and (19,6), the switches 1152, 1154, and 1156 are all disconnected according to the switch control information, thus blocking the output symbols of the multipliers 1102, 1104, and 1106. As only one mask symbol is used at the coding rate (22,7), only the switch 1152 is connected according to the switch control information, and the remaining switches 1104 and 1106 are disconnected. In this manner, the number of mask functions in use is determined according to the coding rate and the switches are controlled depending on the determined number of the mask functions in use. Therefore, when the first and second encoders 800 and 805 illustrated in FIG. 8 serve as (4,1), (7,2), (10,3), (13,4), (16,5), and (19,6) decoders, only the IFHT 1120 is enabled. The first and second decoders 800 and 805 serve as (4,1), (7,2), (10,3), (13,4), (16,5), and (19,6) decoders, when the number of input information bits is less than 18. Therefore, the IFHT 1120 should adaptively operate for several code lengths, i.e., several coding rates. The controller 1130 generates control information indicating a code length of an associated Walsh encoder and provides the control information to the IFHT 1120. Then, the IFHTs 1120, 1124, and 1126 each perform inverse fast Hadamard transform on 32 symbols received from the zero inserter 1100, and calculate correlations between the symbols and Walsh codes having a specific length. The IFHT 1120 provides a correlation comparator 1140 with an index of the mask function, a highest correlation among the correlations, and an index of the Walsh code having the highest correlation. '0' is provided to the correlation comparator 1140 as an index of the mask function by the IFHT 1120. Providing '0' as an index of the mask function means that the input symbols are multiplied by no mask function.

Other IFHTs 1122, 1124, and 1126 perform inverse fast Hadamard transform upon receipt of symbols through associated switches 1152, 1154, and 1156, respectively, and calculate correlations among the inverse Hadamard transformed Walsh codes. After calculating the correlations, the IFHTs 1122, 1124 and 1126 each provide the correlation comparator 1140 with an index of the mask function used, a highest correlation among the correlations, and an index of the Walsh code having the highest correlation. The correlation comparator 1140 then compares the correlations provided from the IFHTs, and combines a mask index having the highest correlation with the Walsh code index.

Figure 10:
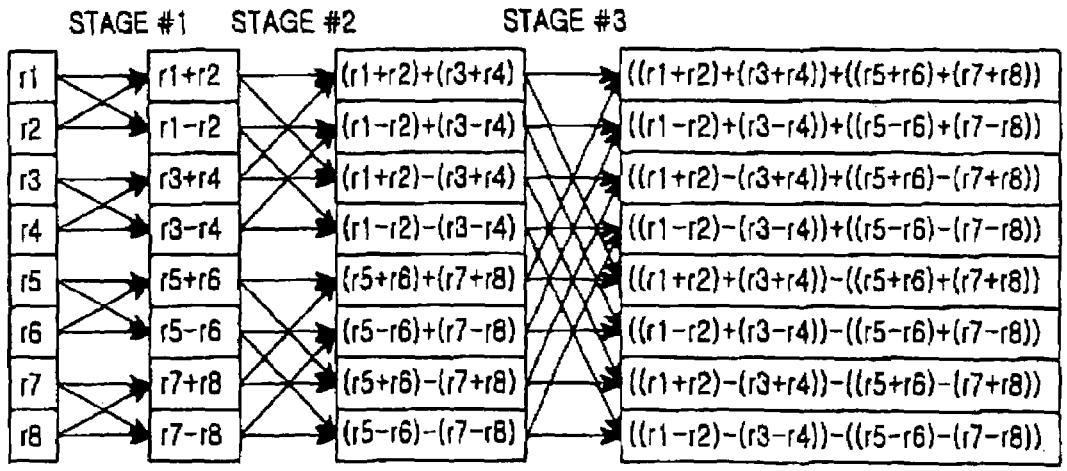
FIG. 10 illustrates a general inverse fast Hadamard transform operation for a Walsh code with a length 8.
Figure 12:
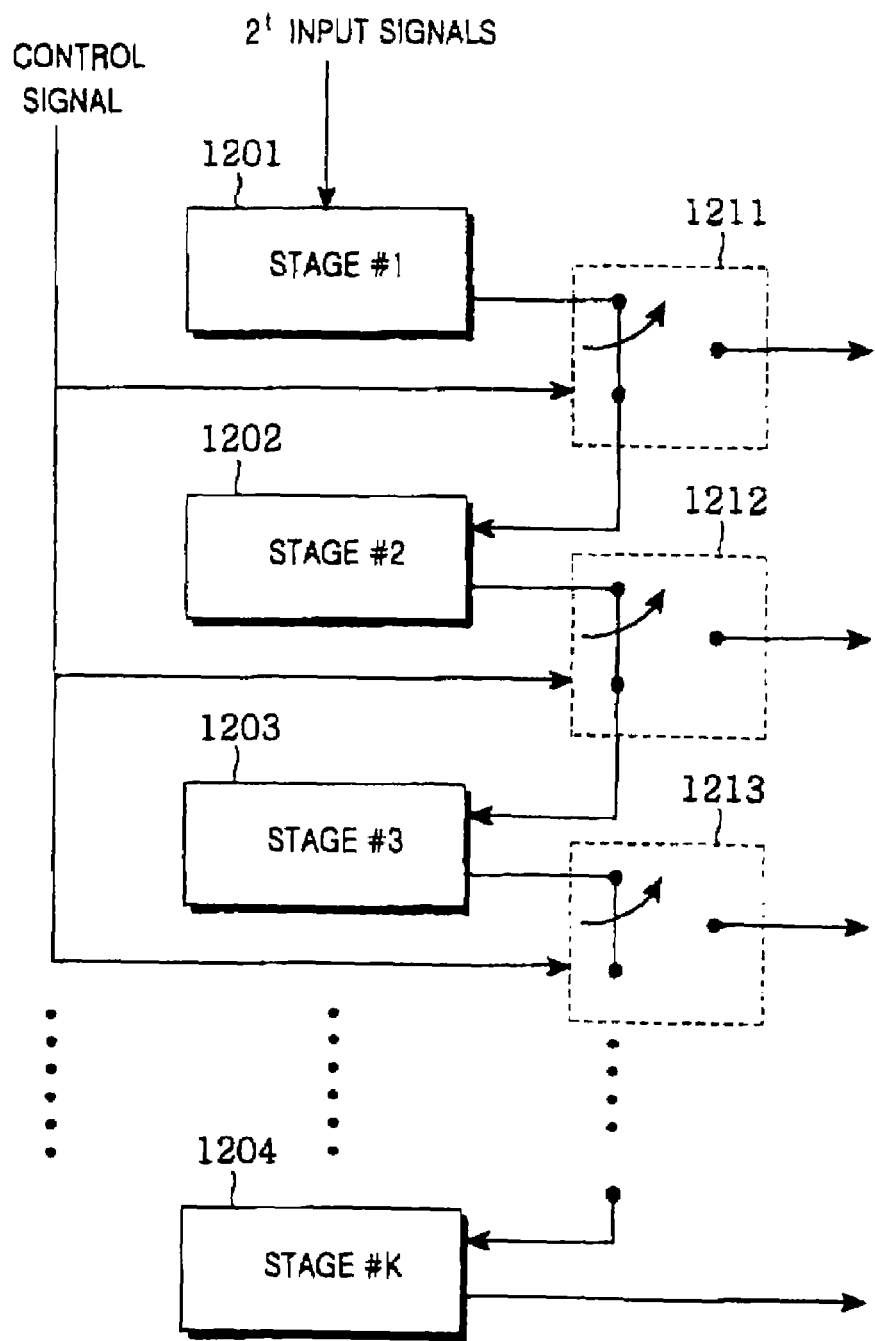
FIG. 12 illustrates an inverse fast Hadamard transformer having a variable length according to an embodiment of the present invention.

FIG. 12 illustrates an operation of the IFHT 1120 illustrated in FIG. 11, based on the inverse fast Hadamard transform process described in conjunction with FIG. 10. Specifically, FIG. 12 illustrates an overall scheme for an operation of the IFHT 1120 for the decoders 800 and 805 serving as (4,1), (7,2), (10,3), (13,4), (16,5), and (19,6) decoders.

B. Method of Increasing Coding Rate of Only First TFCI

In terms of the minimum distance, it is preferable to repeat a (3,2) simplex code 3 times and then puncture the last one coded symbol in order to obtain an (8,2) code, an optimal code having one of the coding rates needed to increase the coding rates of only the first TFCI. Table 7 illustrates the relationship between input information bits of the (3,2) simplex code and (3,2) simplex codewords output based on the input information bits.

TABLE 7

| Input Information Bits | (3,2) Simplex Codewords |
|---|---|
| 00 | 000 |
| 01 | 101 |
| 10 | 011 |
| 11 | 110 |

Table 8 illustrates the relationship between the input information bits and (8,2) simplex codewords obtained by repeating the (3,2) simplex codeword 3 limes and then puncturing the last one coded symbol.

TABLE 8

| Input Information Bits | (8,2) Simplex Codewords |
|---|---|
| 00 | 000 000 00 |
| 01 | 101 101 10 |
| 10 | 011 011 01 |
| 11 | 110 110 11 |

However, the (8,2) simplex codewords obtained by repeating the (3,2) simplex codeword 3 times and then puncturing the last one coded symbol can be implemented by shortening the existing (16,4) Reed-Muller code.

Describing an example of the shortening method, the (16, 4) Reed-Muller code is a linear combination of 4 basis codewords of length 16, where '4' is the number of input information bits. Receiving only 2 bits among the 16 input information bits is equivalent to using a linear combination of only 2 basis codewords among the 4 basis codewords of length 16 and not using the remaining codewords. In addition, by restricting the use of the basis codewords and then puncturing 8 symbols among 16 symbols, it is possible to realize an (8,2) encoder using the (16,4) encoder. Table 9 illustrates the shortening method.

TABLE 9

| Input Info Bits | Codewords | | | | | | | | | | | | | | | |
|---|---|---|---|---|---|---|---|---|---|---|---|---|---|---|---|---|
| 0000 | 0(*) | 0 | 0 | 0 | 0(*) | 0 | 0 | 0 | 0(*) | 0 | 0 | 0(*) | 0(*) | 0(*) | 0(*) | 0(*) |
| 0001 | **0(*)** | 1 | 0 | 1 | **0(*)** | 1 | 0 | 1 | **0(*)** | 1 | 0 | **1(*)** | **0(*)** | **1(*)** | **0(*)** | **1(*)** |
| 0010 | **0(*)** | 0 | 1 | 1 | **0(*)** | 0 | 1 | 1 | **0(*)** | 0 | 1 | **1(*)** | **0(*)** | **0(*)** | **1(*)** | **1(*)** |
| 0011 | 0(*) | 1 | 1 | 0 | 0(*) | 1 | 1 | 0 | 0(*) | 1 | 1 | 0(*) | 0(*) | 1(*) | 1(*) | 0(*) |
| 0100 | 0 | 0 | 0 | 0 | 1 | 1 | 1 | 1 | 0 | 0 | 0 | 0 | 1 | 1 | 1 | 1 |
| 0101 | 0 | 1 | 0 | 1 | 1 | 0 | 1 | 0 | 0 | 1 | 0 | 1 | 1 | 0 | 1 | 0 |
| 0110 | 0 | 0 | 1 | 1 | 1 | 1 | 0 | 0 | 0 | 0 | 1 | 1 | 1 | 1 | 0 | 0 |
| 0111 | 0 | 1 | 1 | 0 | 1 | 0 | 0 | 1 | 0 | 1 | 1 | 0 | 1 | 0 | 0 | 1 |
| 1000 | 0 | 0 | 0 | 0 | 0 | 0 | 0 | 0 | 1 | 1 | 1 | 1 | 1 | 1 | 1 | 1 |
| 1001 | 0 | 1 | 0 | 1 | 0 | 1 | 0 | 1 | 1 | 0 | 1 | 0 | 1 | 0 | 1 | 0 |
| 1010 | 0 | 0 | 1 | 1 | 0 | 0 | 1 | 1 | 1 | 1 | 0 | 0 | 1 | 1 | 0 | 0 |
| 1011 | 0 | 1 | 1 | 0 | 0 | 1 | 1 | 0 | 1 | 0 | 0 | 1 | 1 | 0 | 0 | 1 |
| 1100 | 0 | 0 | 0 | 0 | 1 | 1 | 1 | 1 | 1 | 1 | 1 | 1 | 0 | 0 | 0 | 0 |
| 1101 | 0 | 1 | 0 | 1 | 1 | 0 | 1 | 0 | 1 | 0 | 1 | 0 | 0 | 1 | 0 | 1 |
| 1110 | 0 | 0 | 1 | 1 | 1 | 1 | 0 | 0 | 1 | 1 | 0 | 0 | 0 | 0 | 1 | 1 |
| 1111 | 0 | 1 | 1 | 0 | 1 | 0 | 0 | 1 | 1 | 0 | 0 | 1 | 0 | 1 | 1 | 0 |

Referring to Table 9, every (16,4) codeword is a linear combination of the 4 bold basis codewords of length 16. In order to obtain the (8,2) code, only the upper 2 basis codewords among the 4 basis codewords are used. Then, the remaining lower 12 codewords are automatically unused. Therefore, only the upper 4 codewords are used. Besides, in order to generate a basis codeword of length 8 among the upper 4 basis codewords, it is necessary to puncture 8 symbols. It is possible to obtain the (8,2) simplex codewords of Table 8 by puncturing the symbols indicated by (*) in Table 9 and then collecting the remaining 8 coded symbols.

Herein, a description will be made of a structure of an encoder for creating {(3,1) optimal code and (29,9) optimal code}, {(4,1) optimal code and (28,9) optimal code}, and {(5,1) optimal code and (27,9) optimal code} used for the information bit ratio of 1:9, a structure of an encoder for creating {(6,2) optimal code and (26,8) optimal code}, {(7,2) optimal code and (25,8) optimal code}, and {(8,2) optimal code and (24,8) optimal code} used for the information bit ratio of 2:8, a structure of an encoder for creating {(9,3) optimal code and (23,7) optimal code}, {(10,3) optimal code and (22,7) optimal code} and {(11,3) optimal code and (21,7) optimal code} used for the information bit ratio of 3:7, a structure of an encoder for creating {(12,4) optimal code and (20,6) optimal code}, {(13,4) optimal code and (19,6) optimal code} and {(14,4) optimal code and (18,6) optimal code} used for the information bit ratio of 4:6, and a structure of an encoder for creating a (16,5) optimal code and a (32,10) optimal code used for the information bit ratio of 5:5, by shortening a (32,10) sub-code of the second order Reed-Muller code. In addition, a structure of a decoder corresponding to the encoder will also be described herein below.

B1. Structure and Operation of Transmitter

An embodiment of the present invention provides an apparatus and method for dividing 10 information bits in a ratio of 1:9, 2:8, 3:7, 4:6, 5:5, 6:4, 7:3, 8:2, or 9:1 before coding in the hard split mode, as done in the logical split mode where the ratio of the input information bits is 5:5. In addition, it will be assumed herein that the coding rate of the first TFCI transmitting the TFCI for the DSCH is increased before being transmitted. That is, if the ratio of the DCH information bits to the DSCH information bits is 1:9, a (3,1) code and a (29,9) code are used. If the ratio of the DCH information bits to the DSCH information bits is 2:8, a (6,2) code and a (26,8) code are used. If the ratio of the DCH information bits to the DSCH information bits is 3:7, a (9,3) code and a (23,7) code are used. If the ratio of the DCH information bits to the DSCH information bits is 4:6, a (12,4) code and a (20,6) code are used. If the ratio of the DCH information bits to the DSCH information bits is 6:4, a (18,6) code and a (14,4) code are used. If the ratio of the DCH information bits to the DSCH information bits is 7:3, a (21,7) code and a (11,3) code are used. If the ratio of the DCH information bits to the DSCH information bits is 8:2, a (26,8) code and a (6,2) code are used. If the ratio of the DCH information bits to the DSCH information bits is 9:1, a (27,9) code and a (5,1) code are used.

FIG. 4 illustrates a structure of a transmitter according to an embodiment of the present invention. Referring to FIG. 4, TFCI bits for the DSCH and TFCI bits for the DCH, divided according to the information bit ratio, are provided to first and second encoders 400 and 405, respectively. Here, the TFCI bits for the DSCH are referred to as TFCI(field 1) or first TFCI bits, while the TFCI bits for the DCH are referred to as TFCI(field 2) or second TFCI bits. The TFCI bits for the DSCH are generated from a first TFCI bit generator 450, and the TFCI bits for the DCH are generated from a second TFCI bit generator 455. The first and second TFCI bits have the different ratios stated above, according to their information bit ratio. In addition, a control signal indicating code length information, i.e., information on a length value of the codeword set according to the information bit ratio, is provided to the first and second encoders 400 and 405. The code length information is generated from a code length information generator 460, and has a value variable according to lengths of the first TFCI bits and the second TFCI bits.

When the information bit ratio is 6:4, the encoder 400 receives the 6-bit TFCI for the DSCH and outputs 20 coded symbols in response to a control signal for allowing the encoder 400 to operate as an (20,6) encoder, while the encoder 405 receives the 4-bit TFCI for the DCH and outputs 12 coded symbols in response to a control signal for allowing the encoder 405 to operate as a (12,4) encoder. When the information bit ratio is 7:3, the encoder 400 receives the 7-bit TFCI for the DSCH and outputs 23 coded symbols in response to a control signal for allowing the encoder 400 to operate as a (23,7) encoder, while the encoder 405 receives the 3-bit TFCI for the DCH and outputs 9 coded symbols in response to a control signal for allowing the encoder 405 to operate as a (9,3) encoder. When the information bit ratio is 8:2, the encoder 400 receives the 8-bit TFCI for the DSCH and outputs 26 coded symbols in response to a control signal for allowing the encoder 400 to operate as a (26,8) encoder, while the encoder 405 receives the 2-bit TFCI for the DCH and outputs 6 coded symbols in response to a control signal for allowing the encoder 405 to operate as a (6,2) encoder. When the information bit ratio is 9:1, the encoder 400 receives the 9-bit TFCI for the DSCH and outputs 29 coded symbols in response to a control signal for allowing the encoder 400 to operate as a (29,9) encoder, while the encoder 405 receives the 1-bit TFCI for the DCH and outputs 3 coded symbols in response to a control signal for allowing the encoder 405 to operate as a (3,1) encoder.

FIG. 5 illustrates a detailed structure of the encoders 400 and 405. In FIG. 4, there are provided separate encoders for the first TFCI and the second TFCI. However, when the first TFCI codewords and the second TFCI codewords are generated with a time delay, generating the first and second TFCI codewords can be realized with a single encoder. An operation of the encoders according to an embodiment of the present invention will be described in detail with reference to FIG. 5.

1) Information Bit Ratio of $1^{st}$ TFCI to $2^{nd}$ TFCI is 1:9

For the information bit ratio of 1:9, the encoder 400 serves as a (3,1) encoder, while the encoder 405 serves as a (29,9) encoder. Operations of the (3,1) encoder and the (29,9) encoder will be separately described below with reference to FIG. 5.

First, an operation of the (3,1) encoder will be described with reference to FIG. 5. Referring to FIG. 5, one input bit a0 is normally provided to the encoder, and the remaining input bits a1, a2, a3, a4, a5, a6, a7, a8, and a9 are all filled with '0'. The input bit a0 is applied to a multiplier 510, the input bit a1 to a multiplier 512, the input bit a2 to a multiplier 514, the input bit a3 to a multiplier 516, the input bit a4 to a multiplier 518, the input bit a5 to a multiplier 520, the input bit a6 to a multiplier 522, the input bit a7 to a multiplier 524, the input bit a8 to a multiplier 526, and the input bit a9 to a multiplier 528. At the same time, a Walsh code generator 500 generates a basis codeword W1=10101010101010110101010101010100, and provides the generated basis codeword W1 to the multiplier 510. The multiplier 510 then multiplies the input bit a0 by the basis codeword W1 in a symbol unit, and provides its output to an exclusive OR (XOR) operator 540. Further, the Walsh code generator 500 generates other basis codewords W2, W4, W8, and W16, and provides them to the multiplier 512, 514, 516, and 518, respectively. An all-1's code generator 502 generates an all-1's basis codeword (or all-1's sequence) and provides the generated all-1's basis codeword to the multiplier 520. A mask generator 504 generates basis codewords M1, M2, M4, and M8, and provides the generated basis codewords M1, M2, M4, and M8 to the multipliers 522, 524, 526, and 528, respectively. However, since the input bits a1, a2, a3, a4, a5, a6, a7, a8, and a9 applied to the multipliers 512, 514, 516, 518, 520, 522, 524, 526, and 528 are all 0's, the multipliers 512, 514, 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to the output value of the multiplier 510. The 32 symbols output from the exclusive OR operator 540 are provided to a puncturer 560. At this moment, a controller 550 receives code length information and provides the puncturer 560 with a control signal indicating puncturing positions based on the code length information. The puncturer 560 then punctures $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 29 symbols among the 32 coded symbols, and thus outputs 3 ion-punctured coded symbols.

Next, an operation of the (29,9) encoder will be described with reference to FIG. 5. Referring to FIG. 5, nine input bits a0, a1, a2, a3, a4, a5, a6, a7, and a8 are normally provided to the encoder, and the remaining input bit a9 is filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. The mask generator 504 provides the multiplier 522 with the basis codeword M1=0101 0000 1100 011 11100 0001 1101 1101, the multiplier 524 with the basis codeword M2=0000 0011 1001 1011 1011 0111 0001 1100, and the multiplier 526 with the basis codeword M4=0001 0101 1111 00100110 1100 1010 1100. Then, the multiplier 522 multiplies the basis codeword M1 by the input bit a6 in the symbol unit and provides its output to the exclusive OR operator 540, the multiplier 524 multiplies the basis codeword M2 by the input bit a7 in the symbol unit and provides its output to the exclusive OR operator 540, and the multiplier 526 multiplies the basis codeword M4 by the input bit a8 in the symbol unit and provides its output to the exclusive OR operator 540. Further, the mask generator 504 generates the basis codeword M8, and provides the generated basis codeword M8 to the multiplier 528. However, since the input bit a9 applied to the multiplier 528 is 0, the multiplier 528 outputs 0 to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, 522, 524, and 526. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $6^{th}$, $10^{th}$ and $11^{th}$ coded symbols among a total of 32 coded symbols of $0^{th}$ to $31^{st}$ symbols according to the control signal output from the controller 550. In other words, the puncturer 560 punctures 3 symbols among the 32 coded symbols, and thus outputs 29 non-punctured coded symbols.

2) Information Bit Ratio of $1^{st}$ TFCI to $2^{nd}$ TFCI is 2:8

For the information bit ratio of 2:8, the encoder 400 serves as a (6,2) encoder, while the encoder 405 serves as a (26,8) encoder. Operations of the encoder (6,2) and the encoder (26,8) will be separately described herein below with reference to FIG. 5.

First, an operation of the encoder (6,2) will be described with reference to FIG. 5. Referring to FIG. 5, two input bits a0 and a1 are normally provided to the encoder 400, and the remaining input bits a2, a3, a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, and the multiplier 512 with the basis codeword W2=01100110011001101100110011001100. The multiplier 510 multiplies the basis codeword W1 by the input bit a0 in the symbol unit and provides its output to the exclusive OR operator 540, and the multiplier 512 multiplies the basis codeword W2 by the input bit a1 in the symbol unit and provides its output to the exclusive OR operator 540. Further, the Walsh code generator 500 generates other basis codewords W4, W8 and W16, and provides them to the multipliers 514, 516, and 518, respectively. The all-1's code generator 502 generates an all-1's basis codeword and provides the generated all-1's basis codeword to the multiplier 520. The mask generator 504 generates the basis codewords M1, M2, M4, and M8, and provides the generated basis codewords M1, M2, M4, and M8 to the multipliers 522, 524, 526, and 528, respectively. However, since the input bits a2, a3, a4, a5, a6, a7, a8, and a9 applied to the multipliers 514, 516, 518, 520, 522, 524, 526, and 528 are all 0's, the multipliers 514, 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526 and 528 by the exclusive OR operator 540 is equal to a value determined by XORing the output values of the multipliers 510 and 512. The 32 symbols output from the exclusive OR operator 540 are provided to the puncture 560. At this moment, the controller 550 receives code length information and provides the puncturer 560 with a control signal indicating puncturing positions based on the code length information. The puncturer 560 then punctures $3^{rd}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 26 symbols among the 32 coded symbols, and thus outputs 6 non-punctured coded symbols.

Next, an operation of the (26,8) encoder will be described with reference to FIG. 5. Referring to FIG. 5, eight input a0, a1, a2, a3, a4, a5, a6, and a7 bits are normally provided to the encoder, and the remaining input bits a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. Further, the mask generator 504 provides the multiplier 522 with the basis codeword M1=0101 0000 1100 0111 1100 0001 1101 1101, and the multiplier 524 with the basis codeword M2=0000 0011 1001 1011 1011 0111 0001 1100. The multiplier 522 then multiplies the basis codeword M1 by the input bit a6 in the symbol unit and provides its output to the exclusive OR operator 540, and the multiplier 524 multiplies the basis codeword M2 by the input bit a7 in the symbol unit and provides its output to the exclusive OR operator 540. Further, the mask generator 504 generates the basis codewords M4 and M8, and provides the generated basis codewords M4 and M8 to the multipliers 526 and 528, respectively. However, since the input bits a8 and a9 applied to the multipliers 526 and 528 are all 0's, the multipliers 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, 522, and 524. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $7^{th}$, $13^{th}$, $15^{th}$, $20^{th}$, $25^{th}$ and $30^{th}$ coded symbols among a total of 32 coded symbols of $0^{th}$ to $31^{st}$ symbols according to the control signal output from the controller 550. In other words, the puncturer 560 punctures 6 symbols among the 32 coded symbols, and thus outputs 26 non-punctured coded symbols.

3) Information Bit Ratio of $1^{st}$ TFCI to $2^{nd}$ TFCI is 3:7

For the information bit ratio of 3:7, the encoder 400 serves as a (9,3) encoder, while the encoder 405 serves as a (23,7) encoder. Operations of the (9,3) encoder and the (23,7) encoder will be separately described below with reference to FIG. 5.

First, an operation of the (9,3) encoder will be described with reference to FIG. 5. Referring to FIG. 5, three input bits a0, a1, and a2 are normally provided to the encoder, and the remaining input bits a3, a4, a5, a6, a7, a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, and the multiplier 514 with the basis codeword W4=00011110000111100011110000111100. The multiplier 510 then multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, and the multiplier 514 multiplies the basis codeword W4 by the input bit a2 in the symbol unit and provides its output to the exclusive OR operator 540. Further, the Walsh code generator 500 generates other basis codewords W8 and W16, and provides them to the multipliers 516 and 518, respectively. The all-1's code generator 502 generates an all-1's basis codeword and provides the generated all-1's basis codeword to the multiplier 520. The mask generator 504 generates the basis codewords M1, M2, M4, and M8, and provides the generated basis codewords M1, M2, M4, and M8 to the multipliers 522, 524, 526, and 528, respectively. However, since the input bits a3, a4, a5, a6, a7, a8, and a9 applied to the multipliers 516, 518, 520, 522, 524, 526, and 528 are all 0's, the multipliers 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, and 514. The 32 symbols output from the exclusive OR operator 540 are provided to the puncture 560. At this moment, the controller 550 receives code length information and provides the puncturer 560 with a control signal indicating puncturing positions based oil the code length information. The puncturer 560 then punctures $7^{th}$, $8^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 23 symbols among the 32 coded symbols, and thus outputs 9 non-punctured coded symbols.

Next, an operation of the (23,7) encoder will be described with reference to FIG. 5. Referring to FIG. 5, seven input bits a0, a1, a2, a3, a4, a5, and a6 are normally provided to the encoder, and the remaining input bits a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. Further, the mask generator 504 provides the multiplier 522 with the basis codeword M1=0101 0000 1100 0111 1100 0001 1101 1101. The multiplier 522 then multiplies the basis codeword M1 by the input bit a6 in the symbol unit and provides its output to the exclusive OR operator 540. Further, the mask generator 504 generates the other basis codewords M2, M4, and M8, and provides the generated basis codewords M2, M4, and M8 to the multipliers 524, 526, and 528, respectively. However, since the input bits a7, a8, and a9 applied to the multipliers 524, 526, and 528 are all 0's, the multipliers 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, and 522. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $3^{rd}$, $8^{th}$, $9^{th}$, $12^{th}$, $16^{th}$, $18^{th}$, $23^{rd}$, $24^{th}$, and $30^{th}$ coded symbols among a total of 32 coded symbols of $0^{th}$ to $31^{st}$ symbols according to the control signal output from the controller 550. In other words, the puncturer 560 punctures 9 symbols among the 32 coded symbols, and thus outputs 23 non-punctured coded symbols.

4) Information Bit Ratio of $1^{st}$ TFCI to $2^{nd}$ TFCI is 4:6

For the information bit ratio of 4:6, the encoder 400 serves as a (12,4) encoder, while the encoder 405 serves as a (20,6) encoder. Operations of the (12,4) encoder and the (20,6) encoder will be separately described below with reference to FIG. 5.

First, an operation of the (12,4) encoder will be described with reference to FIG. 5. Referring to FIG. 5, four input bits a0, a1, a2, and a3 are normally provided to the encoder, and the remaining input bits a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, and the multiplier 516 with the basis codeword W8=000000011111111000000011111111100. The multiplier 510 then multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, and the multiplier 516 multiplies the basis codeword W8 by the input bit a3 in the symbol unit and provides its output to the exclusive OR operator 540. Further, the Walsh code generator 500 generates the other basis codeword W16, and provides it to the multiplier 518. The all-1's code generator 502 generates an all-1's basis codeword and provides the generated all-1's basis codeword to the multiplier 520. The mask generator 504 generates the other basis codewords M1, M2, M4, and M8, and provides the generated basis codewords M1, M2, M4, and M8 to the multipliers 522, 524, 526, and 528, respectively. However, since the input bits a4, a5, a6, a7, a8, and a9 applied to the multipliers 518, 520, 522, 524, 526, and 528 are all 0's, the multipliers 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, and 516. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $0^{th}$, $1^{st}$, $2^{nd}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 20 symbols among the 32 coded symbols, and thus outputs 12 non-punctured coded symbols.

Next, an operation of the (20,6) encoder will be described with reference to FIG. 5. Referring to FIG. 5, six input bits a0, a1, a2, a3, a4, and a5 are normally provided to the encoder, and the remaining input bits a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000000111111110000000111111100, and the multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. In addition, the all-1's code generator 502 generates an all-1's basis codeword of length 32 and provides the generated all-1's basis codeword to the multiplier 520. The multiplier 520 then multiplies the all-1's basis codeword by the input bit a5 in the symbol unit and provides its output to the exclusive OR operator 540. Further, the mask generator 504 generates the basis codewords M1, M2, M4, and M8, and provides the generated basis codewords M1, M2, M4, and M8 to the multipliers 522, 524, 526, and 528, respectively. However, since the input bits a6, a7, a8 and a9 applied to the multipliers 522, 524, 526, and 528 are all 0's, the multipliers 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, and 520. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $10^{th}$, $12^{th}$, $13^{th}$, $14^{th}$, $19^{th}$, $20^{th}$, $21^{st}$, $23^{rd}$, $24^{th}$, $27^{th}$, $28^{th}$, and $31^{st}$ coded symbols among a total of 32 coded symbols of $0^{th}$ to $31^{st}$ symbols according to the control signal output from the controller 550. In other words, the puncturer 560 punctures 12 symbols among the 32 coded symbols, and thus outputs 20 non-punctured coded symbols.

5) Information Bit Ratio of $1^{st}$ TFCI to $2^{nd}$ TFCI is 6:4

For the information bit ratio of 6:4, the encoder 400 serves as a (18,6) encoder, while the encoder 405 serves as a (14,4) encoder. Operations of the (18,6) encoder and the (14,4) encoder will be separately described below with reference to FIG. 5.

First, an operation of the (18,6) encoder will be described with reference to FIG. 5. Referring to FIG. 5, six input bits a0, a1, a2, a3, a4, and a5 are normally provided to the encoder, and the remaining input bits a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. The all-1's code generator 502 generates an all-1's basis codeword and provides the generated all-1's basis codeword to the multiplier 520. The multiplier 520 then multiplies the all-1's basis codeword by the input bit a5 in the symbol unit and provides its output to the exclusive OR operator 540. The mask generator 504 generates the basis codewords M1, M2, M4, and M8, and provides the generated basis codewords M1, M2, M4, and M8 to the multipliers 522, 524, 526, and 528, respectively. However, since the input bits a6, a7, a8 and a9 applied to the multipliers 522, 524, 526, and 528 are all 0's, the multipliers 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, and 520. The 32 symbols output from the exclusive OR operator 540 are provided to the puncture 560. At this moment, the controller 550 receives code length information and provides the puncturer 560 with a control signal indicating puncturing positions based on the code length information. The puncturer 560 then punctures $0^{th}$, $7^{th}$, $9^{th}$, $11^{th}$, $16^{th}$, $19^{th}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 14 symbols among the 32 coded symbols, and thus outputs 18 non-punctured coded symbols.

Next, an operation of the (14,4) encoder will be described with reference to FIG. 5. Referring to FIG. 5, four input bits a0, a1, a2, and a3 are normally provided to the encoder, and the remaining input bits a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, and the multiplier 516 multiplies the basis codeword W8 by the input bit a3 in the symbol unit and provides its output to the exclusive OR operator 540. Further, the Walsh code generator 500 provides the multiplier 518 with the other basis codeword W16, and the all-1's code generator 502 generates an all-1's basis codeword of length 32 and provides the generated all-1's basis codeword to the multiplier 520. Further, the mask generator 504 generates the basis codewords M1, M2, M4 and M8, and provides the generated basis codewords M1, M2, M4, and M8 to the multipliers 522, 524, 526, and 528, respectively. However, since the input bits a4, a5, a6, a7, a8, and a9 applied to the multipliers 518, 520, 522, 524, 526, and 528 are all 0's, the multipliers 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, and 516. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $0^{th}$, $1^{st}$, $2^{nd}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 18 symbols among the 32 coded symbols, and thus outputs 14 non-punctured coded symbols.

6) Information Bit Ratio of $1^{st}$ TFCI to $2^{nd}$ TFCI is 7:3

For the information bit ratio of 7:3, the encoder 400 serves as a (21,7) encoder, while the encoder 405 serves as a (11,3) encoder. Operations of the (21,7) encoder and the (11,3) encoder will be separately described below with reference to FIG. 5.

First, an operation of the (21,7) encoder will be described with reference to FIG. 5. Referring to FIG. 5, seven input bits a0, a1, a2, a3, a4, a5, and a6 are normally provided to the encoder, and the remaining input bits a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100, the multiplier 516 with the basis codeword W8=0000000111111110000000 1111111100, and multiplier 518 with the basis codeword W16=00000000000000001111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. The all-1's code generator 502 generates an all-1's basis codeword and provides the generated all-1's basis codeword to the multiplier 520. The multiplier 520 then multiplies the all-1's basis codeword by the input bit a5 in the symbol unit and provides its output to the exclusive OR operator 540. The mask generator 504 generates the basis codeword M1=0101 0000 1100 0111 1100 0001 1101 1101, and provides the generated basis codeword to the multiplier 522. The multiplier 522 then multiplies the basis codeword M1 by the input bit a6 in the symbol unit and provides its output to the exclusive OR operator 540. Further, the mask generator 504 generates the other basis codewords M2, M4, and M8, and provides the generated basis codewords M2, M4 and M8 to the multipliers 524, 526, and 528, respectively. However, since the input bits a7, a8, and a9 applied to the multipliers 524, 526, and 528 are all 0's, the multipliers 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, and 522. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $0^{th}$, $1^{st}$, $2^{nd}$, $3^{rd}$, $4^{th}$, $5^{th}$, $7^{th}$, $12^{th}$, $18^{th}$, $21^{st}$, and $24^{th}$ coded symbols among a total of 32 coded symbols of $0^{th}$ to $31^{st}$ symbols according to the control signal output from the controller 550. In other words, the puncturer 560 punctures 11 symbols among the 32 coded symbols, and thus outputs 21 non-punctured coded symbols.

Next, an operation of the (11,3) encoder will be described with reference to FIG. 5. Referring to FIG. 5, three input bits a0, a1, and a2 are normally provided to the encoder, and the remaining input bits a3, a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101010110101010101010100, the multiplier 512 with the basis codeword W2=01100110011001101100110011001100, the multiplier 514 with the basis codeword W4=00011110000111100011110000111100. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, and the multiplier 514 multiplies the basis codeword W4 by the input bit a2 in the symbol unit and provides its output to the exclusive OR operator 540. Further, the Walsh code generator 500 generates the other basis codewords W8 and W16, and provides the generated basis codewords W8 and W16 to the multipliers 516 and 518, respectively. The all-1's code generator 502 generates an all-1's basis codeword of length 32 and provides the generated all-1's basis codeword to the multiplier 520. Further, the mask generator 504 generates the basis codewords M1, M2, M4 and M8, and provides the generated basis codewords M1, M2, M4, and M8 to the multipliers 522, 524, 526, and 528, respectively. However, since the input bits a3, a4, a5, a6, a7, a8, and a9 applied to the multipliers 516, 518, 520, 522, 524, 526, and 528 are all 0's, the multipliers 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, and 514. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $7^{th}$, $8^{th}$, $9^{th}$, $10^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 21 symbols among the 32 coded symbols, and thus outputs 11 non-punctured coded symbols.

7) Information Bit Ratio of $1^{st}$ TFCI to $2^{nd}$ TFCI is 8:2

For the information bit ratio of 8:2, the encoder 400 serves as a (24,8) encoder, while the encoder 405 serves as a (8,2) encoder. Operations of the (24,8) encoder and the (8,2) encoder will be separately described below with reference to FIG. 5.

First, an operation of the (24,8) encoder will be described with reference to FIG. 5. Referring to FIG. 5, eight input bits a0, a1, a2, a3, a4, a5, a6, and a7 are normally provided to the encoder, and the remaining input bits a8 and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101011010101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its output to the exclusive OR operator 540. The all-1's code generator 502 generates an all-1's basis codeword and provides the generated all-1's basis codeword to the multiplier 520. The multiplier 520 then multiplies the all-1's basis codeword by the input bit a5 in the symbol unit and provides its output to the exclusive OR operator 540. The mask generator 504 provides the multiplier 522 with the basis codeword M1=0101 0000 1100 0111 1100 0001 1101 1101, and the multiplier 524 with the basis codeword M2=0000 0011 1001 1011 1011 0111 0001 1100. Then, the multiplier 522 multiplies the basis codeword M1 by the input bit a6 in the symbol unit and provides its output to the exclusive OR operator 540, and the multiplier 524 multiplies the basis codeword M2 by the input bit a7 in the symbol unit and provides its output to the exclusive OR operator 540. Further, the mask generator 504 generates the other basis codewords M4 and M8, and provides the generated basis codewords M4 and M8 to the multipliers 526 and 528, respectively. However, since the input bits a8 and a9 applied to the multipliers 526 and 528 are all 0's, the multipliers 526 and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, 522, and 524. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $1^{st}$, $7^{th}$, $13^{th}$, $15^{th}$, $20^{th}$, $25^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 8 symbols among the 32 coded symbols, and thus outputs 24 non-punctured coded symbols.

Next, an operation of the (8,2) encoder will be described with reference to FIG. 5. Referring to FIG. 5, two input bits a0 and a1 are normally provided to the encoder, and the remaining input bits a2, a3, a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101011010101010101010100, and the multiplier 512 with the basis codeword W2=01100110011001101100110011001100. Then, the multiplier 510 multiplies the basis codeword W1 by the input bit a0 in the symbol unit and provides its output to the exclusive OR operator 540, and the multiplier 512 multiplies the basis codeword W2 by the input bit a1 in the symbol unit and provides its output to the exclusive OR operator 540. Further, the Walsh code generator 500 generates the other basis codewords W4, W8, and W16, and provides the generated basis codewords W4, W8, and W16 to the multipliers 514, 516, and 518, respectively. The all-1's code generator 502 generates an all-1's basis codeword of length 32 and provides the generated all-1's basis codeword to the multiplier 520. Further, the mask generator 504 generates the basis codewords M1, M2, M4, and M8, and provides the generated basis codewords M1, M2, M4, and M8 to the multipliers 522, 524, 526, and 528, respectively. However, since the input bits a2, a3, a4, a5, a6, a7, a8, and a9 applied to the multipliers 514, 516, 518, 520, 522, 524, 526, and 528 are all 0's, the multipliers 514, 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510 and 512. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $3^{rd}$, $7^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 24 symbols among the 32 coded symbols, and thus outputs 8 non-punctured coded symbols.

8) Information Bit Ratio of $1^{st}$ TFCI to $2^{nd}$ TFCI is 9:1

For the information bit ratio of 9:1, the encoder 400 serves as a (27,9) encoder, while the encoder 405 serves as a (5,1) encoder. Operations of the (27,9) encoder and the (5,1) encoder will be separately described below with reference to FIG. 5.

First, an operation of the (27,9) encoder will be described with reference to FIG. 5. Referring to FIG. 5, nine input bits a0, a1, a2, a3, a4, a5, a6, a7, and a8 are normally provided to the encoder, and the remaining input bit a9 is filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 provides the multiplier 510 with the basis codeword W1=10101010101011010101010101010100, the multiplier 512 with the basis codeword W2=01100110011001101100110011001100, the multiplier 514 with the basis codeword W4=00011110000111100011110000111100, the multiplier 516 with the basis codeword W8=00000001111111100000001111111100, and multiplier 518 with the basis codeword W16=00000000000000011111111111111101. Then, the multiplier 510 multiplies the basis codeword W1 by the input bit a0 in the symbol unit and provides its output to the exclusive OR operator 540, the multiplier 512 multiplies the basis codeword W2 by the input bit a1 in the symbol unit and provides its output to the exclusive OR operator 540, the multiplier 514 multiplies the basis codeword W4 by the input bit a2 in the symbol unit and provides its output to the exclusive OR operator 540, the multiplier 516 multiplies the basis codeword W8 by the input bit a3 in the symbol unit and provides its output to the exclusive OR operator 540, and the multiplier 518 multiplies the basis codeword W16 by the input bit a4 in the symbol unit and provides its Output to the exclusive OR operator 540. The all-1's code generator 502 generates an all-1's basis codeword and provides the generated all-1's basis codeword to the multiplier 520. The multiplier 520 then multiplies the all-1's basis codeword by the input bit a5 in the symbol unit and provides its output to the exclusive OR operator 540. The mask generator 504 provides the multiplier 522 with the basis codeword M1=0101 0000 1100 0111 1100 0001 1101 1101, the multiplier 524 with the basis codeword M2=0000 0011 1001 1011 1011 0111 0001 1100, and the multiplier 526 with the basis codeword M4=0001 0101 1111 0010 0110 1100 1010 1100. Then, the multiplier 522 multiplies the basis codeword M1 by the input bit a6 in the symbol unit and provides its output to the exclusive OR operator 540, the multiplier 524 multiplies the basis codeword M2 by the input bit a7 in the symbol unit and provides its output to the exclusive OR operator 540, and the multiplier 526 multiplies the basis codeword M4 by the input bit a8 in the symbol unit and provides its output to the exclusive OR operator 540. Further, the mask generator 504 generates the other basis codeword M8, and provides the generated basis codeword M8 to the multiplier 528. However, since the input bit a9 applied to the multiplier 528 is 0, the multiplier 528 outputs 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to a value determined by XORing the output values of the multipliers 510, 512, 514, 516, 518, 520, 522, 524, and 526. The 32 symbols output from the exclusive OR operator 540 are provided to the puncturer 560. At this moment, the controller 550 receives code length information and provides the puncturer 560 with a control signal indicating puncturing positions based oil the code length information. The puncturer 560 then punctures $0^{th}$, $2^{nd}$, $8^{th}$, $19^{th}$, and $20^{th}$ coded symbols among a total of 32 coded symbols of $0^{th}$ to $31^{st}$ symbols according to the control signal output from the controller 550. In other words, the puncturer 560 punctures 5 symbols among the 32 coded symbols, and thus outputs 27 non-punctured coded symbols.

Next, an operation of the (5,1) encoder will be described with reference to FIG. 5. Referring to FIG. 5, one input bit a0 is normally provided to the encoder, and the remaining input bits a1, a2, a3, a4, a5, a6, a7, a8, and a9 are all filled with '0'. The input bit a0 is applied to the multiplier 510, the input bit a1 to the multiplier 512, the input bit a2 to the multiplier 514, the input bit a3 to the multiplier 516, the input bit a4 to the multiplier 518, the input bit a5 to the multiplier 520, the input bit a6 to the multiplier 522, the input bit a7 to the multiplier 524, the input bit a8 to the multiplier 526, and the input bit a9 to the multiplier 528. At the same time, the Walsh code generator 500 generates the basis codeword W1=10101010101010110101010101010100, and provides the generated basis codeword to the multiplier 510. The multiplier 510 then multiplies the basis codeword W1 by the input bit a0 in the symbol unit and provides its output to the exclusive OR operator 540. Further, the Walsh code generator 500 generates the other basis codewords W2, W4, W8, and W16, and provides the generated basis codewords W2, W4, W8, and W16 to the multipliers 512, 514, 516, and 518, respectively. The all-1's code generator 502 generates an all-1's basis codeword of length 32 and provides the generated all-1's basis codeword to the multiplier 520. Further, the mask generator 504 generates the basis codewords M1, M2, M4, and M8, and provides the generated basis codewords M1, M2, M4, and M8 to the multipliers 522, 524, 526 and 528, respectively. However, since the input bits a1, a2, a3, a4, a5, a6, a7, a8, and a9 applied to the multipliers 512, 514, 516, 518, 520, 522, 524, 526, and 528 are all 0's, the multipliers 512, 514, 516, 518, 520, 522, 524, 526, and 528 output 0's to the exclusive OR operator 540, thus not affecting the output of the exclusive OR operator 540. That is, a value determined by XORing the output values of the multipliers 510, 512, 514, 516, 518, 520, 522, 524, 526, and 528 by the exclusive OR operator 540 is equal to the output value of the multiplier 510. The 32 symbols output from the exclusive OR operator 540 are provided to the puncturer 560. At this moment, the controller 550 receives code length information and provides the puncturer 560 with a control signal indicating puncturing positions based on the code length information. The puncturer 560 then punctures $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded symbols among a total of 32 coded symbols of $0^{th}$ to $31^{st}$ symbols according to the control signal output from the controller 550. In other words, the puncturer 560 punctures 27 symbols among the 32 coded symbols, and thus outputs 5 non-punctured coded symbols.

Although the method of increasing only the coding rate of the first TFCI has been described, it would be obvious to those skilled in the art that the method of increasing only the coding rate of the second TFCI can be similarly performed.

After the above operations, the coded symbols output from the encoders 400 and 405 are time-multiplexed by a multiplexer 410, generating a multiplexed 32-symbol signal.

Next, a description will be made of a multiplexing operation of the multiplexer 410. The multiplexer 410 multiplexes the coded symbols output from the encoders 400 and 405 such that the coded symbols are arranged as uniformly as possible in one radio frame. That is, the multiplexer 410 maps the information bits $a_k$ to the coded bits $b_j$ bits, defined in the description of the prior art. The $b_j$ bits are mapped to the $d_j$ bits before being transmitted over the actual radio frame for the respective conditions A1, A2, A3, and A4. In conditions A2, A3, and A4, all of 32 $b_j$ bits are transmitted. However, in condition A1, the bits $d_{30}(b_{30})$ and $d_{31}(b_{31})$ are not transmitted, so it is necessary to determine the coded symbols to be mapped to the bits $d_{30}(b_{30})$ and $d_{31}(b_{31})$. The rules of mapping the coded symbols output from the encoder to the bits $d_{30}(b_{30})$ and $d_{31}(b_{31})$ are given below.

Rule 1: the last coded symbols of the respective encoders are mapped to $d_{30}(b_{30})$ and $d_{31}(b_{31})$.

Rule 2: arbitrary coded symbols of the respective encoders are mapped to $d_{30}(b_{30})$ and $d_{31}(b_{31})$.

Rule 3: two arbitrary coded symbols from an encoder with an increased coding rate are mapped to $d_{30}(b_{30})$ and $d_{31}(b_{31})$.

Rule 4: two arbitrary coded symbols from an encoder with a high coding rate are mapped to $d_{30}(b_{30})$ and $d_{31}(b_{31})$.

Rule 5: two arbitrary coded symbols from an encoder other than the encoder with an increased coding rate are mapped to $d_{10}(b_{30})$ and $d_{31}(b_{31})$.

In applying Rule 1, Rule 1, Rule 3, Rule 4, and Rule 5, the following should be considered. That is, when one or two coded symbols of each code are not transmitted, it should be considered (1) how the performance of the code used for the first TFCI or the second TFCI will be changed, (2) which TFCI among the first TFCI and the second TFCI should be increased in reliability (or performance), (3) which coded symbols output from the respective encoders should be mapped to $d_{30}(b_{30})$ and $d_{31}(b_{31})$ to minimize performance degradation of the codes, and (4) which TFCI among the first TFCI and the second TFCI should be stressed during transmission.

In the following description of Rule 1, Rule 2, Rule 3, and Rule 5, it will be assumed that the information bit ratio of the first TFCI to the second TFCI is 3:7 in the HSM. Further, in the description of Rule 4, it will be assumed that the information bit ratio of the first TFCI to the second TFCI is 3:7 for condition A1.

A description of Rule 1 will be made below with reference to an example. A (9,3) code and a (23,7) code, or a (11,3) code and a (21,7) code are available according to the information bit ratio of the first TFCI to the second TFCI. The (9,3) code and the (23,7) code are used to increase code performance of the second TFCI, while the (11,3) code and the (21,7) code are used to increase code performance of the first TFCI. When Rule 1 is applied, the last coded symbol of the (9,3) code is not transmitted, so an actual coding rate of the (9,3) code becomes (8,3); the last coded symbol of the (23,7) code is not transmitted, so an actual coding rate of the (23,7) code becomes (22,7); the last coded symbol of the (11,3) code is not transmitted, so an actual coding rate of the (11,3) code becomes (10,3); and the last coded symbol of the (21,7) code is not transmitted, so an actual coding rate of the (21,7) code becomes (20,7). In Rule 1, the encoders map the last coded symbols to $d_{30}(b_{30})$ and $d_{31}(b_{31})$, contributing to simplification of the mapping. However, in condition A1, the actual coding rate of the first TFCI to the second TFCI is decreased, resulting in a reduction in code performance of the first TFCI and the second TFCI.

A description of Rule 2 will be made below with reference to an example. A (9,3) code and a (23,7) code, or a (11,3) code and a (21,7) code are available according to the information bit ratio of the first TFCI to the second TFCI. When Rule 2 is applied, an arbitrary coded symbol of the (9,3) code is not transmitted, so an actual coding rate of the (9,3) code becomes (8,3); an arbitrary coded symbol of the (23,7) code is not transmitted, so an actual coding rate of the (23,7) code becomes (22,7); an arbitrary coded symbol of the (11,3) code is not transmitted, so an actual coding rate of the (11,3) code becomes (10,3); and an arbitrary coded symbol of the (21,7) code is not transmitted, so an actual coding rate of the (21,7) code becomes (20,7). The arbitrary coded symbols call be selected from the 4 codes such that the actual code performances are not decreased although the actual coding rates of the respective codes are decreased. However, several codes may decrease in performance regardless of the selected arbitrary coded symbols. Rule 2 is more complex than Rule 1 in a mapping method. However, in condition A1, it is possible to maintain code performances of the first TFCI and the second TFCI regardless of the reduction in the actual coding rate of the encoders for the first TFCI and the second TFCI.

A description of Rule 3 will be made below with reference to an example. A (9,3) code and a (23,7) code, or a (11,3) code and a (21,7) code are available according to the information bit ratio of the first TFCI to the second TFCI. When Rule 3 is applied, two arbitrary coded symbols of the (23,7) code are not transmitted, so an actual coding rate of the (23,7) code becomes (21,7); and two arbitrary coded symbols of the (11, 3) code are not transmitted, so an actual coding rate of the (11,3) code becomes (9,3). The arbitrary coded symbols can be selected such that the actual code performances are not decreased although the actual coding rates of the respective codes are decreased. However, most of the codes decrease in performance. In Rule 3, the actual coding rate of the respective codes becomes (9,3) or (21,7), thus satisfying performance of the TFCI codewords with an actual data rate ⅓ for the case of condition A1. However, the increase in number of the TFCI symbols causes a decrease in performance of the code for which the coded symbols have increased in number, although it was intended to increase performance of the first TFCI or the second TFCI. Rule 3 can search for the arbitrary symbols, which do not decrease the performance of the codes. Like Rule 2, Rule 3 also has a complex mapping method. In order to simplify the mapping method, the last two symbols among the coded symbols output from the encoder having the increased number of coded symbols are mapped to $d_{30}(b_{30})$ and $d_{31}(b_{31})$.

A description of Rule 4 will be made below with reference to an example. A (23,7) code and a (9,3) code, or a (21,7) code and a (11,3) code are available according to the information bit ratio of the first TFCI to the second TFCI. The (21,7) code and the (11,3) code are used to increase the coding rate of the second TFCI, while the (23,7) code and the (9,3) code are used to increase the coding rate of the first TFCI. When Rule 4 is applied, the last two coded symbol of the (23,7) code is not transmitted, so an actual coding rate of the (23,7) code becomes (21,7) and the coding rate of the (9,3) code remains unchanged; and the last two coded symbol of the (21,7) code is not transmitted, so an actual coding rate of the (21,7) code becomes (19,7) and the coding rate of the (11,3) code remains unchanged. When Rule 4 is applied, the encoder having the large number of codewords maps the last two symbols or arbitrary two symbols from the respective encoders to $d_{30}(b_{30})$ and $d_{31}(b_{31})$. In Rule 4, two coded symbols of the code having a longer codeword are not transmitted, so performance of the code having the longer codeword is reduced, but performance of the code having the shorter codeword is secured.

A description of Rule 5 will be made below with reference to an example. If it is assumed that the information bit rate of the first TFCI to the second TFCI is 3:7 and performance of the codeword transmitting the second TFCI is increased, then a (9,3) code and a (23,7) code are available. In Rule 5, in order to transmit the second TFCI at high reliability, two arbitrary coded symbols of the (9,3) code are mapped to $d_{30}(b_{30})$ and $d_{31}(b_{31})$, so the actual coding rate becomes (7,3). In Rule 5, performance of a first TFCI encoder is reduced, but coded symbols for the second TFCI are not damaged, so it is possible to safely transmit the second TFCI codeword.

In the foregoing description of Rule 1, Rule 2, Rule 3 and Rule 4, the $a_k$ bits are mapped to the $b_l$ bits only in condition A1. However, in condition A2, A3 and A4, all of the 32 coded symbols are transmitted or the 32 coded symbols are transmitted through repetition, so a separate mapping rule is not required and the intact mapping rules used for condition A1 can be used. In addition, Rule 1, Rule 2, Rule 3, Rule 4, and Rule 5 can be properly used according to circumstances.

The present invention provides a method of mapping the $a_k$ bits to the $b_l$ bits by way of example. In the following example, a first TFCI encoder and a second TFCI encoder, i.e., {(3,1) encoder and (29,9) encoder}, {(6,2) encoder and (26,8) encoder}, {(9,3) encoder and (23,7) encoder}, {(12,4) encoder and (20,6) encoder}, {(18,6) encoder and (14,4) encoder}, {(21,7) encoder and (11,3) encoder}, {(24,8) encoder and (8,2) encoder}, {(27,9) encoder and (5,1) encoder} and (32,10), map the last two coded symbols of the second TFCI encoder to $d_{30}(b_{30})$ and $d_{31}(b_{31})$. In addition, since the conventional (16,5) encoder used in the 3GPP can equally operate, the last two coded symbols of the (16,5) encoder are also mapped to $d_{30}(b_{30})$ and $d_{31}(b_{31})$ and the last two encoded symbols of the (32,10) encoder are also mapped to $d_{30}(b_{30})$ and $d_{31}(b_{31})$.

When the second TFCI encoder is used in condition A1, all of the 9 available encoders have an actual coding rate of ⅓. However, the 9 encoders proposed by the invention, though they have the coding rate ⅓, are designed to have optimal performance at the coding rate ⅓. In addition, even in the method of increasing the number of coded symbols for the first TFCI, the encoder is designed to have optimal performance at the actual coding rate ⅓, though two coded symbols are not transmitted.

Before a description of the method of mapping the information bits $a_{la}$ to the coded bits $b_l$, it will be assumed that the sum of m TFCI bits for the DCH (i.e., first TFCI bits) and n TFCI bits for the DSCH (i.e., second TFCI bits) becomes m+n=10. In addition, as stated above, it is assumed that the last coded symbols of the second TFCI encoder are mapped to $d_{30}(b_{30})$ and $d_{31}(b_{31})$, and the (16,5) encoder maps the last coded symbols to $d_{30}(b_{30})$ and $d_{31}(b_{31})$ at the respective encoders. The present invention will be described for the m:n ratios of 1:9, 2:8, 3:7, 4:6, 5:5, 6:4, 7:3, 8:2, and 9:1. The (32,10) encoder sequentially arranges the coded symbols.

First, a description will be made of a case where the m value is larger than the n value. Even when the n value is larger than the m value, it is possible to arrange the TFCI coded symbols for the DCH and the TFCI coded symbols for the DSCH in the following manner by exchanging the n value and the m value.

In the coding method described herein above, the numbers of coded bits created by coding the m TFCI bits for the DCH and the 11 TFCI bits for the DSCH are (m*3) and (n*3+2), respectively. Therefore, in order to select the positions for transmitting the created coded symbols, the conditions A1, A2, A3, and A4 use different methods. In condition A1, the last coded symbols of the second TFCI encoder are mapped to $d_{30}(b_{30})$ and $d_{31}(b_{31})$, 30 $b_l$ bits are divided by 10, and then, m coded symbols determined by dividing the m*3 coded symbols for the first TFCI encoder into 3 equal parts and n coded symbols determined by dividing the n*3 coded symbols for the second TFCI encoder excepting the last two coded symbols into 3 equal parts are arranged. In condition A2, the 32 $b_l$ bits arranged in condition A1 are sequentially repeated 3 times, and then repeated once more from $b_0$ to $b_{23}$ thus to map them to a total of 120 $d_m$ bits. In condition A3, the 32 $b_l$ bits arranged in condition A1 are mapped to the $d_m$ bits during transmission. In condition A4, the 32 $b_l$ bits arranged in condition A1 are repeated 4 times and mapped to 128 $d_m$ bit positions during transmission. Therefore, in condition A1, the present invention provides a method of mapping the coded symbols to the $b_l$ bits. In condition A2, A3, and A4, the invention provides a method of mapping the coded symbols using the $b_l$ bits arranged in condition A1.

A description will be made of a method for arranging the m coded symbols for the DCH and the n coded symbols for the DSCH to 10 coded symbol positions.

Let L indicate an $L^{th}$ coded symbol of the 10 coded symbols.

$$F(k) = \left\lfloor \frac{m}{n} * k \right\rfloor, k = 0, 1, 2, \ldots, n \quad (5)$$

$$G(k) = \left\lceil \frac{F(k) - F(k-1)}{2} \right\rceil, k = 0, 1, 2, \ldots, n \quad (6)$$

In Equations (5) and (6), $\lfloor x \rfloor$ indicates a maximum value among the integers smaller than or equal to a given value x, and $\lceil x \rceil$ indicates a minimum value among the integers larger than or equal to the given value x.

In Equation (6), F(−1) is defined as zero (0). That is, F(−1) =0. A method for arranging the m bits for the DCH and the n bits for the DSCH using the above formulas is defined by Equation (7). The bits for the DSCH are sequentially arranged to n L values among the 10 L values.

$$L=F(l-1)+G(l)+l \quad (7)$$

In Equation (7), l (1≦l≦n) indicates an $l^{th}$ bit among the n bits for the DSCH. Therefore, Equation (7) is used in calculating a value corresponding to the $l^{th}$ position among the 10 bits for the DSCH.

The in bits for the DCH are arranged to L values other than the values given by Equation (7) among the 10 L values. This is defined by Equation (8).

$$F(l-2)+G(l-1)+l≦L≦F(l-1)+G(l)+l-1 \quad (8)$$

Table 10 below illustrates F(k) and G(k) for the respective cases of m:n=9:1, 8:2, 7:3, 6:4 and 5:5. In Table 10, coded symbol positions of the DSCH have a value (l−1) at $b_l$. In condition A1, the present invention maps two $b_l$ bits to two $d_m$ bits before transmission over one time slot. The positions defined in Table 10 are repeated 3 times at the $b_l$ bits divided by 10, and after the repetition, the last two coded symbols of the second TFCI encoder are mapped to the last two bits $b_{30}$ and $b_{31}$.

TABLE 10

| | F(k) | | | | |
|---|---|---|---|---|---|
| | F(1) | F(2) | F(3) | F(4) | F(5) |
| | | | G(k) | | |
| | G(1) | G(2) | G(3) | G(4) | G(5) |
| m:n | | | DSCH Position | | |
| 5:5 | 1 | 2 | 3 | 4 | 5 |
| | 1 | 1 | 1 | 1 | 1 |
| | 2 | 4 | 6 | 8 | 10 |
| 6:4 | 1 | 3 | 4 | 6 | |
| | 1 | 1 | 1 | 1 | |
| | 2 | 4 | 7 | 9 | |
| 7:3 | 2 | 4 | 7 | | |
| | 1 | 1 | 1 | | |
| | 2 | 5 | 8 | | |
| 8:2 | 4 | 8 | | | |
| | 2 | 2 | | | |
| | 3 | 8 | | | |
| 9:1 | 9 | | | | |
| | 4 | | | | |
| | 5 | | | | |

FIG. 6 is a diagram illustrating how to match 18 TFCI coded symbols for the DCH and 14 TFCI coded symbols for the DSCH to a 30-bit TFCI field of the DPCCH, for m:n=6:4, in condition A1. As illustrated in Table 10, for m:n=6:4, the positions of the DSCH correspond to the case where the L values are 2, 4, 7 and 9. That is, $d_1(b_1)$, $d_3(b_3)$, $d_6(b_6)$, $d_8(b_8)$, $d_{11}(b_{11})$, $d_{13}(b_{13})$, $d_{16}(b_{16})$, $d_{18}(b_{18})$, $d_{21}(b_{21})$, $d_{23}(b_{23})$, $d_{26}(b_{26})$ and $d_{28}(b_{28})$ are transmitted.

The multiplexed TFCI coded symbols are then applied to a multiplexer 420 as illustrated in FIG. 4, where they are time-multiplexed with transport power control (TPC) bits, pilot bits and physical information.

FIG. 7 illustrates a frame structure of the DPCCH transmitted from the Node B to the UE, in which the top part illustrates a structure of a time slot, the intermediate part illustrates a structure of a radio frame, and the bottom part illustrates a structure of the consecutively transmitted radio frames. The multiplexed DPCCH is multiplexed with the DPDCH into DPCH on a time-division basis as illustrated in FIG. 7. A spreader 430 channel-spreads the multiplexed symbols with a spreading code provided from a spreading code generator 435 in a symbol unit for channelization, and outputs the channel-spread signals in a chip unit. A scrambler 440 scrambles the channel-spread signals with a scrambling code provided from a scrambling code generator 445.

B2. Structure and Operation of Receiver

A description will now be made of a receiver corresponding to the transmitter that performs encoding at a variable coding rate in transmitting TFCI bits for the DSCH and TFCI bits for the DCH in a specific ratio. The receiver includes a decoder for decoding received symbols encoded at the variable coding rate.

FIG. 8 illustrates a structure of a receiver, corresponding to the transmitter of FIG. 4, according to an embodiment of the present invention. Referring to FIG. 8, a downlink DPCH transmitted from the Node B to the UE is descrambled by a descrambler 840 with a scrambling code provided from a scrambling code generator 845. The descrambled downlink DPCH is despread by a despreader 830 with a spreading code provided from a despreading code generator 835 in a symbol unit. The despread DPCH symbols are demultiplexed by a demultiplexer 820 into DPDCH, TPC bits, pilot bits, and TFCI coded symbols. The TFCI coded symbols are demultiplexed again by a demultiplexer 810 into coded TFCI symbols for the DSCH and coded TFCI symbols for the DCH depending on code length control information, based on an information bit ratio of the TFCI bits for the DSCH to the TFCI bits for the DCH, and then, provided to associated decoders 800 and 805, respectively. The decoders 800 and 805 decode the coded TFCI symbols for the DSCH and the coded TFCI symbols for the DCH, respectively, depending on the code length control information based on the information bit ratio of the TFCI bits for the DSCH to the TFCI bits for the DCH, and then output the TFCI bits for the DSCH and the TFCI bits for the DCH, respectively.

A structure and operation of a decoder according to several embodiments of the present invention will be described herein below. The decoders 800 and 805 illustrated in FIG. 8 should be structured to decode the TFCI coded symbols for the DSCH and the TFCI coded symbols for DCH, encoded at the various coding rates.

First Embodiment

Decoder

FIG. 9 illustrates a detailed structure of the decoders 800 and 805 of FIG. 8. Referring to FIG. 9, received symbols r(t) are provided to the zero inserter 900, and at the same time, code length information is provided to the controller 930. The controller 930 determines puncturing positions based on the code length information, and provides control information for the determined puncturing positions to the zero inserter 900.

The code length information indicates the code length or the coding rate used in the encoder, while the control information indicates the puncturing positions. The puncturing positions represent the positions of the symbols pruned to obtain a desired coded symbol length corresponding to the bits received from the encoder. Table 11 illustrates the puncturing positions stored in association with the code lengths.

TABLE 11

| Code Length Info (Coding Rate) | Puncturing Position |
|---|---|
| (3,1) | F_29 |
| (5,1) | F_27 |
| (6,2) | F_26 |
| (8,2) | F_24 |
| (9,3) | F_23 |
| (11,9) | F_21 |
| (12,4) | F_20 |
| (14,4) | F_18 |
| (18,6) | F_14 |
| (20,6) | F_12 |
| (21,7) | F_11 |
| (23,7) | F_9 |
| (24,8) | F_8 |
| (26,8) | F_6 |
| (27,9) | F_5 |
| (29,9) | F_3 |

It is assumed in Table 11 that the code length information indicates the coding rate used in the encoder. As a coding rate (k,n) indicates that n input bits are coded into k symbols, the received symbols have a coding length k. Further, F_n of Table 11 represents n puncturing positions. As can be determined from Table 11, the control information (puncturing position) enables the zero inserter 900 to maintain the number (32) of output symbols regardless of the code length of the received symbols.

Referring to Table 11, the controller 930 outputs information on 29 puncturing positions for a coding rate (3,1), information on 27 puncturing positions for a coding rate (5,1), information on 26 puncturing positions for a coding rate (6,2), information on 24 puncturing positions for a coding rate (8,2), information on 23 puncturing positions for a coding rate (9,3), information on 21 puncturing positions for a coding rate (11,9), information on 20 puncturing positions for a coding rate (12,4), information on 18 puncturing positions for a coding rate (14,4), information on 14 puncturing positions for a coding rate (18,6), information on 12 puncturing positions for a coding rate (20,6), information on 11 puncturing positions for a coding rate (21,7), information on 9 puncturing positions for a coding rate (23,7), information on 8 puncturing positions for a coding rate (24,8), information on 6 puncturing positions for a coding rate (26,8), information on 5 puncturing positions for a coding rate (27,9) and information on 3 puncturing positions for a coding rate (29,9). For the respective cases, the puncturing positions are the same as given in the description of the encoders.

The zero inserter 900 inserts 0's in the puncturing positions of the received symbols according to the control information, and then outputs a symbol stream of length 32. The symbol stream is provided to an inverse fast Hadamard transformer (IFHT) 920 and multipliers 902, 904, and 906. The symbol stream provided to the multipliers 902, 904, and 906 are multiplied by mask functions M1, M2, and M15 generated from the mask generator 910, respectively. The output symbols of the multipliers 902, 904, and 906 are provided to switches 952, 954, and 956, respectively. At this moment, the controller 930 provides the switches 952, 954, and 956 with switch control information indicating use/nonuse of the mask functions based on the code length information. For example, as (3,1), (5,1), (6,2), (8,2), (9,3), (11,3), (12,4), (14,4), (18,6), and (20,6) encoders do not use the mask functions, the switches 952, 954, and 956 are all disconnected according to the switch control information. However, as (21,7) and (23,7) encoders use one basis mask function, only the switch 952 is connected. In this manner, the controller 930 controls the switches 952, 954, and 956 according to the number of the mask functions used based on the coding rate. Then, the IFHTs 920, 922, 924, and 926 each perform inverse fast Hadamard transfer on 32 symbols received from the zero inserter 900, and calculate correlations between the symbols and all the Walsh codes that can be used in the transmitter. Further, the IFHTs determine a highest correlation among the correlations, and an index of the Walsh code having the highest correlation. Therefore, the IFHTs 920, 922, 924, and 926 each provide the correlation comparator 940 with an index of the mask function multiplied by the received signal, the highest correlation, and an index of the Walsh code having the highest correlation. Since the signal provided to the IFHT 920 is multiplied by none of the mask functions, an identifier of the mask function becomes '0'. The correlation comparator 940 determines the highest correlation by comparing the correlations provided from the IFHTs, and combines an index of a mask function having the highest correlation with an index of the Walsh code.

Second Embodiment

Decoder

A decoder for adaptively performing a decoding operation according to the code with a variable length used in the encoder will be described.

First, a description will be made of an IFHT required when the decoder functions as a decoder corresponding to a Walsh encoder having a variable length. When the decoder operates in association with a (6,2) encoder and a (8,2) encoder, an IFHT for a Walsh encoder with a length 4 ($=2^2$) is used. When the decoder operates in association with a (9,3) encoder and a (11,3) encoder, an IFHT for a Walsh encoder with a length 8 ($=2^3$) is used. When the decoder operates in association with a (12,4) encoder and a (14,4) encoder, an IFHT for a Walsh encoder with a length 16 ($=2^4$) is used. When the decoder operates in association with a (16,5) encoder, an IFHT for a Walsh encoder with a length 32 ($=2^5$) is used. Also, when the decoder operates in association with (18,6), (20,6), (21,7), (23,7), (24,8), (26,8), (27,9), (29,9), and (32,10) encoders, an IFHT for a Walsh encoder with a length 32 ($=2^5$) is used. In order to operate in the decoder, the IFHT should be able to operate for a variable length. The present invention provides a structure of an IFHT operable for a variable length.

Before a detailed description of an IFHT according to an embodiment of the present invention is given, an operation of a general IFHT will be described with reference to FIG. 10.

FIG. 10 illustrates an operation of a general IFHT for a Walsh encoder with a length 8. In general, an IFHT for a Walsh encoder with a length $2^n$ includes n stages. In each stage, the IFHT performs a process of adding or subtracting 2 input signals received in association with one row.

Referring to FIG. 10, a stage #1 receives input signals r1, r2, r3, r4, r5, r6, r7, and r8, and then performs addition and subtraction on two adjacent input signals. In a first row, the stage #1 calculates correlations between Walsh codes of length 2 by performing addition and subtraction on the signals r1 and r2. In the same manner, the stage #1 outputs r3+r4 and r3−r4 for r3 and r4; r5+r6 and r5−r6 for r5 and r6; and r7−r8 and r7−r8 for r7 and r8. The 8 output signals of stage #1 are provided to a stage #2. The stage #2 outputs (r1+r2)+(r3+r4) by adding r1+r2 and r3+r4, and (r1−r2)+(r3−r4) by adding r1−r2 and r3−r4. Further, the stage #2 outputs (r1+r2)−(r3+r4) by subtracting r3+r4 from r1+r2, and (r1−r2)−(r3−r4) by subtracting r3−r4 from r1−r2. The stage #2 calculates correlations among Walsh codes of length 4 based on the 4 outputs. In addition, the stage #2 outputs (r5+r6)+(r7+r8) by adding r5+r6 and r7+r8, and (r5−r6)+(r7−r8) by adding r5 r6 and r7−r8. Further, the stage #2 outputs (r5+r6)−(r7+r8) by subtracting r7+r8 from r5+r6, and (r5−r6)−(r7−r8) by subtracting r7−r8 from r5−r6. The 8 output signals of stage #2 are provided to a stage #3 where it calculates all the correlations among the Walsh codes of length 8 by performing the same operations as performed in the stage #1 and the stage #2.

For example, an operation of outputting all the correlations among the Walsh codes of length $2^i$ by receiving signals of length $2^n$ can be generalized as follows.

$2^n$ operation signals $t_1$-$t_n$ output from a stage #(i−1) of the IFHT are applied to a stage #i. The $2^n$ operation signals $t_1$-$t_n$, are grouped into $2^{n-i}$ blocks in a reception order, each block having $2^i$ operation signals. That is, a first block is comprised of operation signals $t_1$ to $t_i$, and a second block is comprised of operation signals $t_{i+1}$ to $t_{2i}$. In this way, a final $(2^{n-i})^{th}$ block is comprised of operation signals $t_{n-i}$ to $t_n$. For the operation signals constituting the respective blocks, operation signals corresponding to a desired correlation are provided through a specified operation process. The specified operation process includes a step of adding a $k^{th}$ operation signal among the operation signals constituting one block to its associated $(k+2^{i-1})^{th}$ operation signal and a step of subtracting the $(k+2^{i-1})^{th}$ operation signal from the $k^{th}$ operation signal.

When the stage #i outputs $2^n$ operation signals $t'_1$-$t'_n$, through the inverse fast Hadamard transform operation, first $2^i$ consecutive operation signals $t'_1$-$t'_i$ among the $2^n$ operation signals $t'_1$-$t'_n$ become desired correlation values. That is, it is noted that all correlations between the first $2^i$ input signals $t_1$-$t_i$ out of the $2^n$ input signals $t_1$-$t_n$, and Walsh codes of length $2^i$ are sequentially output.

For example, if it is assumed that the first input signals are r1, r2, r3, r4, r5, r6, r7, and r8, n=3, and i=2, then the operation signals input to the stage #i can be defined as "r1+r2", "r1−r2", "r3+r4", "r3−r4", "r5+r6", "r5−r6", "r7+r8", and "r7−r8". The input operation signals are grouped into $2^{n-i}=2$ blocks in the reception order, each block including $2^i=2^2=4$ input signals. Therefore, the first block is comprised of "r1+r2", "r1−r2", "r3+r4", and "r3−r4", and the second block is comprised of "r5+r6", "r5−r6", "r7+r8", and "r7−r8". By adding and subtracting the $k^{th}$ operation signal and the $(k+2^{i-1})^{th}$ operation signal in each block, outputs 4 operation signals are output by each block. For example, if k=1, a first operation signal "r1+r2" is added to and subtracted by the $(k+2^{i-1})^{th}$ signal, i.e., a third operation signal "r3+r4", thus outputting two operation signals "r1+r2" and "r1−r2". As a result, "(r1+r2)+(r3+r4)", "(r1+r2)−(r3+r4)", "(r1−r2)+(r3−r4)", and "(r1−r2)−(r3−r4)" are output by "r1+r2", "r1−r2", "r3+r4", and "r3−r4" constituting the first block, and "(r5+r6)+(r7+r8)", "(r5+r6)−(r7+r8)", "(r5−r6)+(r7−r8)", and "(r5−r6)−(r7−r8)" are output by "r5+r6", "r5−r6", "r7+r8", and "r7−r8" constituting the second block. However, among the 8 output operation signals, only the 4 operation signals "(r1+r2)+(r3+r4)", "(r1+r2)−(r3+r4)", "(r1−r2)+(r3−r4)", and "(r1−r2)−(r3−r4)" output by the first block become correlation values by the inverse fast Hadamard transform of the stage #i.

FIG. 11 illustrates a structure of the first and second decoders 800 and 805 illustrated in FIG. 8. Referring to FIG. 11, coded symbols r(t) received from the encoder are provided to a zero inserter 1100, and at the same time, information on a code length used by the encoder in encoding the received symbols is provided to a controller 1130. The controller 1130 stores information on puncturing positions in association with the code lengths available for the encoder, and provides control information stored therein in association with the code length information to the zero inserter 1100. The puncturing positions stored in association with the code lengths are illustrated in Table 11 above.

Referring to Table 11, the controller 1130 outputs information on 29 puncturing positions for a coding rate (3,1), information on 27 puncturing positions for a coding rate (5,1), information on 26 puncturing positions for a coding rate (6,2), information on 24 puncturing positions for a coding rate (8,2), information on 23 puncturing positions for a coding rate (9,3), information on 21 puncturing positions for a coding rate (11,9), information on 20 puncturing positions for a coding rate (12,4), information on 18 puncturing positions for a coding rate (14,4), information on 14 puncturing positions for a coding rate (18,6), information on 12 puncturing positions for a coding rate (20,6), information on 11 puncturing positions for a coding rate (21,7), information on 9 puncturing positions for a coding rate (23,7), information on 8 puncturing positions for a coding rate (24,8), information on 6 puncturing positions for a coding rate (26,8), information on 5 puncturing positions for a coding rate (27,9) and information on 3 puncturing positions for a coding rate (29,9). For the respective cases, the puncturing positions are the same as given in the description of the encoders.

The zero inserter 1100 inserts 0's in the puncturing positions of the received symbols according to the control information from the controller 1130, and then, outputs a symbol stream of length 32. The symbol stream is provided to an inverse fast Hadamard transformer (IFHT) 1120 and multipliers 1102, 1104, and 1106. The signals provided to the multipliers 1102, 1104, and 1106 are multiplied by mask functions M1, M2, and M15 generated from the mask generator 1110, respectively. The mask functions generated by the mask generator 1110 are identical to the mask functions used in the encoders. The output symbols of the multipliers 1102, 1104, and 1106 are provided to switches 1152, 1154, and 1156, respectively. At this moment, the controller 1130 provides the switches 1152, 1154, and 1156 with switch control information indicating use/nonuse of the mask functions based on the received code length information. As a result, the switches 1152, 1154, and 1156 pass the output symbols of the multipliers 1102, 1104, and 1106, respectively. For example, as the mask functions are not used at the coding rates (3,1), (5,1), (6,2), (8,2), (9,3), (11,3), (12,4), (14,4), (18,6), and (20,6), the switches 1152, 1154, and 1156 are all disconnected according to the switch control information, thus blocking the output symbols of the multipliers 1102, 1104, and 1106. As only one mask symbol is used at the coding rate (21,7) and (23,7), only the switch 1152 is connected according to the switch control information, and the remaining switches 1104 and 1106 are disconnected. In this manner, the number of mask functions in use is determined according to the coding rate and the switches are controlled depending on the determined number of the mask functions in use. Therefore, when the first and second encoders 800 and 805 illustrated in FIG. 8 serve as (3,1), (5,1), (6,2), (8,2), (9,3), (11,3), (12,4), (14,4), (18,6), and (20,6) decoders, only the IFHT 1120 is enabled. The first and second decoders 600 and 605 serve as (3,1), (5,1), (6,2), (8,2), (9,3), (11,3), (12,4), (14,4), (18,6), and (20,6) decoders, when the number of input information bits is less than 6. Therefore, the IFHT 1120 should adaptively operate for several code lengths, i.e., several coding rates. The controller 1130 generates control information indicating a code length of an associated Walsh encoder and provides the control information to the IFHT 1120. Then, the IFHTs 1120, 1124, and 1126 each perform inverse fast Hadamard transform on 32 symbols received from the zero inserter 1100, and calculate correlations between the symbols and Walsh codes having a specific length. The IFHT 1120 provides a correlation comparator 1140 with an index of the mask function, a highest correlation among the correlations, and an index of the Walsh code having the highest correlation. '0' is provided to the correlation comparator 1140 as an index of the mask function by the IFHT 1120. Providing '0' as an index of the mask function means that the input symbols are multiplied by no mask function.

Other IFHTs 1122, 1124, and 1126 perform inverse fast Hadamard transform upon receipt of symbols through associated switches 1152, 1154, and 1156, respectively, and calculate correlations among the inverse Hadamard transformed Walsh codes. After calculating the correlations, the IFHTs 1122, 1124, and 1126 each provide the correlation comparator 1140 with an index of the mask function used, a highest correlation among the correlations, and an index of the Walsh code having the highest correlation. The correlation comparator 1140 then compares the correlations provided from the IFHTs, and combines a mask index having the highest correlation with the Walsh code index.

FIG. 12 illustrates all operation of the IFHT 1120 illustrated in FIG. 1, based on the inverse fast Hadamard transform process described in conjunction with FIG. 10. Specifically, FIG. 12 illustrates an overall scheme for an operation of the IFHT 1120 for the decoders 800 and 805 serving as (3,1), (5,1), (6,2), (8,2), (9,3), (11,3), (12,4), (14,4), (18,6), and (20,6) decoders.

With reference to FIG. 12, a structure and operation of an IFHT capable of variably performing inverse fast Hadamard transform on Walsh codes of up to a maximum length $2^n$ will be described in detail based on the operation characteristic of the IFHT illustrated in FIG. 10.

As soon as $2^t$ input signals are applied to a stage #1 of the IFHT, a length control signal is simultaneously provided to all of switches 1211, 1212, and 1213. The control signal is generated to perform inverse fast Hadamard transform on the $2^t$ input signals only up to a stage #t. Therefore, switches for switching outputs of the stage #1 to a stage #(t−1) switch their outputs to the next stages in response to the control signal. However, a switch for switching an output of the last stage #t is switched to provide its output as a final correlation in response to the control signal, rather than providing the output to a next stage #(t+1).

For example, if t=1, two input signals are applied to the stage #1 1201. The stage #1 performs the same operation as performed in the stage #1 of FIG. 10, thus outputting 2 operation signals. The operation signals are provided to the switch 1211 for switching the outputs of the stage #1 120 to the stage #2 1202. In this case, the switch 1211 outputs the operation signals as correlations between the two input signals in response to the control signal, rather than providing the operation signals to the stage #2 1202.

Meanwhile, if t=3 as illustrated in FIG. 10, eight operation signals output from the stage #1 1202 are applied to the stage #2 1202 by the switch 1211 in response to the control signal. The stage #2 1202 performs the same operation as performed in the stage #2 12 or of FIG. 10 on the 8 operation signals received, thus outputting 8 operation signals. The operation signals output from the stage #2 1202 are applied to a stage #3 1203 by the switch 1212 in response to the control signal. The stage #3 1203 performs the same operation as performed in the stage #3 of FIG. 10 on the 8 operation signals received. The 8 operation signals output from the stage #3 1203 are provided to a switch 1213. In this case, the switch 1213 outputs the operation signals as correlations among the 8 operation signals in response to the control signal, rather than providing the operation signals to a stage #4.

Figure 13:
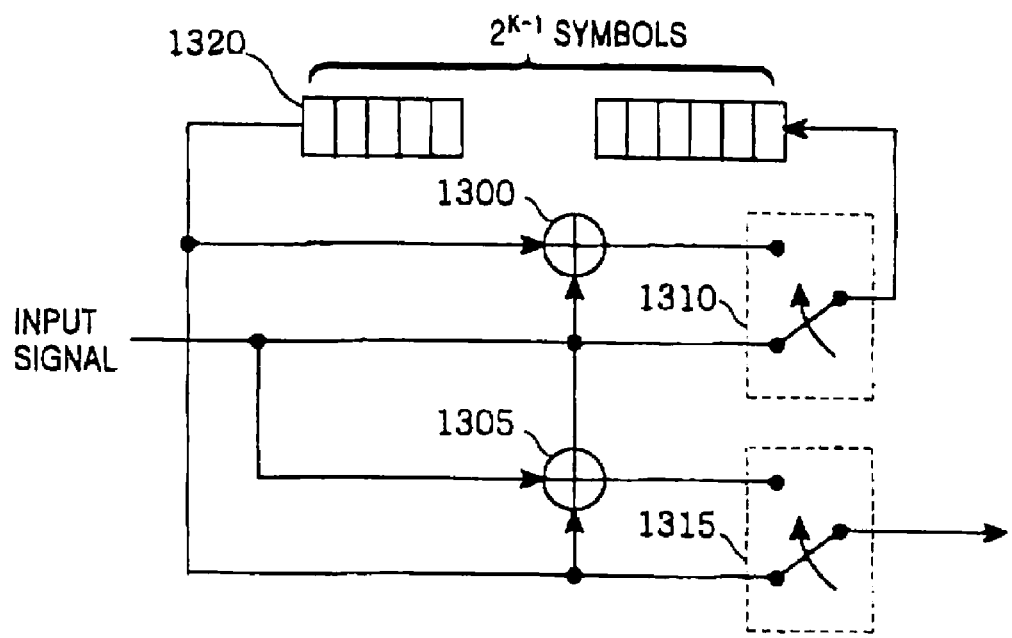
FIG. 13 illustrates a detailed structure of the device used in each stage of FIG. 12.

FIG. 13 illustrates a hardware structure of a stage #k as illustrated in FIG. 12 according to an embodiment of the present invention. Referring to FIG. 13, a subtracter 1300 subtracts an input symbol from an output symbol of a memory 1320. An adder 1305 adds the input symbol to the output symbol of the memory 1320. A first switch 1310 switches the input symbol or an output symbol of the subtracter 1300 to an input end of the memory 1320 in response to a control signal. A second switch 1315 switches the output symbol of the memory 1320 or an output symbol of the adder 1305 to the input end of the memory 1320 in response to the control signal. The memory 1320 can be realized with a buffer having a specific length, and sequentially stores as many symbols as its length, received from the first switch 1310. The length of the memory 1320 is determined depending on the number of symbols constituting the input signal.

In operation, a first symbol among $2^k$ symbols constituting the input signal is initially applied to the subtracter 1300, the adder 1305 and the first switch 1310. In this state, the first switch 1310 is switched to a node to which the input symbol is applied, and thus provides the input symbol to the memory 1320. Further, an output node of the memory 1320 is connected to a final output node by the second switch 1315. Next, when a second symbol is input to the stage #k, the input symbol is applied to the subtracter 1300, the adder 1305 and the first switch 1310. Then, the first switch 1310 is switched to the node to which the input symbol is applied. As a result, the first input symbol previously stored in the memory 1320 is shifted to a next memory area, and at the same time, the second input symbol is stored in the memory area where the first input symbol was previously stored. When a $(2^{k-1}+1)^{th}$ input symbol is received after $2^{k-1}$ input symbols are stored in the memory 1320 in this manner, the $(2^{k-1}+1)^{th}$ input symbol is provided to the subtracter 1300, the adder 1305 and the first switch 1310. Then, the first switch 1310 is switched to the subtracter 1300, and the second switch 1315 is switched to the adder 1305. Further, the first input symbol stored in the memory 1320 is provided to the subtracter 1300, the adder 1305, and the second switch 1315. At the same time, the $2^{k-1}$ input symbols stored in the memory 1320 are shifted left by one symbol. The subtracter 1300 then subtracts the $(2^{k-1}+1)^{th}$ new input symbol from the first input symbol output from the memory 1320, and provides its output symbol to the memory 1320 through the first switch 1310. At the same time, the adder 1305 adds the first input symbol received from the memory 1320 to the $(2^{k-1}+1)^{th}$ new input symbol, and provides its output symbol to the final output node through the second switch 1315. When a $(2^k+1)^{th}$ input symbol is received after the above operation has been performed $2^{k-1}$ times, the $(2^k+1)^{th}$ new input symbol is provided to the subtracter 1300, the adder 1305, and the first switch 1310. At the same time, the second switch 1315 is switched to the memory 1320, and the first switch 1310 is switched to the input signal node. As a result, a symbol determined by subtracting the $(2^{k-1}+1)^{th}$ input symbol from the first input symbol provided from the memory 1320 is output through the second switch 1315. At the same time, the symbols stored in the memory 1320 are shifted left by one symbol, and the $(2^k+1)^{th}$ new input symbol is provided to the rightmost memory area of the memory 1320 through the first switch 1310. The input symbols are stored as many symbols as the buffer length by repeating the above process, thus completing an operation of the stage #k.

As described above, the embodiment of the present invention can encode/decode various types of the TFCI bits using a single encoder/decoder structure with plurality of puncturing pattern. And the embodiment of the present invention can provide the solution that the existing TFCI encoder (32,10) can generate plurality of encoding by using plurality of puncturing pattern. In addition, the embodiment multiplexes the TFCI symbols encoded in the different coding techniques, such that the TFCI symbols should be uniformly distributed before being transmitted. For the 10 input information bits, the TFCI coding is performed in a selected one of the ratios of 1:9, 2:8, 3:7, 4:6, 5:5, 6:4, 7:3, 8:2, and 9:1 depending on the type and characteristic of the data transmitted over the DSCH and the DCH, thus contributing to flexibility of the HSM that is superior to the LSM in terms of signaling and time delay.

While the invention has been shown and described with reference to a certain preferred embodiment thereof, it will be understood by those skilled in the art that various changes in form and details may be made therein without departing from the spirit and scope of the invention as defined by the appended claims. As we describe two encoders according to the TFCI bits ratio, but only one encoder can generate all described coding case in different time.

What is claimed is:

1. An encoding method for a first encoder and a second encoder in a transmission apparatus for a mobile communication system including the first encoder for encoding k bits among 10 input Transport Format Combination Indicator (TFCI) bits and the second encoder for encoding remaining (10−k) bits among the input TFCI bits, comprising the steps of:

generating, by the first encoder, a first coded bit stream by encoding the k input bits into 32 bits, and outputting a 3k-bit stream by puncturing the first coded bit stream according to a specific mask pattern corresponding to a value of k; and generating, by the second encoder, a second coded bit stream by encoding the (10−k) input bits into 32 bits, and outputting a {3*(10−k)+2}-bit stream by puncturing the second coded bit stream according to a specific mask pattern corresponding to a value of (10−k).

2. The encoding method of claim 1, wherein the k value ranges from 1 to 10.

3. The encoding method of claim 2, wherein if the k value is 1, the specific mask pattern includes $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

4. The encoding method of claim 3, wherein if the (10−k) value is 9, the specific mask pattern includes $6^{th}$, $10^{th}$, and $11^{th}$ coded bits.

5. The encoding method of claim 2, wherein if the k value is 2, the specific mask pattern includes $3^{rd}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

6. The encoding method of claim 5, wherein if the (10−k) value is 8, the specific mask pattern includes $7^{th}$, $13^{th}$, $15^{th}$, $20^{th}$, $25^{th}$, and $30^{th}$ coded bits.

7. The encoding method of claim 2, wherein if the k value is 3, the specific mask pattern includes $7^{th}$, $8^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

8. The encoding method of claim 7, wherein if the (10−k) value is 7, the specific mask pattern includes $3^{rd}$, $8^{th}$, $9^{th}$, $12^{th}$, $16^{th}$, $18^{th}$, $23^{rd}$, $24^{th}$, and $30^{th}$ coded bits.

9. The encoding method of claim 2, wherein if the k value is 4, the specific mask pattern includes $0^{th}$, $1^{st}$, $2^{nd}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

10. The encoding method of claim 9, wherein if the (10−k) value is 6, the specific mask pattern includes $10^{th}$, $12^{th}$, $13^{th}$, $14^{th}$, $19^{th}$, $20^{th}$, $21^{st}$, $23^{rd}$, $24^{th}$, $27^{th}$, $28^{th}$, and $31^{st}$ coded bits.

11. The encoding method of claim 2, wherein if the k value is 6, the specific mask pattern includes $0^{th}$, $7^{th}$, $9^{th}$, $11^{th}$, $16^{th}$, $19^{th}$, $24^{th}$, $25^{th}$, $26^{th}$, $27^{th}$, $28^{th}$, $29^{th}$, $30^{th}$, and $31^{st}$ coded bits.

12. The encoding method of claim 11, wherein if the (10−k) value is 4, the specific mask pattern includes $0^{th}$, $1^{st}$, $2^{nd}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

13. The encoding method of claim 2, wherein if the k value is 7, the specific mask pattern includes $0^{th}$, $1^{st}$, $2^{nd}$, $3^{rd}$, $4^{th}$, $5^{th}$, $7^{th}$, $12^{th}$, $18^{th}$, $21^{st}$, and $24^{th}$ coded bits.

14. The encoding method of claim 13, wherein if the (10−k) value is 3, the specific mask pattern includes $7^{th}$, $8^{th}$, $9^{th}$, $10^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

15. The encoding method of claim 2, wherein if the k value is 8, the specific mask pattern includes $1^{st}$, $7^{th}$, $13^{th}$, $15^{th}$, $20^{th}$, $25^{th}$, $30^{th}$, and $31^{st}$ coded bits.

16. The encoding method of claim 15, wherein if the (10−k) value is 2, the specific mask pattern includes $3^{rd}$, $7^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

17. The encoding method of claim 2, wherein if the k value is 9, the specific mask pattern includes $0^{th}$, $2^{nd}$, $8^{th}$, $19^{th}$, and $20^{th}$ coded bits.

18. The encoding method of claim 17, wherein if the (10−k) value is 1, the specific mask pattern includes $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

19. An apparatus for encoding two TFCI (Transport Format Combination Indicator) bit streams separated into k bits and (10−k) bits according to an information bit ratio of 10 input TFCI bits in a mobile communication system, the apparatus comprising:
a first encoder for generating a first coded bit stream by encoding the k input bits into 32 bits, and outputting a 3k-bit stream by puncturing the first coded bit stream according to a specific mask pattern corresponding to a value of k; and
a second encoder for generating a second coded bit stream by encoding the (10−k) input bits into 32 bits, and outputting a {3*(10−k)+2}-bit stream by puncturing the second coded bit stream according to a specific mask pattern corresponding to a value of (10−k).

20. The apparatus of claim 19, wherein the k value ranges from 1 to 10.

21. The apparatus of claim 20, wherein if the k value is 1, the specific mask pattern includes $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

22. The apparatus of claim 21, wherein if the (10−k) value is 9, the specific mask pattern includes $6^{th}$, $10^{th}$, and $11^{th}$ coded bits.

23. The apparatus of claim 20, wherein if the k value is 2, the specific mask pattern includes $3^{rd}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

24. The apparatus of claim 23, wherein if the (10−k) value is 8, the specific mask pattern includes $7^{th}$, $13^{th}$, $15^{th}$, $20^{th}$, $25^{th}$, and $30^{th}$ coded bits.

25. The apparatus of claim 20, wherein if the k value is 3, the specific mask pattern includes $7^{th}$, $8^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

26. The apparatus of claim 25, wherein if the (10−k) value is 7, the specific mask pattern includes $3^{rd}$, $8^{th}$, $9^{th}$, $12^{th}$, $16^{th}$, $18^{th}$, $23^{rd}$, $24^{th}$, and $30^{th}$ coded bits.

27. The apparatus of claim 20, wherein if the k value is 4, the specific mask pattern includes $0^{th}$, $1^{st}$, $2^{nd}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

28. The apparatus of claim 27, wherein if the (10−k) value is 6, the specific mask pattern includes $10^{th}$, $12^{th}$, $13^{th}$, $14^{th}$, $19^{th}$, $20^{th}$, $21^{st}$, $23^{rd}$, $24^{th}$, $27^{th}$, $28^{th}$, and $31^{st}$ coded bits.

29. The apparatus of claim 20, wherein if the k value is 6, the specific mask pattern includes $0^{th}$, $7^{th}$, $9^{th}$, $11^{th}$, $16^{th}$, $19^{th}$, $24^{th}$, $25^{th}$, $26^{th}$, $27^{th}$, $28^{th}$, $29^{th}$, $30^{th}$, and $31^{st}$ coded bits.

30. The apparatus of claim 29, wherein if the (10−k) value is 4, the specific mask pattern includes $0^{th}$, $1^{st}$, $2^{nd}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

31. The apparatus of claim 20, wherein if the k value is 7, the specific mask pattern includes $0^{th}$, $1^{st}$, $2^{nd}$, $3^{rd}$, $4^{th}$, $5^{th}$, $7^{th}$, $12^{th}$, $18^{th}$, $21^{st}$, and $24^{th}$ coded bits.

32. The apparatus of claim 31, wherein if the (10−k) value is 3, the specific mask pattern includes $7^{th}$, $8^{th}$, $9^{th}$, $10^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

33. The apparatus of claim 20, wherein if the k value is 8, the specific mask pattern includes $1^{st}$, $7^{th}$, $13^{th}$, $15^{th}$, $20^{th}$, $25^{th}$, $30^{th}$, and $31^{st}$ coded bits.

34. The apparatus of claim 33, wherein if the (10−k) value is 2, the specific mask pattern includes $3^{rd}$, $7^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

35. The apparatus of claim 20, wherein if the k value is 9, the specific mask pattern includes $0^{th}$, $2^{nd}$, $8^{th}$, $19^{th}$, and $20^{th}$ coded bits.

36. The apparatus of claim 35, wherein if the (10−k) value is 1, the specific mask pattern includes $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

37. A method for decoding k first Transport Format Combination Indicator (TFCI) bits and (10−k) second TFCI bits in a reception apparatus for a mobile communication system for receiving a stream of 3k first TFCI bits for a DCH (Dedicated Channel) and a stream of {3*(10−k)+2} second TFCI bits for a DSCH (Downlink Shared Channel), transmitted over a DPCH (Dedicated Physical Channel) from a transmission apparatus in an information bit ratio of 3k bits to {3*(10−k)+2} bits after being multiplexed, comprising the steps of:
outputting a 32-bit stream by inserting 0's in the stream of the 3k first TFCI bits according to a specific mask pattern corresponding to a value of k, and decoding the k first TFCI bits from the 32-bit stream; and
outputting a 32-bit stream by inserting 0's in the stream of the {3*(10−k)+2} second TFCI bits according to a specific mask pattern corresponding to a value of (10−k), and decoding the (10−k) second TFCI bits from the 32-bit stream.

38. The method of claim 37, wherein the k value ranges from 1 to 10.

39. The method of claim 38, wherein if the k value is 1, the specific mask pattern includes $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

40. The method of claim 39, wherein if the (10−k) value is 9, the specific mask pattern includes $6^{th}$, $10^{th}$, and $11^{th}$ coded bits.

41. The method of claim 38, wherein if the k value is 2, the specific mask pattern includes $3^{rd}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

42. The method of claim 41, wherein if the (10−k) value is 8, the specific mask pattern includes $7^{th}$, $13^{th}$, $15^{th}$, $20^{th}$, $25^{th}$, and $30^{th}$ coded bits.

43. The method of claim 38, wherein if the k value is 3, the specific mask pattern includes $7^{th}$, $8^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

44. The method of claim 43, wherein if the (10−k) value is 7, the specific mask pattern includes $3^{rd}$, $8^{th}$, $9^{th}$, $12^{th}$, $16^{th}$, $18^{th}$, $23^{rd}$, $24^{th}$, and $30^{th}$ coded bits.

45. The method of claim 38, wherein if the k value is 4, the specific mask pattern includes $0^{th}$, $1^{st}$, $2^{nd}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

46. The method of claim 45, wherein if the (10−k) value is 6, the specific mask pattern includes $10^{th}$, $12^{th}$, $13^{th}$, $14^{th}$, $19^{th}$, $20^{th}$, $21^{st}$, $23^{rd}$, $24^{th}$, $27^{th}$, $28^{th}$, and $31^{st}$ coded bits.

47. The method of claim 38, wherein if the k value is 6, the specific mask pattern includes $0^{th}$, $7^{th}$, $9^{th}$, $11^{th}$, $16^{th}$, $19^{th}$, $24^{th}$, $25^{th}$, $26^{th}$, $27^{th}$, $28^{th}$, $29^{th}$, $30^{th}$, and $31^{st}$ coded bits.

48. The method of claim 47, wherein if the (10−k) value is 4, the specific mask pattern includes $0^{th}$, $1^{st}$, $2^{nd}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

49. The method of claim 38, wherein if the k value is 7, the specific mask pattern includes $0^{th}$, $1^{st}$, $2^{nd}$, $3^{rd}$, $4^{th}$, $5^{th}$, $7^{th}$, $12^{th}$, $18^{th}$, $21^{st}$, and $24^{th}$ coded bits.

50. The method of claim 49, wherein if the (10−k) value is 3, the specific mask pattern includes $7^{th}$, $8^{th}$, $9^{th}$, $10^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

51. The method of claim 38, wherein if the k value is 8, the specific mask pattern includes $1^{st}$, $7^{th}$, $13^{th}$, $15^{th}$, $20^{th}$, $25^{th}$, $30^{th}$, and $31^{st}$ coded bits.

52. The method of claim 51, wherein if the (10−k) value is 2, the specific mask pattern includes $3^{rd}$, $7^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

53. The method of claim 38, wherein if the k value is 9, the specific mask pattern includes $0^{th}$, $2^{nd}$, $8^{th}$, $19^{th}$, and $20^{th}$ coded bits.

54. The method of claim 53, wherein if the (10−k) value is 1, the specific mask pattern includes $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

55. An apparatus for decoding k first Transport Format Combination Indicator (TFCI) bits and (10−k) second TFCI bits in a reception apparatus for a mobile communication system for receiving a stream of 3k first TFCI bits for a DCH (Dedicated Channel) and a stream of {3*(10−k)+2} second TFCI bits for a DSCH (Downlink Shared Channel), transmitted over a DPCH (Dedicated Physical Channel) from a transmission apparatus in an information bit ratio of 3k bits to {3*(10−k)+2} bits after being multiplexed, the apparatus comprising:

a first decoder for outputting a 32-bit stream by inserting 0's in the stream of the 3k first TFCI bits according to a specific mask pattern corresponding to a value of k, and decoding the k first TFCI bits from the 32-bit stream; and a second decoder for outputting a 32-bit stream by inserting 0's in the stream of the {3*(10−k)+2} second TFCI bits according to a specific mask pattern corresponding to a value of (10−k), and decoding the (10−k) second TFCI bits from the 32-bit stream.

56. The apparatus of claim 55, wherein the k value ranges from 1 to 10.

57. The apparatus of claim 56, wherein if the k value is 1, the specific mask pattern includes $1^{st}$, $3^{rd}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

58. The apparatus of claim 57, wherein if the (10−k) value is 9, the specific mask pattern includes $6^{th}$, $10^{th}$, and $11^{th}$ coded bits.

59. The apparatus of claim 56, wherein if the k value is 2, the specific mask pattern includes $3^{rd}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $20^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

60. The apparatus of claim 59, wherein if the (10−k) value is 8, the specific mask pattern includes $7^{th}$, $13^{th}$, $15^{th}$, $20^{th}$, $25^{th}$, and $30^{th}$ coded bits.

61. The apparatus of claim 56, wherein if the k value is 3, the specific mask pattern includes $7^{th}$, $8^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

62. The apparatus of claim 61, wherein if the (10−k) value is 7, the specific mask pattern includes $3^{rd}$, $8^{th}$, $9^{th}$, $12^{th}$, $16^{th}$, $18^{th}$, $23^{rd}$, $24^{th}$, and $30^{th}$ coded bits.

63. The apparatus of claim 56, wherein if the k value is 4, the specific mask pattern includes $0^{th}$, $1^{st}$, $2^{nd}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

64. The apparatus of claim 63, wherein if the (10−k) value is 6, the specific mask pattern includes $10^{th}$, $12^{th}$, $13^{th}$, $14^{th}$, $19^{th}$, $20^{th}$, $21^{st}$, $23^{rd}$, $24^{th}$, $27^{th}$, $28^{th}$, and $31^{st}$ coded bits.

65. The apparatus of claim 56, wherein if the k value is 6, the specific mask pattern includes $0^{th}$, $7^{th}$, $9^{th}$, $11^{th}$, $16^{th}$, $19^{th}$, $24^{th}$, $25^{th}$, $26^{th}$, $27^{th}$, $28^{th}$, $29^{th}$, $30^{th}$, and $31^{st}$ coded bits.

66. The apparatus of claim 65, wherein if the (10−k) value is 4, the specific mask pattern includes $0^{th}$, $1^{st}$, $2^{nd}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

67. The apparatus of claim 56, wherein if the k value is 7, the specific mask pattern includes $0^{th}$, $1^{st}$, $2^{nd}$, $3^{rd}$, $4^{th}$, $5^{th}$, $7^{th}$, $12^{th}$, $18^{th}$, $21^{st}$, and $24^{th}$ coded bits.

68. The apparatus of claim 67, wherein if the (10−k) value is 3, the specific mask pattern includes $7^{th}$, $8^{th}$, $9^{th}$, $10^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

69. The apparatus of claim 56, wherein if the k value is 8, the specific mask pattern includes $1^{st}$, $7^{th}$, $13^{th}$, $15^{th}$, $20^{th}$, $25^{th}$, $30^{th}$, and $31^{st}$ coded bits.

70. The apparatus of claim 6, wherein if the (10−k) value is 2, the specific mask pattern includes $3^{rd}$, $7^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

71. The apparatus of claim 56, wherein if the k value is 9, the specific mask pattern includes $0^{th}$, $2^{nd}$, $8^{th}$, $19^{th}$, and $20^{th}$ coded bits.

72. The apparatus of claim 71, wherein if the (10−k) value is 1, the specific mask pattern includes $1^{st}$, $3^{rd}$, $5^{th}$, $7^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$, $20^{th}$, $21^{st}$, $22^{nd}$, $23^{rd}$, $24^{th}$, $25^{th}$, $26^{th}$, $27^{th}$, $28^{th}$, $29^{th}$, $30^{th}$, and $31^{st}$ coded bits.

* * * * *

UNITED STATES PATENT AND TRADEMARK OFFICE
CERTIFICATE OF CORRECTION

PATENT NO. : 7,995,552 B2
APPLICATION NO. : 12/025555
DATED : August 9, 2011
INVENTOR(S) : Sung-Oh Hwang et al.

Page 1 of 1

It is certified that error appears in the above-identified patent and that said Letters Patent is hereby corrected as shown below:

On the Title Page

Item (63) Related U.S. Application Data should read,

Divisional of application No. 10/185,661, filed on June 28, 2002, now Pat. No. 7,426,680

Item (30) Foreign Application Priority Data should read,

Jun. 28, 2001 (KR) ........... 2001-42669
Jul. 7, 2001   (KR) ........... 2001-40714

Signed and Sealed this
Twelfth Day of June, 2012

David J. Kappos
*Director of the United States Patent and Trademark Office*